United States Patent
Arduini et al.

(10) Patent No.: US 11,063,630 B2
(45) Date of Patent: Jul. 13, 2021

(54) INITIALIZATION AND SYNCHRONIZATION FOR PULSE POWER IN A NETWORK SYSTEM

(71) Applicant: CISCO TECHNOLOGY, INC., San Jose, CA (US)

(72) Inventors: Douglas Paul Arduini, San Ramon, CA (US); Sung Kee Baek, San Ramon, CA (US); Richard Anthony O'Brien, Livermore, CA (US); Joel Richard Goergen, Soulsbyville, CA (US); Chad M. Jones, Doylestown, OH (US); Jason DeWayne Potterf, Austin, TX (US); Ruqi Li, Fremont, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/671,508

(22) Filed: Nov. 1, 2019

(65) Prior Publication Data
US 2021/0135890 A1 May 6, 2021

(51) Int. Cl.
*H04B 3/54* (2006.01)
*H04L 12/10* (2006.01)
(Continued)

(52) U.S. Cl.
CPC ............. *H04B 3/54* (2013.01); *G01R 31/083* (2013.01); *G01R 31/50* (2020.01); *G05B 9/02* (2013.01); *G06F 1/305* (2013.01); *H02J 13/00* (2013.01); *H02J 13/00032* (2020.01); *H04L 12/10* (2013.01)

(58) Field of Classification Search
CPC . H04L 12/10; H04L 41/12; H04B 3/54; H02J 13/00; H02J 13/00002; H02J 13/00034; H02M 1/42; G01R 31/083; G01R 31/50; G05B 9/02; G05B 15/02; G06F 1/26; G06F 1/30
See application file for complete search history.

(56) References Cited

U.S. PATENT DOCUMENTS

| 3,335,324 A | 8/1967 | Buckeridge |
| 4,811,187 A | 3/1989 | Nakajima |

(Continued)

FOREIGN PATENT DOCUMENTS

| CN | 1209880 C | 7/2005 |
| CN | 201689347 U | 12/2010 |

(Continued)

OTHER PUBLICATIONS https://www.fischerconnectors.com/us/en/products/fiberoptic.
(Continued)

*Primary Examiner* — Crystal J Barnes-Bullock
(74) *Attorney, Agent, or Firm* — Cindy Kaplan

(57) ABSTRACT

In one embodiment, a method includes transmitting from power sourcing equipment, low voltage pulse power to a powered device in a communications network, performing a safety test, enabling high voltage pulse power operation at the power sourcing equipment upon passing the safety test, and transmitting high voltage pulse power from the power sourcing equipment to the powered device. The powered device synchronizes with a waveform of the low voltage pulse power.

12 Claims, 44 Drawing Sheets

(51) Int. Cl.
*H02J 13/00* (2006.01)
*G01R 31/08* (2020.01)
*G05B 9/02* (2006.01)
*G01R 31/50* (2020.01)
*G06F 1/30* (2006.01)

(56) References Cited

U.S. PATENT DOCUMENTS

| | | | |
|---|---|---|---|
| 5,652,893 A | 7/1997 | Ben-Meir | |
| 6,008,631 A | 12/1999 | Johari | |
| 6,220,955 B1 | 4/2001 | Posa | |
| 6,259,745 B1 | 7/2001 | Chan | |
| 6,636,538 B1 | 10/2003 | Stephens | |
| 6,685,364 B1 | 2/2004 | Brezina | |
| 6,822,457 B2* | 11/2004 | Borchert | G01R 31/3275 |
| | | | 324/512 |
| 6,826,368 B1 | 11/2004 | Koren | |
| 6,855,881 B2 | 2/2005 | Khoshnood | |
| 6,860,004 B2 | 3/2005 | Hirano | |
| 7,325,150 B2 | 1/2008 | Lehr | |
| 7,420,355 B2 | 9/2008 | Liu | |
| 7,490,996 B2 | 2/2009 | Sommer | |
| 7,492,059 B2 | 2/2009 | Peker | |
| 7,509,505 B2 | 3/2009 | Randall | |
| 7,566,987 B2 | 7/2009 | Black et al. | |
| 7,583,703 B2 | 9/2009 | Bowser | |
| 7,589,435 B2 | 9/2009 | Metsker | |
| 7,593,747 B1 | 9/2009 | Karam | |
| 7,603,570 B2 | 10/2009 | Schindler | |
| 7,616,465 B1 | 11/2009 | Vinciarelli | |
| 7,813,646 B2 | 10/2010 | Furey | |
| 7,835,389 B2 | 11/2010 | Yu | |
| 7,854,634 B2 | 12/2010 | Filipon | |
| 7,881,072 B2 | 2/2011 | DiBene | |
| 7,915,761 B1 | 3/2011 | Jones | |
| 7,921,307 B2 | 4/2011 | Karam | |
| 7,924,579 B2 | 4/2011 | Arduini | |
| 7,940,787 B2 | 5/2011 | Karam | |
| 7,973,538 B2 | 7/2011 | Karam | |
| 8,020,043 B2 | 9/2011 | Karam | |
| 8,037,324 B2 | 10/2011 | Hussain | |
| 8,081,589 B1 | 12/2011 | Gilbrech | |
| 8,276,397 B1 | 5/2012 | Karam | |
| 8,279,883 B2 | 10/2012 | Diab | |
| 8,310,089 B2 | 11/2012 | Schindler | |
| 8,319,627 B2 | 11/2012 | Chan | |
| 8,345,439 B1 | 1/2013 | Goergen | |
| 8,350,538 B2 | 1/2013 | Cuk | |
| 8,358,893 B1 | 1/2013 | Sanderson | |
| 8,638,008 B2 | 1/2014 | Baldwin et al. | |
| 8,700,923 B2 | 4/2014 | Fung | |
| 8,712,324 B2 | 4/2014 | Corbridge | |
| 8,750,710 B1 | 6/2014 | Hirt | |
| 8,768,528 B2 | 7/2014 | Millar et al. | |
| 8,781,637 B2 | 7/2014 | Eaves | |
| 8,787,775 B2 | 7/2014 | Earnshaw | |
| 8,829,917 B1 | 9/2014 | Lo | |
| 8,836,228 B2 | 9/2014 | Xu | |
| 8,842,430 B2 | 9/2014 | Hellriegel | |
| 8,849,471 B2 | 9/2014 | Daniel | |
| 8,966,747 B2 | 3/2015 | Vinciarelli | |
| 9,019,895 B2 | 4/2015 | Li | |
| 9,024,473 B2 | 5/2015 | Huff | |
| 9,184,795 B2 | 11/2015 | Eaves | |
| 9,189,036 B2 | 11/2015 | Ghoshal | |
| 9,189,043 B2 | 11/2015 | Vorenkamp | |
| 9,273,906 B2 | 3/2016 | Goth | |
| 9,319,101 B2 | 4/2016 | Lontka | |
| 9,321,362 B2 | 4/2016 | Woo | |
| 9,373,963 B2 | 6/2016 | Kuznelsov | |
| 9,419,436 B2 | 8/2016 | Eaves | |
| 9,510,479 B2 | 11/2016 | Vos | |
| 9,531,551 B2 | 12/2016 | Balasubramanian | |
| 9,590,811 B2 | 3/2017 | Hunter, Jr. | |
| 9,618,714 B2 | 4/2017 | Murray | |
| 9,640,998 B2 | 5/2017 | Dawson | |
| 9,665,148 B2 | 5/2017 | Hamdi | |
| 9,693,244 B2 | 6/2017 | Maruhashi | |
| 9,734,940 B1 | 8/2017 | McNutt | |
| 9,823,296 B2* | 11/2017 | Thanner | G01R 31/31701 |
| 9,853,689 B2 | 12/2017 | Eaves | |
| 9,874,930 B2 | 1/2018 | Vavilala | |
| 9,882,656 B2 | 1/2018 | Sipes, Jr. | |
| 9,893,521 B2 | 2/2018 | Lowe | |
| 9,948,198 B2 | 4/2018 | Imai | |
| 9,979,370 B2 | 5/2018 | Xu | |
| 9,983,267 B2* | 5/2018 | Fassnacht | G01R 29/02 |
| 9,985,600 B2 | 5/2018 | Xu | |
| 10,007,628 B2 | 6/2018 | Pitigoi-Aron | |
| 10,028,417 B2 | 7/2018 | Schmidtke | |
| 10,128,764 B1 | 11/2018 | Vinciarelli | |
| 10,191,100 B2* | 1/2019 | Blank | G01R 31/1272 |
| 10,248,178 B2 | 4/2019 | Brooks | |
| 10,263,526 B2 | 4/2019 | Sandusky et al. | |
| 10,407,995 B2 | 9/2019 | Moeny | |
| 10,439,432 B2* | 10/2019 | Eckhardt | H02J 3/01 |
| 10,541,543 B2 | 1/2020 | Eaves | |
| 10,735,105 B2 | 8/2020 | Goergen et al. | |
| 10,790,997 B2* | 9/2020 | Jones | H04W 80/02 |
| 2001/0024373 A1 | 9/2001 | Cuk | |
| 2002/0126967 A1 | 9/2002 | Panak | |
| 2004/0000816 A1 | 1/2004 | Khoshnood | |
| 2004/0033076 A1 | 2/2004 | Song | |
| 2004/0043651 A1 | 3/2004 | Bain | |
| 2004/0073703 A1 | 4/2004 | Boucher | |
| 2005/0197018 A1 | 9/2005 | Lord | |
| 2005/0220021 A1* | 10/2005 | Sosnowski | H04M 19/08 |
| | | | 370/235 |
| 2005/0268120 A1 | 12/2005 | Schindler | |
| 2006/0202109 A1 | 9/2006 | Delcher | |
| 2006/0209875 A1 | 9/2006 | Lum | |
| 2007/0103168 A1 | 5/2007 | Batten | |
| 2007/0236853 A1 | 10/2007 | Crawley | |
| 2007/0263675 A1 | 11/2007 | Lum | |
| 2007/0284946 A1 | 12/2007 | Robbins | |
| 2007/0288125 A1 | 12/2007 | Quaratiello | |
| 2008/0198635 A1 | 8/2008 | Hussain | |
| 2008/0229120 A1 | 9/2008 | Diab | |
| 2008/0310067 A1 | 12/2008 | Diab | |
| 2010/0077239 A1 | 3/2010 | Diab | |
| 2010/0117808 A1 | 5/2010 | Karam | |
| 2010/0171602 A1 | 7/2010 | Kabbara | |
| 2010/0190384 A1 | 7/2010 | Lanni | |
| 2010/0237846 A1 | 9/2010 | Vetteth | |
| 2010/0290190 A1 | 11/2010 | Chester | |
| 2011/0290497 A1 | 1/2011 | Stenevik | |
| 2011/0083824 A1 | 4/2011 | Rogers | |
| 2011/0228578 A1 | 9/2011 | Serpa | |
| 2011/0266867 A1 | 11/2011 | Schindler | |
| 2012/0064745 A1 | 3/2012 | Ottliczky | |
| 2012/0170927 A1 | 7/2012 | Huang | |
| 2012/0201089 A1 | 8/2012 | Barth | |
| 2012/0231654 A1 | 9/2012 | Conrad | |
| 2012/0317426 A1 | 12/2012 | Hunter, Jr. | |
| 2012/0319468 A1 | 12/2012 | Schneider | |
| 2013/0077923 A1 | 3/2013 | Weem | |
| 2013/0079633 A1 | 3/2013 | Weem | |
| 2013/0103220 A1 | 4/2013 | Eaves | |
| 2013/0249292 A1 | 9/2013 | Blackwell, Jr. | |
| 2013/0272721 A1 | 10/2013 | Van Veen | |
| 2014/0111180 A1 | 4/2014 | Vladan | |
| 2014/0129850 A1 | 5/2014 | Paul | |
| 2014/0258742 A1 | 9/2014 | Chien | |
| 2014/0265550 A1 | 9/2014 | Milligan | |
| 2014/0372773 A1 | 12/2014 | Heath | |
| 2015/0078740 A1 | 3/2015 | Sipes, Jr. | |
| 2015/0106539 A1 | 4/2015 | Leinonen | |
| 2015/0115741 A1 | 4/2015 | Dawson | |
| 2015/0137841 A1* | 5/2015 | Thanner | G01R 31/31701 |
| | | | 324/750.3 |
| 2015/0215001 A1 | 7/2015 | Eaves | |
| 2015/0215131 A1 | 7/2015 | Paul | |
| 2015/0219725 A1* | 8/2015 | Fassnacht | G01R 31/36 |
| | | | 324/426 |

(56) References Cited

U.S. PATENT DOCUMENTS

| | | | |
|---|---|---|---|
| 2015/0333918 A1 | 11/2015 | White, III | |
| 2016/0020911 A1 | 1/2016 | Sipes, Jr. | |
| 2016/0064938 A1 | 3/2016 | Balasubramanian | |
| 2016/0069944 A1* | 3/2016 | Blank | G01R 31/1272 324/750.01 |
| 2016/0111877 A1 | 4/2016 | Eaves | |
| 2016/0118784 A1 | 4/2016 | Saxena | |
| 2016/0133355 A1 | 5/2016 | Glew | |
| 2016/0134331 A1 | 5/2016 | Eaves | |
| 2016/0142217 A1 | 5/2016 | Gardner | |
| 2016/0173008 A1* | 6/2016 | Waltuch | H02P 6/20 318/484 |
| 2016/0197600 A1 | 7/2016 | Kuznetsov | |
| 2016/0365967 A1 | 7/2016 | Tu | |
| 2016/0241148 A1 | 8/2016 | Kizilyalli | |
| 2016/0262288 A1 | 9/2016 | Chainer | |
| 2016/0273722 A1 | 9/2016 | Crenshaw | |
| 2016/0294500 A1 | 10/2016 | Chawgo | |
| 2016/0294568 A1 | 10/2016 | Chawgo et al. | |
| 2016/0308683 A1 | 10/2016 | Pischl | |
| 2016/0352535 A1 | 12/2016 | Hiscock | |
| 2017/0041152 A1 | 2/2017 | Sheffield | |
| 2017/0041153 A1 | 2/2017 | Picard | |
| 2017/0054296 A1 | 2/2017 | Daniel | |
| 2017/0110871 A1 | 4/2017 | Foster | |
| 2017/0123466 A1 | 5/2017 | Carnevale | |
| 2017/0146260 A1 | 5/2017 | Ribbich | |
| 2017/0155517 A1 | 6/2017 | Cao | |
| 2017/0164525 A1 | 6/2017 | Chapel | |
| 2017/0155518 A1 | 7/2017 | Yang | |
| 2017/0214236 A1 | 7/2017 | Eaves | |
| 2017/0229886 A1 | 8/2017 | Eaves | |
| 2017/0234738 A1 | 8/2017 | Ross | |
| 2017/0248976 A1 | 8/2017 | Moller | |
| 2017/0325320 A1 | 11/2017 | Wendt | |
| 2018/0024964 A1 | 1/2018 | Mao | |
| 2018/0053313 A1 | 2/2018 | Smith | |
| 2018/0054083 A1 | 2/2018 | Hick | |
| 2018/0060269 A1 | 3/2018 | Kessler | |
| 2018/0088648 A1 | 3/2018 | Otani | |
| 2018/0098201 A1 | 4/2018 | Torello | |
| 2018/0102604 A1 | 4/2018 | Keith | |
| 2018/0123360 A1 | 5/2018 | Eaves | |
| 2018/0188712 A1 | 7/2018 | MacKay | |
| 2018/0191513 A1 | 7/2018 | Hess | |
| 2018/0254624 A1 | 9/2018 | Son | |
| 2018/0313886 A1 | 11/2018 | Mlyniec | |
| 2019/0267804 A1 | 8/2019 | Matan | |
| 2019/0280895 A1 | 9/2019 | Mather | |
| 2020/0235949 A1* | 7/2020 | Jones | H04L 12/10 |
| 2020/0389329 A1* | 12/2020 | Jones et al. | H04W 80/02 |

FOREIGN PATENT DOCUMENTS

| | | |
|---|---|---|
| CN | 204836199 U | 12/2015 |
| CN | 205544597 | 8/2016 |
| CN | 104081237 B | 10/2016 |
| CN | 104412541 B | 5/2019 |
| EP | 1936861 | 6/2008 |
| EP | 2120443 | 11/2009 |
| EP | 2693688 | 2/2014 |
| WO | WO199316407 A1 | 8/1993 |
| WO | WO2010053542 | 5/2010 |
| WO | WO2017054030 | 4/2017 |
| WO | WO2017167926 A1 | 10/2017 |
| WO | WO2018017544 A1 | 1/2018 |
| WO | WO2019023731 A1 | 2/2019 |

OTHER PUBLICATIONS http://www.strantech.com/products/tfoca-genx-hybrid-2×2-fiber-optic-copper-connector/.
http://www.qpcfiber.com/product/connectors/e-link-hybrid-connector/.
https://www.lumentum.com/sites/default/files/technical-library-items/poweroverfiber-tn-pv-ae_0.pdf.
"Network Remote Power Using Packet Energy Transfer", Eaves et al., www.voltserver.com, Sep. 2012.
Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.
Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.
Yencheck, Thermal Modeling of Portable Power Cables, 1993.
Zhang, Machine Learning-Based Temperature Prediction for Runtime Thermal Management across System Components, Mar. 2016.
Data Center Power Equipment Thermal Guidelines and Best Practices.
Dynamic Thermal Rating of Substation Terminal Equipment by Rambabu Adapa, 2004.
Chen, Real-Time Termperature Estimation for Power MOSEFETs Conidering Thermal Aging Effects:, IEEE Trnasactions on Device and Materials Reliability, vol. 14, No. 1, Mar. 2014.
Petition for Post Grant Review of U.S. Pat. No. 10,735,105 [Public], filed Feb. 16, 2021, PGR 2021-00055.
Petition for Post Grant Review of U.S. Pat. No. 10,735,105 [Public], filed Feb. 16, 2021, PGR 2021-00056.
Eaves, S. S., Network Remote Powering Using Packet Energy Transfer, Proceedings of IEEE International Conference on Telecommunications Energy (INTELEC) 2012, Scottsdale, AZ, Sep. 30-Oct. 4, 2012 (IEEE 2012) (EavesIEEE).
Edelstein S., Updated 2016 Tesla Model S also gets new 75-kWh battery option, (Jun. 19, 2016), archived Jun. 19, 2016 by Internet Archive Wayback machine at https://web.archive.org/web/20160619001148/https://www.greencarreports.com/news/1103 782_updated-2016-tesla-model-s-also-gets-new-7 5-kwh-battery-option ("Edelstein").
NFPA 70 National Electrical Code, 2017 Edition (NEC').
International Standard IEC 62368-1 Edition 2.0 (2014), ISBN 978-2-8322-1405-3 ("IEC-62368").
International Standard IEC/TS 60479-1 Edition 4.0 (2005), ISBN 2-8318-8096-3 ("IEC-60479").
International Standard IEC 60950-1 Edition 2.2 (2013), ISBN 978-2-8322-0820-5 ("IEC-60950").
International Standard IEC 60947-1 Edition 5.0 (2014), ISBN 978-2-8322-1798-6 ("IEC-60947").
Tanenbaum, A. S., Computer Networks, Third Edition (1996) ("Tanenbaum").
Stallings, W., Data and Computer Communications, Fourth Edition ( 1994) ("Stallings").
Alexander, C. K., Fundamentals of Electric Circuits, Indian Edition (2013) ("Alexander").
Hall, S. H., High-Speed Digital System Design, A Handbook of Interconnect Theory and Design Practices (2000) ("Hall").
Sedra, A. S., Microelectronic Circuits, Seventh Edition (2014) ("Sedra").
Lathi, B. R, Modem Digital and Analog Communication Systems, Fourth Edition (2009) ("Lathi").
Understanding 802.3at PoE Plus Standard Increases Available Power (Jun. 2011) ("Microsemi").

\* cited by examiner

INITIALIZATION AND SYNCHRONIZATION FOR PULSE POWER IN A NETWORK SYSTEM

TECHNICAL FIELD

The present disclosure relates generally to power transmittal in a network, and more particularly, to initialization and synchronization for pulse power in a network system.

BACKGROUND

Power over Ethernet (PoE) is a technology for providing electrical power over a wired telecommunications network from power sourcing equipment (PSE) to a powered device (PD) over a link section. In conventional PoE systems, power is delivered over the cables used by the data over a range from a few meters to about one hundred meters. When a greater distance is needed or fiber optic cables are used, power must be supplied through a local power source such as a wall outlet due to limitations with conventional PoE. Furthermore, today's PoE systems have limited power capacity, which may be inadequate for many classes of devices.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
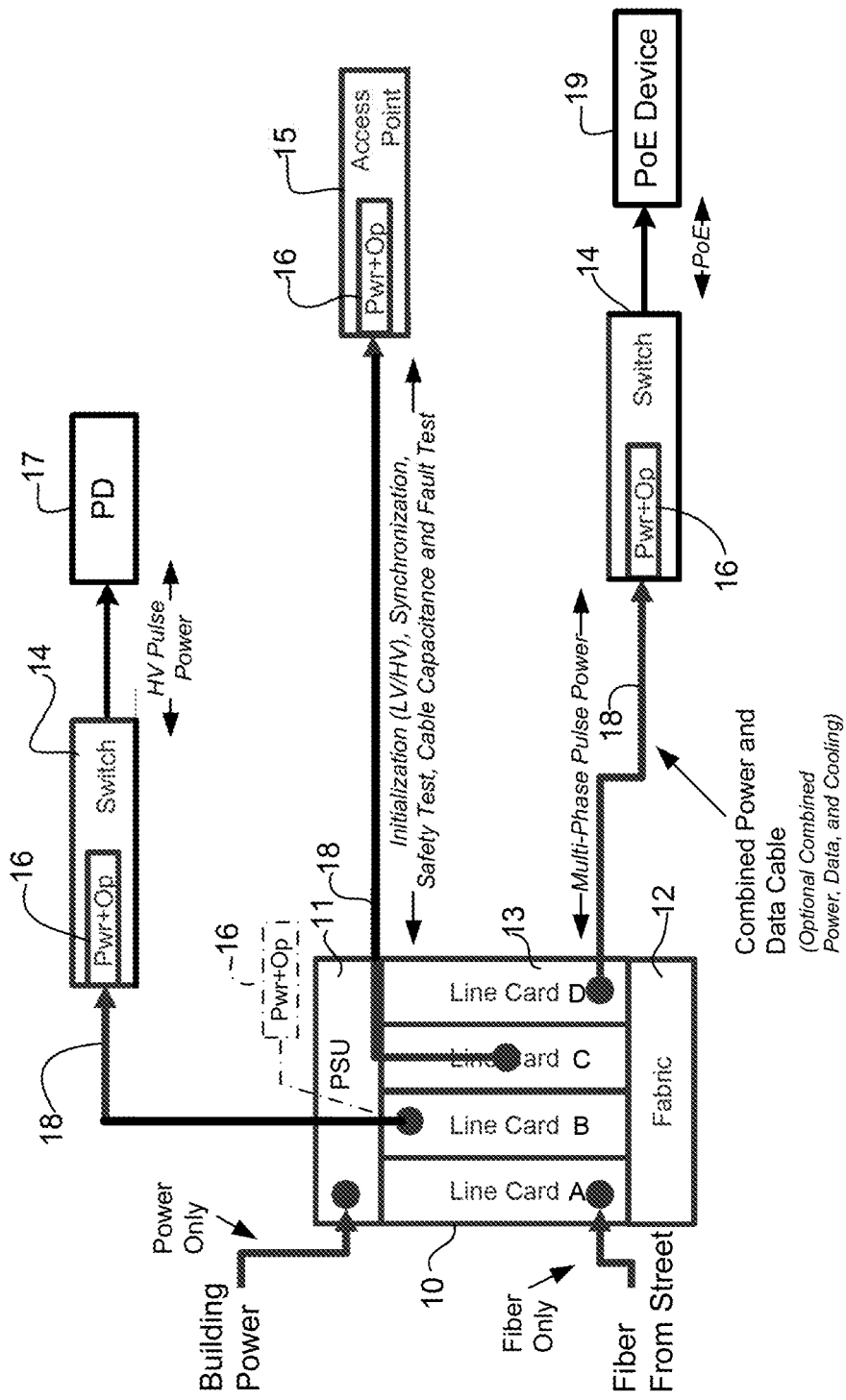
FIG. 1 illustrates an example of a communications network in which embodiments described herein may be implemented.

In one embodiment, a method generally comprises transmitting from power sourcing equipment, low voltage pulse power to a powered device, performing a safety test, enabling high voltage pulse power operation at the power sourcing equipment upon passing the safety test, and transmitting high voltage pulse power from the power sourcing equipment to the powered device. The powered device synchronizes with a waveform of the low voltage pulse power.

In another embodiment, a method generally comprises receiving low voltage pulse power from power sourcing equipment at a powered device, synchronizing timing of a modulator at the powered device with a waveform of the low voltage pulse power received from the power sourcing equipment, and operating with high voltage pulse power received from the power sourcing equipment.

In another embodiment, a method generally comprises receiving high voltage pulse power from power sourcing equipment at a powered device with a modulator switch open, coupling isolated voltage at the powered device when a pulse of the high voltage pulse power is on, energizing a housekeeping circuit at the powered device, and turning on the modulator switch at the powered device after a specified number of high voltage pulses are received.

In yet another embodiment, a method generally comprises identifying at a first powered device in communication with power sourcing equipment, a second powered device in communication with the first powered device, wherein the first powered device is receiving high voltage pulse power from the power sourcing equipment, notifying the power sourcing equipment of the second powered device, and performing a low voltage power initialization at the first powered device with the second powered device before passing the high voltage pulse power to the second powered device.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

In conventional Power over Ethernet (PoE) systems used to simultaneously transmit power and data communications, power is delivered over the same twisted pair cable used for data. These systems are limited in range to a few meters to about 100 m (meters). Conventional PoE over communications cabling is generally limited to about 90 W (Watts) based on IEEE 802.3bt, but many classes of powered devices would benefit from power delivery greater than 100 W and in some cases greater than 1000 W. For example, conventional PoE does not provide sufficient power for higher power communications systems such as remote radio heads or front haul routers as seen in cellular networks that typically need between 300 W and 1000 W to operate. Also, enterprise products that provide switching, routing, and power for access points and IP (Internet Protocol) phone systems often need about 1000 W to 1500 W of power. In conventional systems, when larger power delivery ratings are needed, power is supplied to a remote device through a local power source. However, in network communications systems such as 5G cellular build-outs or other communications systems and connected buildings with multiple non-centralized routers on each floor, AC (Alternating Current) grid power is not always available, may not be cost effective to build out at the start, or practical in some locations (e.g. wireless base stations), and in many cases cost prohibitive. For example, in locations that are listed as "co-location", power is typically charged on a per connection basis, not consumed power, making each additional AC connection very expensive. AC grid power systems are often used because DC (Direct Current) power systems are not a good solution over long distances. There is a therefore a need for a means to deliver power to these and other devices without having to add an AC outlet or other type of secondary power feed.

An increase in power available over multi-function cables to hundreds and even thousands of watts may enable many new choices in network deployments where major devices such as workgroup routers, multi-socket servers, large displays, wireless access points, fog nodes, or other devices are operated. This capability would greatly decrease installation complexity and improve the total cost of ownership of a much wider set of devices that have their power and data connectivity needs met from a central hub.

In order to overcome the above issues, power and data delivery systems may be designed to carry higher data rates and higher power delivery (and may also carry integrated thermal management cooling) combined into a single cable, as described in U.S. patent application Ser. No. 15/910,203 ("Combined Power, Data, and Cooling Delivery in a Communications Network"), filed Mar. 2, 2018, which is incorporated herein by reference in its entirety. These connections may be point-to-point, such as from a central hub to one or more remote devices (e.g., full hub and spoke layout). In another example, a single combined function cable may run most of the way to a cluster of powered devices and then split, as described in U.S. patent application Ser. No. 15/918,972 ("Splitting of Combined Delivery Power, Data, and Cooling in a Communications Network"), filed Mar. 12, 2018, which is incorporated herein by reference in its entirety. With high power applications, further safety concerns arise, which may result in the need for additional testing or safety checks at start-up and during power transmittal.

Embodiments described herein provide for safe delivery of high power over a data system (also referred to herein as advanced power over data or Extended Safe Power (ESP)) in a network system through the use of pulse power with fault detection and safety protection. The power may be transmitted in a network system (e.g., network communications system) with or without communications. The term "pulse power" as used herein refers to power that is delivered in pulses that vary between a very small voltage (e.g., close to 0V (volts), 3V) during a pulse off interval and a larger voltage (e.g., ≥12V) during a pulse on interval. High voltage pulse power (e.g., >56V, ≥60V, ≥300V) may be transmitted from power sourcing equipment (PSE) to a powered device (PD) for use in powering the powered device, whereas low voltage pulse power (low voltage pulses) (e.g., ~12V, ≤30V, ≤56V) may be used over a short interval for start-up (e.g., initialization, synchronization, charging local energy storage, powering up a controller, testing, or any combination thereof). As described in detail below, an initialization process (low voltage or high voltage initialization process) may be performed prior to transmitting high voltage pulse power to synchronize the PSE and PD and provide a safe start-up. The initialization process may comprise, for example, a safety test including a cable capacitance test and synchronization of modulator switch (pulse) timing between the power sourcing equipment and the powered device. As described below, the initialization may be performed for multiple phases in a multi-phase pulse power system and in various network topologies.

For example, one or more embodiments may use multiple phase (multi-phase) pulse power to achieve less loss, effectively 100% duty cycle power delivery (e.g., continuous uninterrupted power to the output with overlapping phase pulses) to a powered device, while enhancing reliability per power connection and providing safe operation over an extended length of cable to deliver high power, as described in U.S. patent application Ser. No. 16/380,954 ("Multiple Phase Pulse Power in a Network Communications System"), filed Apr. 10, 2019, which is incorporated herein by reference in its entirety. Multiple pair cabling may be used, for example, with a DC pulse on each pair, timed in such a manner as to provide 100% net duty cycle continuous power at the powered device (or load). Pulse power transmissions may be through cables, transmission lines, busbars, backplanes, PCBs (Printed Circuit Boards), and power distribution systems, for example.

The ESP system may test the network devices or cables to identify faults or safety issues. The system may be configured, for example, to identify transmission errors, phase faults (in multi-phase systems), over current, arc events, time base control synchronization faults, MAC drops, or any other communication or power faults or errors. These faults may be identified on a per phase basis in a multi-phase system. As described below, a low voltage initialization may be used for startup (or restart) to test the network and components (as described below with respect to the flowchart of FIG. 4). A high voltage initialization (described below with respect to the flowchart of FIG. 5) may also be used to allow for adding a new PD or a hot-swap replacement of a PD without requiring a low voltage initialization process.

In addition to performing testing during start-up and initialization, testing may continue to be performed during high voltage operation to safely deliver power in the ESP system. In one or more embodiments, fault sensing may be performed through a low voltage safety check combined with a digital interlock that uses the data system to provide feedback on the power system status and set a power operation mode, as described in U.S. patent application Ser. No. 15/971,729, ("High Power and Data Delivery in a Communications Network with Safety and Fault Protection"), filed May 4, 2018, which is incorporated herein by reference in its entirety. The fault sensing may be performed during a low voltage startup or between high power pulses in the pulse power system. The pulse power may comprise source voltage pulse power (unipolar or bipolar) or load current pulse power with low voltage fault detection between high voltage power pulses. Fault sensing may include, for example, line-to-line fault detection with low voltage sensing of the cable or powered device and line-to-ground fault detection with midpoint grounding. Touch-safe fault protection may also be provided through cable and connector designs that are touch-safe even with high voltage applied. The power safety features provide for safe system operation and installation and removal (disconnect) of components, including in some cases replacement of components without disturbing normal operation of the system (i.e., hot swappable).

The Off-time between pulses may be used, for example, for line-to-line resistance testing for faults and the pulse width may be proportional to DC line-to-line voltage to provide touch-safe fault protection (e.g., about 1 ms at about 1000V). The testing (fault detection, fault protection, fault sensing, touch-safe protection) may comprise auto-negotiation between the PSE and PDs. Low voltage (e.g., less than or equal to 24 VDC (volts direct current), 5-12 VDC, 56 VDC or any other suitable low voltage (e.g., <60 VDC)) resistance analysis may be used for auto-negotiation. The pulse power high voltage DC may be used with a pulse-to-pulse decision for touch-safe line-to-line fault interrogation between pulses for personal safety. Line-to-line touch shock protection may be provided with a source pulse Off-time between pulses for resistance across line detection between pulses.

Ground-fault-detection (GFD) and ground-fault-isolation (GFI) line-to-ground fault detection may be performed to provide fast high voltage interruption with ground fault protection (shock protection) during high voltage operation as part of using a high-resistance mid-point ground circuit. A high voltage DC supply line-to-ground fault protection circuit may be used to turn off power quickly to provide touch-safe shock protection. GFD and GFI may provide shut off in approximately 10 µs (microseconds), for example. A midpoint grounding method by the power source may also be used to allow higher peak pulse line-line voltage within the wire/conductor insulation and isolation ratings for line-ground protection and also provide touch-safe line-to-ground fault for personal safety and to meet safety standards.

The system may also be designed for adjustable time and current versus voltage for personal shock protection.

In one or more embodiments, the system may also test for thermal buildup using thermal modeling of the cable as described in U.S. patent application Ser. No. 15/604,344, entitled "Thermal Modeling for Cables Transmitting Data and Power", filed May 24, 2017, which is incorporated herein by reference in its entirety. For example, thermal buildup may be detected by tracking cable current change and calculating cable current temperature. The cable temperature is a function of amperage, cable gauge, and length of cable. By using known parameters and assuming a wire size (e.g., 22 AWG), the temperature limit of the cable in a bundle environment may be calculated. Temperature ranges may be defined, for example, as normal, minor, major, and critical (e.g., minor defined within 20° C. of cable temperature limit, major defined within 10° C. of cable temperature limit, and critical defined at cable temperature limit). If the temperature range is in the minor range, the system may force renegotiation of power to reduce current on the line. If the temperature is in the critical range, the port may be de-energized. The temperature may be calculated in each wire, each pair of wires, the four-pair cable, or any combination thereof.

In one or more embodiments, the system may also perform a wire fault and electrical imbalance detection as described in U.S. patent application Ser. No. 16/020,881, entitled "Wire Fault and Electrical Imbalance Detection for Power over Communications Cabling", filed Jun. 27, 2018, which is incorporated by reference in its entirety.

In one or more embodiments, the PSE may inform the PD of a power level that the PSE is capable of providing and the PD may then select the appropriate power level to use. The PSE and PD may negotiate power levels, for example, of 15 W, 30 W, 60 W, 90 W, 150 W, 200 W, 250 W, 300 W, or any other suitable power level. If no faults are detected, the system may auto-negotiate to maximum available power. Once the power is increased, fault detection may continue to be performed, as previously described. Fault detection may include for example, a check for thermal buildup, an electrical imbalance check (wire-to-wire imbalance check, pair-to-pair imbalance check), or short circuit/fault protection check. The system may be configured to perform one or more of these checks in any order or some steps may be performed simultaneously. One or more of the safety checks may be performed continuously or at specified intervals. For example, the wires may be monitored one by one in a continuous loop within a 10 ms window. If a fault is detected or a specified PSE voltage is exceeded, power output is shutdown. If the fault is minor (e.g., one or more parameters close to limit but not exceeding limit), power may be reduced through renegotiation of the power level. If the fault continues, the port may then be shutdown. An alarm may also be generated. In one or more embodiments, packet and idle (link) monitoring may be used to shut down the power. If a wire is lost, the link is lost and per wire faults are covered.

Action may also be taken based on the monitored (or calculated) current. For example, if the current in the cable exceeds the cable current maximum limit, the port may be shutdown. If the cable current reaches a specified range, the line card (PD) may be forced to perform power negotiation with the PSE to reduce current on the line. The current may be monitored per wire, per pair of wires, per cable, or any combination. Current ranges may be defined as normal, minor, major, and critical (e.g., minor defined within 20% maximum current, major defined within 10% maximum current, and critical defined at maximum current). If the range is minor, renegotiation may be performed to reduce current on the cable. If the critical current is reached, the port may be de-energized.

In one or more embodiments, one or more parameters may be user defined. For example, cable impedance, cable length, cable gauge, and cable voltage rating may be set for an ESP system or link. The ESP system may set a maximum voltage, current, or power based on these parameters. As described herein, the system may perform cable safety tests based on cable capacitance. The system may also perform GFI fault tests and line-to-line fault tests as described above for low voltage and high voltage. If a fault is identified, the system may set a fault latch and attempt an auto-restart one or more times. One or more components in the ESP system may include one or more visual indicators (e.g., LED (Light Emitting Diode)) to identify low voltage operation, high voltage operation, or system/component/cable fault, for example.

In one or more embodiments, machine learning may be performed by periodically monitoring and collecting data (e.g., current, voltage, cable capacitance, faults, temperature, etc.) to further define acceptable limits and account for variation in electrical performance based on changes in cable, environment, or components over time. For example, an analytical model may be defined and updated based on data trends for use in updating voltage and load current and operating limits to account for variations in electrical parameters and avoid false system faults.

In one or more embodiments, the PSE may deliver >100 W to a plurality of PDs along with data (e.g., over copper wires or optical fibers) on a power and data combined cable, as described below. In one or more embodiments, the system may safely deliver 2000 W or more of power at cable lengths exceeding 1500 meters. The system may also safely deliver higher power (e.g., 6000 W) on cable lengths less than 25 meters, making it very valuable in de-centralizing large chassis systems to eliminate the back plane/large chassis system design. It is to be understood that the power levels and cable distances described herein are provided as examples and other power levels delivered over different cable lengths may be used without departing from the scope of the embodiments.

The system may be configured to meet safety standards, including, for example, IEC (International Electrotechnical Commission) standard Nos. 62368-3:2017 ("Audio/video information and communication technology equipment—Part 3: Safety aspects for DC power transfer through communication cables and ports"), IEC 60950-1:2005 ("Information technology equipment—Safety—Part 1: General requirements"), IEC 60947 ("Low-voltage switchgear and control gear"), or any other applicable standard to provide touch-safe shock protection for personnel for high voltage (higher power) applications in the extended safe power system. The system may be configured, for example, to limit shock current with line-to-ground fault limit of about 5 mA (e.g., less than 10 mA) and line-to-line fault limit of about 0.5 A for 1 ms using about 2.5 kohms across HVDC power (e.g., 1100V, 550V, 380V) (e.g., for short reach cabling or smart digital sensing techniques). In another example, worst case shock exposure time may be 12 ms. Appropriate techniques (e.g., fail-safe Safety Agency Approved Listed components, redundant circuits or components) may be employed in order to meet safety standards.

The Off-time of the pulses may be configured based on cable pair capacitance and maximum pulse power On-time may be designed to be below limits set by body shock current and standards (e.g., as referenced in UL (Underwriters Laboratories) standards 62368 and 60950 or NFPA (National Fire Protection Association) NEC (National Electrical Code) 70 chapter 7, chapter 8, and tables 11A and 11B in chapter 9, IEC/TR 60479-5, 60479-1, IEC-60947-1, IEC-60947-2, IEC-60947-3, IEC-60335-1, IEC-60990, IEC-60065, IEC-61000-4, or any other appropriate standard or requirement). In one or more embodiments, On-time and Off-time pulse widths may be set dynamically in response to changing cable characteristics. The need for continuous net current supply to the PD may determine the phase relationship of pulses on multiple transmission pair systems. The embodiments described herein may be configured to meet single fault protection or other safety requirements. It is to be understood that the standards and limits discussed herein are only provided as examples and other safety limits or standards may be used, without departing from the scope of the embodiments.

Referring now to the drawings, and first to FIG. 1, an example of a communications network in which embodiments described herein may be implemented is shown. For simplification, only a small number of nodes are shown. The embodiments operate in the context of a data communications network including multiple network devices. The network may include any number of network devices in communication via any number of nodes (e.g., routers, switches, gateways, controllers, access points, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet of Things (IoT) network, Internet, intranet, or any other network).

In one or more embodiments, the network is configured to pass electrical power along with data to provide both data connectivity and electric power to network devices such as switches 14, routers, access points 15, or other electronic components and devices. Signals may be exchanged among communications equipment and power transmitted from power sourcing equipment (PSE) 10 to powered devices (PDs) 14, 15, 17, 19. In one or more embodiments, the system delivers power to and from a network (e.g., switch/router system) using an interface module 16 (e.g., optical transceiver module) configured to receive and transmit both data (fiber delivered data) and electrical power (high power energy). In one or more embodiments, the power and data may be delivered over a cable comprising both optical fibers and electrical wires (e.g., copper wires), as described in U.S. patent application Ser. No. 15/707,976 ("Power Delivery Through an Optical System"), filed Sep. 18, 2017, which is incorporated herein by reference in its entirety. In one or more embodiments, the system may further provide cooling and deliver combined power, data, and cooling within a single hybrid cable system, as described, for example, in U.S. patent application Ser. Nos. 15/910,203 and 15/918,972, referenced above.

As shown in the example of FIG. 1, the system may use building power supplied to a central network device (hub) (PSE) 10, which may be located in a premise/entry room, for example. The power may be transmitted from a building entry point to end points (switches 14, access points 15), which may be located at distances greater than 100 meters (e.g., 1 km (kilometer), 10 km, or any other distance), and/or at greater power levels than 100 W (watts) (e.g., 250 W, 500 W, 1000 W, 2000 W or any other power level). The central network device 10 comprises one or more power supply unit (PSU) 11 for receiving and distributing power (e.g., building power from a power grid, renewable energy source, generator, or battery) and a network interface (e.g., fabric 12, line cards 13). In the example shown in FIG. 1, line card A receives data from outside of the building (e.g., from street or other location) and line cards B, C, and D distribute power and data.

The central hub (combined power and data source) 10 is operable to provide high capacity power from an internal power system (e.g., PSU 11 capable of delivering power over and including 5 kW, 100 kW, etc., and driving the plurality of devices 14, 15, each in the 100 W-3000 W range (e.g., 100 W or greater, 900 W or greater, 1000 W or greater), or any other suitable power range. The PSU 11 may provide, for example, PoE (Power over Ethernet), PoF (Power over Fiber), HVDC (high voltage direct current), pulse power HVDC, or AC (alternating current). The central network device 10 is operable to receive external power and transmit power over combined delivery power and data cables 18 in the communications network (e.g., network comprising central hub 10 (PSE) and a plurality of network devices 14, 15, 17, 19 (PDs)). The central network device 10 may comprise, for example, a router, convergence system, or any other suitable line card system. It is to be understood that this is only an example and any other network device operable to transmit power and optical data may be used. One or more of the line cards 13 may also include the interface module 16 (shown at the remote network devices 14, 15) operable to transmit power and data on the cables 18.

The network may include any number or arrangement of network communications devices (e.g., switches 14, access points 15, routers, or other devices operable to route (switch, forward) data communications). In one example, the network comprises a plurality of groups of access points 15, with each group located on a different floor or zone. One or more of the network devices 14, 15 may also deliver power to a downstream node (e.g., PoE device 19) using PoE. For example, one or more of the network devices 14, 15 may deliver power using PoE to electronic components such as IP (Internet Protocol) cameras, VoIP (Voice over IP) phones, video cameras, point-of-sale devices, security access control devices, residential devices, building automation devices, industrial automation devices, factory equipment, lights (building lights, streetlights), traffic signals, fog nodes, IoT devices, sensors, and many other electrical components and devices. In one or more embodiments, a redundant central hub (not shown) may provide backup or additional power or bandwidth, as needed in the network. In this case, the remote network device 14, 15 would include another interface module 16 for connection with another cable 18 delivering power and data from the redundant central hub. As described in detail below, the network may be arranged in various topologies, including for example, point-to-point, daisy chain, multi-drop, or hybrid multi-drop/daisy chain for delivering high voltage pulse power to a downstream device (e.g., PD 17 in communication with switch 14).

As previously noted, the central hub 10 may deliver power and data directly to each network device 14 (point-to-point connection as shown for the switches 14 connected to line cards B and D in FIG. 1) or one or more splitting devices (not shown) may be used to connect a plurality of network devices and allow the network to go beyond point-to-point topologies and build passive stars, busses, tapers, multi-layer trees, etc. For example, a single long cable 18 may run to a conveniently located intermediary splitter device (e.g., passive splitter) servicing a cluster of physically close endpoint devices. One or more control systems for the power and data may interact between the central hub 10 and the remote devices 15 (and their interface modules 16) to ensure that each device receives its fair share of each resource from the splitting device, as described in U.S. patent application Ser. No. 15/918,972, referenced above.

In one or more embodiments, cables (combined cable, multi-function cable, multi-use cable, hybrid cable) 18 extending from the network device 10 to the switches 14 and access points 15 are configured to transmit power and data, and include both optical fibers and electrical wires. The cable 18 may include, for example, two power lines (conductors) and two data lines (optical fibers). It is to be understood that that this is only an example and the cable 18 may contain any number of power or data lines. For example, instead of using two optical fiber paths to transfer data from the central hub 10 to the remote device 14, 15 and from the remote device to the central hub, a bidirectional optical system may be utilized with one wavelength of light going downstream (from central hub 10 to remote device 14, 15) and a different wavelength of light going upstream (from remote device 14, 15 to central hub 10), thereby reducing the fiber count in the cable from two to one. The cable 18 may also include additional optical fibers or power lines. The cables 18 may be formed from any material suitable to carry both electrical power and optical data (e.g., copper, fiber) and may carry any number of electrical wires and optical fibers in any arrangement. The cable 18 may transmit one or more of power, data (electrical), data (optical), and cooling.

As previously noted, the cables 18 may also carry cooling for thermal management of the remote network communications devices 14, 15. For example, in one or more embodiments, the cables 18 extending from the central hub 10 to the remote network devices 14, 15 may be configured to transmit combined delivery power, data, and cooling in a single cable. In this embodiment, the cables 18 may be formed from any material suitable to carry electrical power, data (e.g., copper, fiber), and coolant (liquid, gas, or multi-phase) and may carry any number of electrical wires, optical fibers, and cooling tubes in any arrangement.

The cables 18 comprise a connector at each end configured to couple with the interface module 16 at the network devices 10, 14, 15. The connector may comprise, for example, a combined power and data connector (hybrid copper and fiber) configured to connect to an optical transceiver, as described in U.S. patent application Ser. No. 15/707,976, referenced above. The connector may comprise, for example, a modified RJ-45 type connector.

In one or more embodiments, the connectors and cable 18 are configured to meet standard safety requirements for line-to-ground protection and line-to-line protection at relevant high voltage by means including clearance and creepage distances, and touch-safe techniques. The connector may comprise safety features, including, for example, short-pin for hot-plug and hot-unplug without current surge or interruption for connector arcing protection. The connector may further include additional insulation material for hot-plug and hot-unplug with current surge or interruption with arc-flash protection and reliability life with arcing. The insulated cable power connector terminals are preferably configured to meet touch voltage or current accessibility requirements.

As previously noted, one or more of the network devices 10, 14, 15 may comprise an interface module 16 operable to deliver the combined power and data from the PSE 10 or receive the combined power and data at the PD 14, 15. In one or more embodiments, the interface module 16 may comprise an optical transceiver module configured to deliver (or receive) power along with the optical data. For example, in one embodiment, the interface module 16 comprises a transceiver module modified along with a fiber connector system to incorporate copper wires to deliver power through the optical transceiver to the powered device 14, 15 for use by the network communications devices, as described in U.S. patent application Ser. No. 15/707,976, referenced above or in U.S. patent application Ser. No. 15/942,015 ("Interface Module for Combined Delivery Power, Data, and Cooling at a Network Device"), filed Mar. 30, 2018, which is incorporated herein by reference in its entirety. It is to be understood that these are only examples of interface modules that may be used to deliver or receive high power and optical data.

The interface module 16 (optical module, optical transceiver, optical transceiver module, optical device, optics module, silicon photonics module) is configured to source or receive power. The interface module 16 operates as an engine that bidirectionally converts optical signals to electrical signals or in general as an interface to the network element copper wire or optical fiber. In one or more embodiments, the interface module 16 may comprise a pluggable transceiver module in any form factor (e.g., SFP (Small Form-Factor Pluggable), QSFP (Quad Small Form-Factor Pluggable), CFP (C Form-Factor Pluggable), and the like), and may support data rates up to 400 Gbps, for example. Hosts for these pluggable optical modules include line cards 13 on the central network device 10, switches 14, access points 15, or other network devices. The host may include a printed circuit board (PCB) and electronic components and circuits operable to interface telecommunications lines in a telecommunications network. The host may be configured to perform one or more operations and receive any number or type of pluggable transceiver modules configured for transmitting and receiving signals.

Also, it may be noted that the interface module 16 may be configured for operation in point-to-multipoint or multi-point-to-point topology. For example, QFSP may breakout to SFP+. One or more embodiments may be configured to allow for load shifting. The interface module 16 may also be configured for operation with AOC (Active Optical Cable) and form factors used in UWB (Ultra-Wideband) applications, including for example, Ultra HDMI (High-Definition Multimedia Interface), serial high bandwidth cables (e.g., thunderbolt), and other form factors.

The interface module 16 provides for power to be delivered to the switches 14 and access points 15 in locations where standard power is not available. The interface module 16 may be configured to tap some of the energy and make intelligent decisions so that the power source 10 knows when it is safe to increase power on the wires without damaging the system or endangering an operator, as described below. The interface module 16 may include one or more sensors, monitors, or controllers for use in monitoring and controlling the power and data, as described in detail below with respect to FIG. 3.

In one or more embodiments, there is no need for additional electrical wiring for the communications network and all of the network communications devices operate using the power provided by the extended safe power system. In addition to the network devices 10, 14, 15 comprising interface modules 16 operable to receive and transmit power over electrical wires and optical data over fibers, the network may also include one or more network devices comprising conventional optical modules that only process and transmit the optical data. These network devices would receive electrical power from a local power source such as a wall outlet. Similarly, specialized variants of transceivers 16 may eliminate the optical data interfaces, and only interconnect power (e.g., moving data interconnection to wireless networks). As previously noted, one or more of the network devices may also receive cooling over cable 18 in addition to power, data, or power and data.

In one or more embodiments, a distributed control system comprising components located on the central hub's controller and on the remote device's processor may communicate over the fiber links in the combined cable 18. Monitoring information from power sensors (e.g., current, voltage) or data usage (e.g., bandwidth, buffer/queue size) may be used by the control system in managing or allocating power or data.

The system may be configured to deliver PoE, PoF, high voltage DC (HVDC), AC power, pulse power, multi-phase pulse power, or any combination thereof. The HVDC power may comprise steady state HVDC or pulse power HVDC. The steady state and pulse power HVDC may be unipolar or bipolar (switching DC), as described in U.S. patent application Ser. No. 15/971,729, referenced above. In one or more embodiments, the system may employ a dual-power mode that detects and negotiates between the power source 10 and powered device 14, 15. This negotiation distinguishes between and accommodates different power-delivery schemes, such as standard PoE or PoF, high power, pulse power, or other power modes capable of power delivery through the interface module 16. For example, standard PoE distribution may be used for remote network devices rated less than about 100 W. For higher power remote powered devices, pulse power or other higher voltage techniques may be used to create an efficient energy distribution network.

As described in detail below, the remote network device 14, 15, 17 may use a small amount of power at startup to communicate its power and data requirements to the central network device 10. The powered device 14, 15, 17 may then configure itself accordingly for full power operation. In one example, power type, safety operation of the module, and data rates are negotiated between the central hub (PSE) 10 and the network device 14, 15, 17 through data communications signals on the optical fiber. The interface module 16 communicates any operational fault, including the loss of data. Such fault may result in power immediately being turned off or switching to a low power (low voltage) mode. Full power supply may not be reestablished until the powered device is able to communicate back in low power mode that higher power may be safely applied.

It is to be understood that the network devices and topology shown in FIG. 1, and described above is only an example and the embodiments described herein may be implemented in networks comprising different network topologies or network devices, without departing from the scope of the embodiments. The network (or one or more portions of the network) may be configured for only power delivery or for power and communications. The network may comprise any number or type of network communications devices that facilitate passage of data over the network (e.g., routers, switches, gateways, controllers), network elements that operate as endpoints or hosts (e.g., servers, virtual machines, clients), and any number of network sites or domains in communication with any number of networks. Thus, network nodes may be used in any suitable network topology, which may include any number of servers, virtual machines, switches, routers, or other nodes interconnected to form a large and complex network, which may include cloud or fog computing. Nodes may be coupled to other nodes or networks through one or more interfaces employing any suitable connection, which provides a viable pathway for electronic communications along with power.

Figure 2:
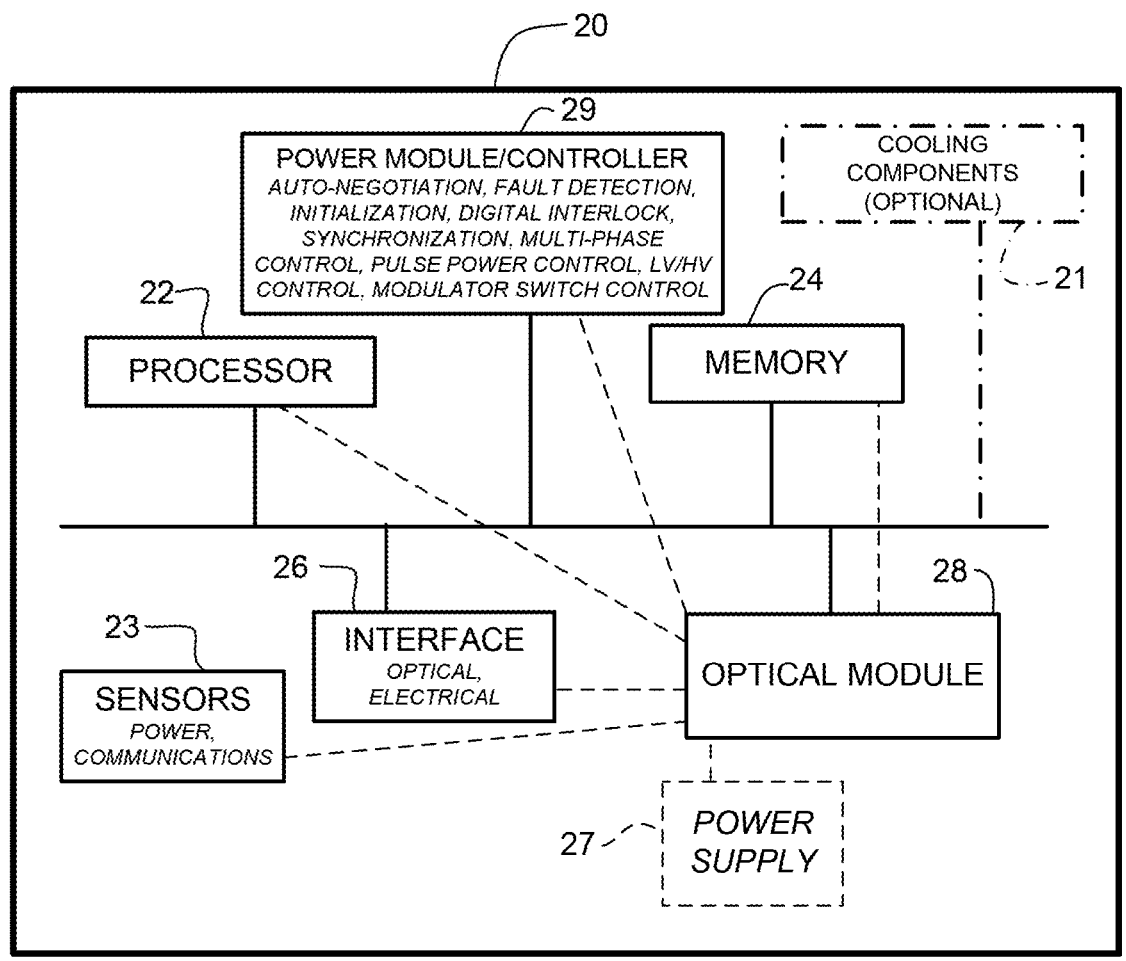
FIG. 2 depicts an example of a network device useful in implementing embodiments described herein.

FIG. 2 illustrates an example of a network device 20 (e.g., central hub (PSE) 10, switch (PD) 14, access point (PD) 15 in FIG. 1) that may be used to implement the embodiments described herein. In one embodiment, the network device 20 is a programmable machine that may be implemented in hardware, software, or any combination thereof. The network device 20 includes one or more processor 22, sensors 23 (e.g., power sensor (e.g., voltage, current sensor), communications sensor, thermal sensor), memory 24, interface 26, optical module 28 (e.g., power+optics interface module 16 in FIG. 1), and power module/controller 29. The network device may also comprise one or more cooling components 21 (sensors, control valves, pumps, etc.) if the system is configured for combined power, data, and cooling delivery.

Memory 24 may be a volatile memory or non-volatile storage, which stores various applications, operating systems, modules, and data for execution and use by the processor 22. For example, components of the optical module 28 or controller 29 (e.g., code, logic, or firmware, etc.) may be stored in the memory 24. The network device 20 may include any number of memory components.

The network device 20 may include any number of processors 22 (e.g., single or multi-processor computing device or system), which may communicate with a forwarding engine or packet forwarder operable to process a packet or packet header. The processor 22 may receive instructions from a software application or module, which causes the processor to perform functions of one or more embodiments described herein. The processor 22 may also operate one or more components of the power control module 29 for fault detection, auto-negotiation, digital interlock, synchronization, multi-phase control, pulse power control, low voltage, high voltage control, modulator switch control, etc.

The controller (power module/controller) 29 may be configured for auto-negotiation, fault detection, initialization, digital interlock, synchronization, multi-phase control, pulse power control, or other control or management functions. The control system 29 may comprise components (modules, code, software, logic) located at the central hub 10 and the remote device 14, 15, and interconnected through the combined power and data cable 18 (FIGS. 1 and 2). The control system 29 may also receive input from power sensors or data monitoring devices, as described below with respect to FIG. 3. The power module/controller 29 at the PD may communicate with the control system at the PSE 10 to initialize operation, synchronize operation (e.g., pulse waveforms, current, voltage), auto-negotiate the status of the power system, identify any faults in the power system (e.g., cables or powered device), select a power operating mode, or any combination thereof. As previously noted, the auto-negotiation may be performed during a low voltage startup or between pulses in a pulse power system. One or more control system or power module components may be located at the optical module 28.

Logic may be encoded in one or more tangible media for execution by the processor 22. For example, the processor 22 may execute codes stored in a computer-readable medium such as memory 24. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described below with respect to the flowcharts of FIGS. 4, 5, and 7.

The interface 26 may comprise any number of network interfaces (line cards, ports, connectors) for receiving data or power, or transmitting data or power to other devices. The network interface may be configured to transmit or receive data using a variety of different communications protocols and may include mechanical, electrical, and signaling circuitry for communicating data over physical links coupled to the network interfaces. For example, line cards may include port processors and port processor controllers. The interface 26 may comprise one or more optical and electrical interfaces. The interface 26 may also comprise fluid ports if the system is configured for cooling. One or more of the interfaces 26 may be configured for PoE+F+C (Power over Ethernet+Fiber+Cooling), PoE+F, PoE, PoF, high voltage pulse power, multi-phase pulse power, or similar operation.

The optical module 28 may include logic, firmware, software, etc. for use in monitoring or controlling the extended safe power system. For example, the optical module 28 may comprise hardware or software for use in power detection, system start-up, synchronization, power monitor and control, or power enable/disable. The optical module 28 may further comprise one or more of the processor or memory components, or interface 26 for receiving or delivering power and data. As previously described, in one or more embodiments, power is supplied to the optical module by power supply 27 and the optical module 28 provides power to the rest of the components at the network device 20.

It is to be understood that the network device 20 shown in FIG. 2 and described above is only an example and that different configurations of network devices may be used. For example, the network device 20 may further include any suitable combination of hardware, software, algorithms, processors, devices, components, or elements operable to facilitate the capabilities described herein.

Figure 3:
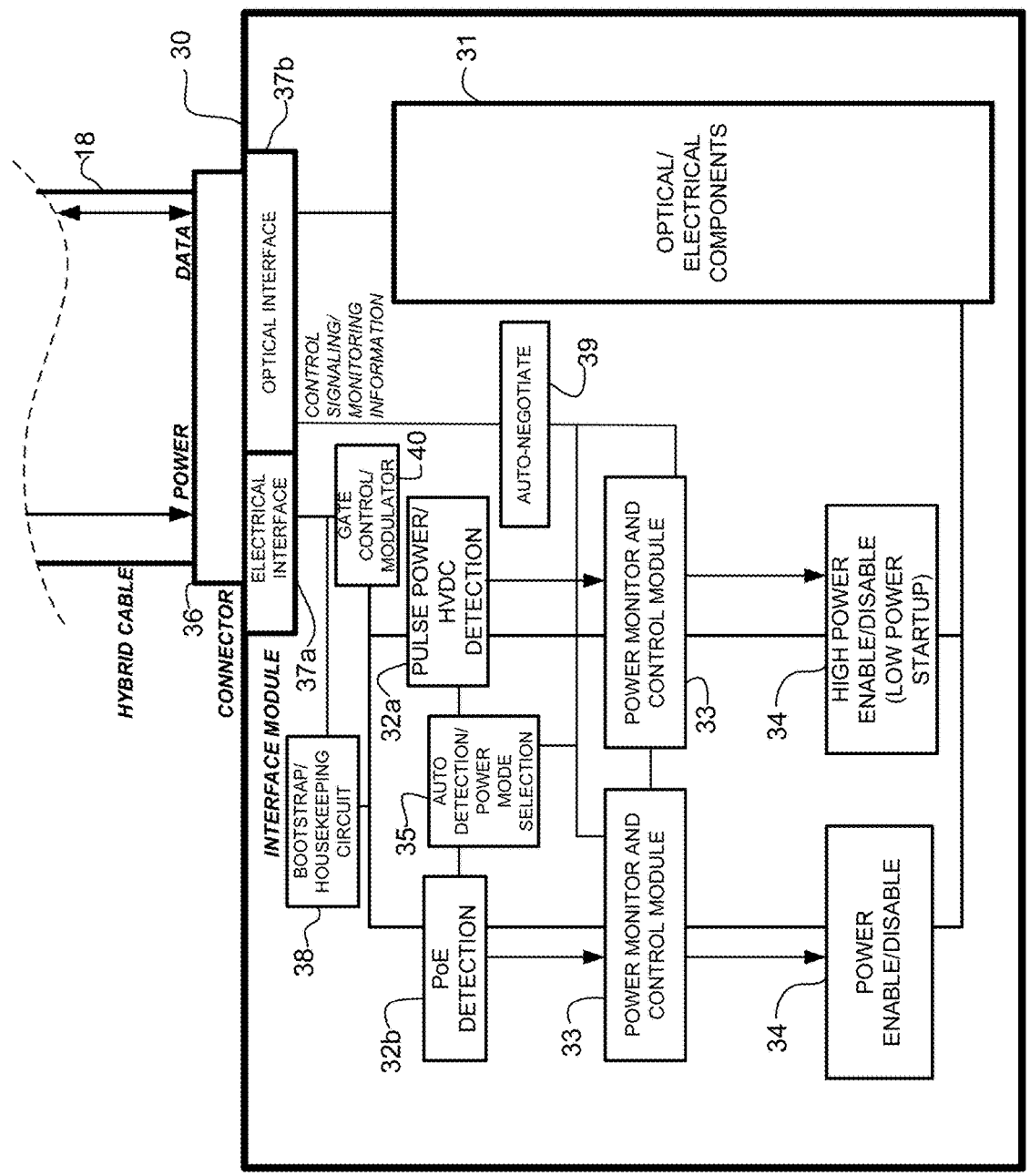
FIG. 3 is a block diagram illustrating components of a pulse power system, in accordance with one embodiment.

FIG. 3 is a block diagram illustrating components for use in power monitor and control, start-up, synchronization, auto-negotiation, and fault protection at a network device 30, in accordance with one embodiment. One or more of the components shown in FIG. 3 may be located at the interface module 16 or in communication with one or more components of the interface module (FIGS. 1 and 3). The cable 18 carrying both the high power and data is shown with cable connector 36 coupled to the interface module in FIG. 3. The power is received at an electrical interface 37a and the data is received and transmitted at an optical interface 37b, which may both be located at the optical module 16. Connector 36 may comprise a single physical component or a single component with modular parts for each function, for example.

The network device 30 includes optical/electrical components 31 for receiving optical data and converting it to electrical signals (or converting electrical signals to optical data) and power components including, power detection modules 32a, 32b, power monitor and control modules 33, and power enable/disable modules 34. Although PoE and pulse power are described in conjunction with detection elements 32a, 32b, it should be understood that other power delivery schemes including AC, DC, and USB may be supported with similar elements. Also, the type of power may be split between high voltage power and low voltage power. The power components may be isolated from the optical components 31 via an isolation component (e.g., isolation material or element), which electromagnetically isolates the power circuit from the optical components to prevent interference with operation of the optics. The network device 30 may include an auto detection module 35 that operates with the pulse power detection module 32a and PoE detection module 32b. Module 35 may also operate to select a power delivery mode (e.g., PoE or pulse power) based on which delivery mode is more efficient based on network device operations. One or more functions of the detection elements 32a, 32b, auto detection module 35, power monitor and control modules 33, or auto-negotiation module 39 may be combined into a power module and operate within the interface module.

The auto-negotiate/digital interlock module 39 may be used in performing one or more fault detection, auto-negotiation, or digital interlock processes. As described in detail below, auto-negotiation may include communication between the PSE and the PD and interaction between controllers at the central network device and remote network device. A gate control/modulator 40 may be provided to isolate one or more circuits during system initialization or testing and modulate the pulse power, as described below with respect to FIGS. 10A-13B. The network device 30 may further include a bootstrap/housekeeping circuit 38 used during start-up and testing of the device, as described below. One or more control signals or monitoring information may be transmitted over the data line (e.g., optical fibers) or over the power line in the hybrid power and data cable 18 to provide an operating status (e.g., fault/no fault) of the network device, cable, or power circuit.

In the example shown in FIG. 3, each module 32a, 32b is in communication with its own power monitor and control module 33 and power enable/disable module 34. The circuit detects the type of power applied to the network device 30, determines if PoE or pulse power is a more efficient power delivery method, and then uses the selected power delivery mode. In one or more embodiments, PoE or high voltage pulse power may be transmitted over the same cable 18.

The network device 30 is configured to calculate available power and prevent the cabling system from being energized when it should not be powered. The power monitor and control modules 33 continuously monitor power delivery to ensure that the system can support the needed power delivery and no safety limits (e.g., voltage, current) are exceeded. The power monitor and control modules 33 may also monitor optical signaling and disable power if there is a lack of optical transitions or communication with the power source. Power monitor and control functions may sense the voltage and current flow, and report these readings to a central control function. In one embodiment, the network device 30 uses a small amount of low voltage power (e.g., ≤12V, ≤24V, ≤60V) at startup or restart to communicate its power and data requirements and status. The network device 30 may then be configured for full power operation (e.g., >60V, ≥300V, ≥500V, ≥1000V) (e.g., at high power enable/disable module 34) if no faults or safety conditions are detected. If a fault is detected, full power operation may not be established until the network device communicates in low power mode that high power can be safely applied. The auto-negotiation module 39 communicates with a control system at the central network device to select a safe operating mode (e.g., determine that it is safe to apply high voltage power), identify a fault in the circuit (e.g., line-to-line or line-to-ground fault detection), and shutdown power if a fault is identified at start-up or during testing between high voltage pulse power during normal operation. As described below, power may be delivered with or without communications.

It is to be understood that the system shown in FIG. 3 is only an example and components may be added, removed, combined, or rearranged without departing from the scope of the embodiments. For example, as previously noted, network devices may also be configured without an optical interface 37b and optical components 31.

Figure 4:
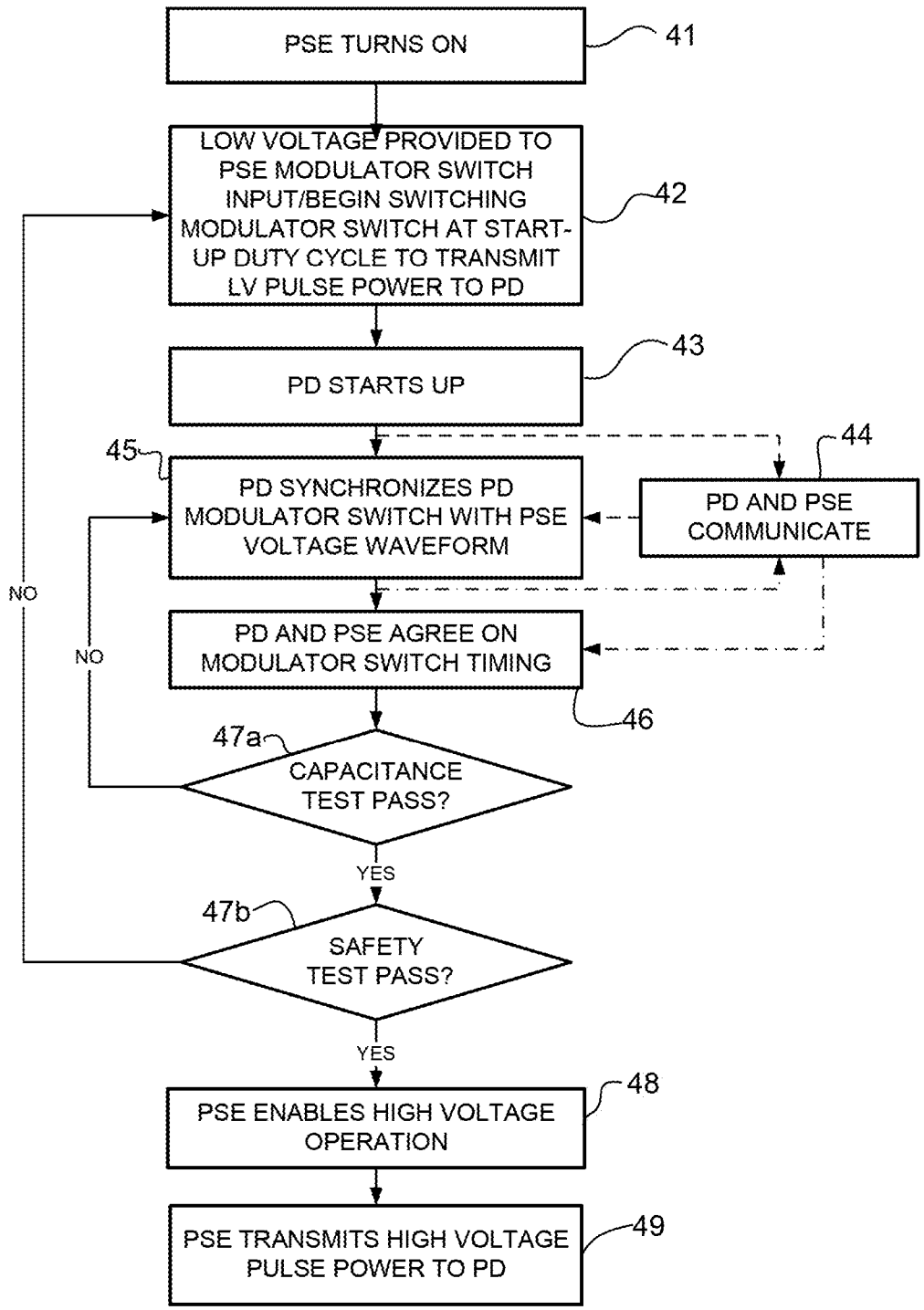
FIG. 4 is a flowchart illustrating low voltage initialization for a pulse power system, in accordance with one embodiment.
Figure 5:
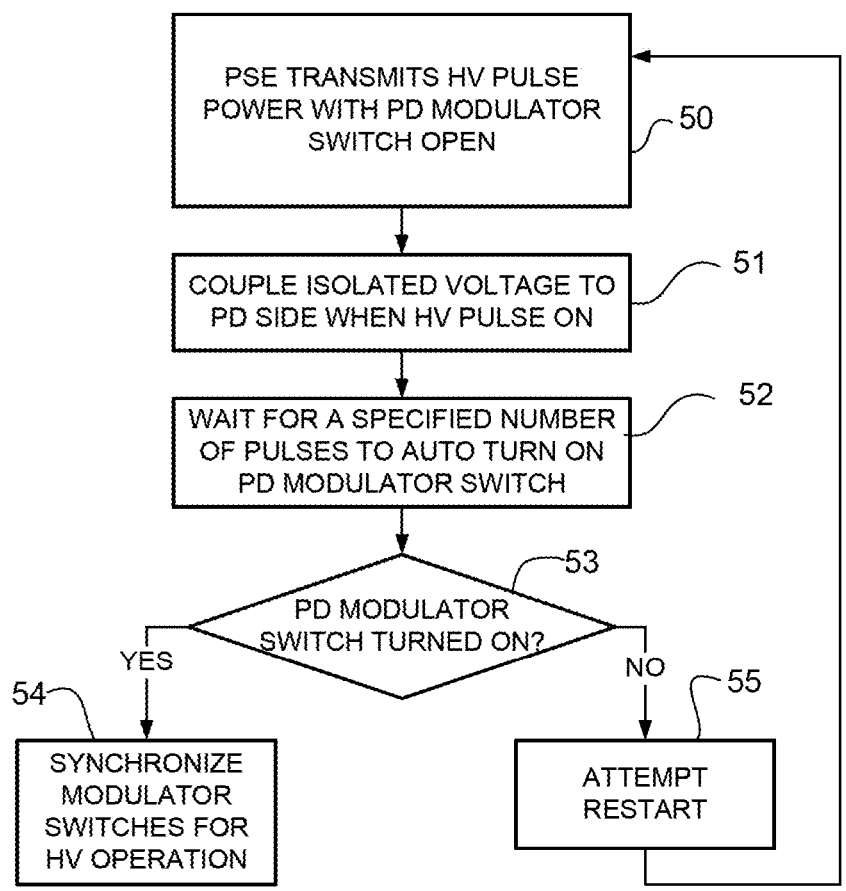
FIG. 5 is a flowchart illustrating high voltage initialization for the pulse power system, in accordance with one embodiment.

As described below, an initialization process may be performed with low voltage (FIG. 4) or high voltage (FIG. 5). The high voltage initialization process may be used, for example, for adding a new PD or a hot-swap PD replacement or to simplify the power initialization process, while providing another layer of high voltage safety in place of low voltage safety initialization. FIG. 7 illustrates a cable capacitance and shock fault test that may be performed upon start-up or at any other time to check if additional cable lengths have been added. Simplified block diagrams and circuits are shown for cable capacitance and shock fault test (FIGS. 9A and 9C), synchronization after initial power up (FIG. 10A), initial low voltage start-up (FIGS. 11A, 11C, 12A, 12B, and 12C), and initial high voltage start-up (FIG. 13A), in accordance with one or more embodiments. It is to be understood that the processes and circuits shown in FIGS. 4-14 and described herein are illustrated for one phase, for simplification, and that these processes and circuits may be duplicated for each phase of a multi-phase system as described below with respect to FIGS. 20-22.

As described in detail below, PD initialization may include power-up for initial PD housekeeping voltage with a PD modulator switch Off for power to transceiver, PD modulator gate, and microcontroller/DSP. PD housekeeping voltage may be developed during the PSE modulator On-time by synchronizing a power converter load operation with a cable voltage waveform. As previously noted, the initialization may comprise a low voltage or high voltage initialization. In one low voltage initialization example, a low voltage (e.g., 24 VDC) may be applied before switching to high voltage (e.g., 380 VDC). This may include a long initial On-time period to power up a DC housekeeping capacitor fully for faster start-up time before only drawing power during high voltage pulsing. For high voltage initialization, a short-time high voltage pulse may be used for added high voltage protection during initialization. In another high voltage initialization example, a nominal-time (normal operating pulse width) operation high voltage pulse and duty/frequency may be used as needed for a safety test, including a cable capacitance test. This high voltage initialization process may be used, for example, for PD hot-swap replacement or addition of a new PD to cable with high voltage pulsing (high voltage pulse power on cable).

In one or more embodiments, low voltage initialization at the PSE comprises transmitting low voltage pulse power from the PSE to the PD, performing a safety test (e.g., safety body shock protection test, cable capacitance test), and enabling high voltage pulse power operation at the power sourcing equipment upon passing the safety test. During the low voltage initialization, the PD synchronizes with a waveform of the low voltage pulse power. For example, a modulator switch at the PD may synchronize with a modulator switch at the PSE. The term "modulator switch" as used herein may refer to one or more modulator switches (e.g., one or more switches with common control), power modulator, pulse modulator, pulse power modulator, control switch, gate control, isolation switch, or similar component or group of components operable to perform the functions described herein. The synchronization may continue during high voltage pulse power operation.

In one or more embodiments, low voltage initialization at the PD comprises receiving low voltage pulse power at the PD from the PSE, synchronizing the powered device with a waveform of the low voltage pulse power received from the power sourcing equipment, and operating the PD with high voltage pulse power received from the power sourcing equipment. During initialization at the PD, a modulator switch may be open while energizing a housekeeping circuit at the PD. The modulator switch may then be turned on while the capacitance and safety test are performed by the PSE.

It is to be understood that the term "synchronize" as used herein refers to coordination of the pulses at the PSE and PD through coordination of the PSE and PD modulator switch drives or of one of the modulator switches with a voltage waveform, for example. Synchronization is used to align the pulses (modulator switches) at the PSE and PD, and may result in differences between pulse width (modulator switching) at the PSE and PD. For example, as described below with respect to FIGS. 23 and 24, the synchronization may provide a smaller pulse width at the PD than the pulse width at the PSE. As described below, Off/On synchronization between the PSE and PD may performed during initialization and updated based on PSE safety testing or changes in the network (e.g., changes in cable, addition of new network device), for example.

FIG. 4 illustrates an overview of a low voltage initialization process, in accordance with one embodiment. At step 41, the PSE (e.g., PSE 10 in FIG. 1) turns on. In one example, the PSU 11 provides 24 VDC through a diode to a PSE modulator switch input (as shown in FIG. 11A). The low voltage is provided to the PSE modulator switch input and the modulator switch begins switching at a start-up duty cycle, thereby transmitting low voltage pulse power (low voltage pulses) to the PD (step 42). In one example the duty cycle comprises 8 ms (milliseconds) on, 4 ms off over a 12 ms period (66.7% duty cycle). The PD starts up at step 43. As described below with respect to FIG. 11A, the PD may use a 12/3.3V housekeeping and floating gate voltage. The PD modulator switch synchronizes with the PSE modulator switch based on the PSE voltage waveform received at the PD (step 45). This allows the PD and PSE to agree on modulator switch timing before high voltage pulse power is enabled. A PD transceiver and DSP (Digital Signal Processor) (shown in FIG. 8 (85b, 86b)) (or MCU (microcontroller)) begin operation and the PD starts PLL (Phase Lock Loop) or DLL (Digital Locked Loop, Delay Locked Loop) and synchronizes the PD modulator switch on/off with the PSE voltage waveform. Synchronization details are described below with respect to FIGS. 10A, and 10B. In one example, the PD and PSE begin to communicate (step 44) when the PD modulator switch is turned on until turn-off/on with modulation (after step 43 and before PD starts PLL and synchronizes modulator at step 45). In another example, the PD and PSE transceivers start communication (step 44) during On-time of PD/PSE modulators (after PD starts PLL and synchronizes modulator at step 45). It is to be understood that reference to the modulator switch being on refers to a closed switch (current transmitted through the switch) and reference to the modulator switch being off refers to an open switch (no current transmitted through the switch).

The PD and PSE may optionally auto-negotiate modulator switch timing (synchronize modulator switches) (step 46) if communications are available. The PSE performs a capacitance test (step 47a) and a safety test (step 47b). It is to be understood that the capacitance test (step 47*a*) and safety test (step 47*b*) may be collectively referred to as a "safety test". Results of the capacitance test may be used to adjust the modulator pulse timing of the PSE and PD for the safety test calibration and timing. For example, results of the capacitance test may be used to identify a minimum Off-time and high voltage exposure time, adjust high voltage exposure time, and set safety fault sense level as described below with respect to FIG. 7. The PSE may also gather transmission line parameters (e.g., capacitance) during this test. In one example, the PSE performs a cable leakage test to see if the cable leakage is greater than a specified resistance value (e.g., 100 kohm). Static timing parameters may be used if communications are not available. Additional details of a cable capacitance and shock fault test are described below with respect to the flowchart of FIG. 7 and circuits of FIGS. 9A and 9C. If the PSE safety test does not pass, an auto-restart may be tried for a set number of times (e.g., two times) (steps 42-47*b*). If the safety test is passed, the PSE enables high voltage operation (step 48) (e.g., ≥300 VDC). A PD input voltage above low voltage start-up no-load level (e.g., ~360 VDC) turns on DC/DC load. The PSE and PD may then agree on voltage and load current synchronization and high voltage pulse power operation continues with the PSE transmitting high voltage pulse power to the PD (step 49). Additional synchronization details are described below with respect to circuits shown in FIG. 10A.

FIG. 5 is an overview of a high voltage initialization process, in accordance with one embodiment. As previously noted, high voltage initialization may be used, for example, while adding a new PD or a hot-swap (hot plug-in) PD replacement without using the low voltage initialization procedure described above. High voltage initialization may also be used to simplify the power initialization start-up process and reduce cost and complexity, while providing another layer of high voltage safety in place of low voltage initialization. In one or more embodiments, auxiliary power may be provided to the PSE during the initialization phase (LV or HV) to establish the PSE modulator switch control and synchronization, and communication, which need the switch to be on. As described below, the cable capacitance and shock fault test may be followed by a sequence to establish modulator switch operation and communication (if used), then syncing of the modulator switches for high power high voltage pulse widths.

In one or more embodiments, the powered device receives high voltage pulse power from the power sourcing equipment with a modulator switch at the powered device open, couples isolated housekeeping voltage at the powered device when a pulse of the high voltage pulse power is on, energizes a housekeeping circuit at the powered device, and turns on a modulator switch at the powered device after a specified number of high voltage pulses are received to power the powered device with the high voltage pulse power.

Referring now to FIG. 5, initial PD housekeeping voltage and first PD modulator switch operation to establish a communication link during high voltage on-pulse to the PD load is described. At step 50, the PSE transmits high voltage pulse power to the PD with the PD modulator switch open. In one or more embodiments, an initial PSE high voltage modulator may provide a short on-pulse (i.e., shorter pulse than used during normal operation) within a safer part of a safe region (described below with respect to FIG. 6) for an added level of safety with no PD housekeeping voltage and the PD modulator switch open. For example, high voltage power received at the PD with the modulator switch open may comprise a short pulse On-time (pulse width) and once the modulator switch is turned on, the high voltage pulse power received comprises normal operation pulse On-time (nominal width pulse). Isolated housekeeping voltage is coupled to PD side without affecting cable voltage charge when high voltage pulse is on during auto-negotiation (step 51). The PSE may wait for a number of high voltage pulses to auto turn on the PD modulator switch (step 52). The PSE checks to see if the PD modulator switch is turned on (step 53). In one example, the PSE waits for three high voltage pulses over approximately 40 ms to auto-turn on the PD modulator switch until it is told to turn off at the end of the high voltage On pulse load period through the communication link. If the PD modulator switch turns on, normal operation continues (step 54). Otherwise, power shuts downs until restart is attempted (step 55).

Figure 6:
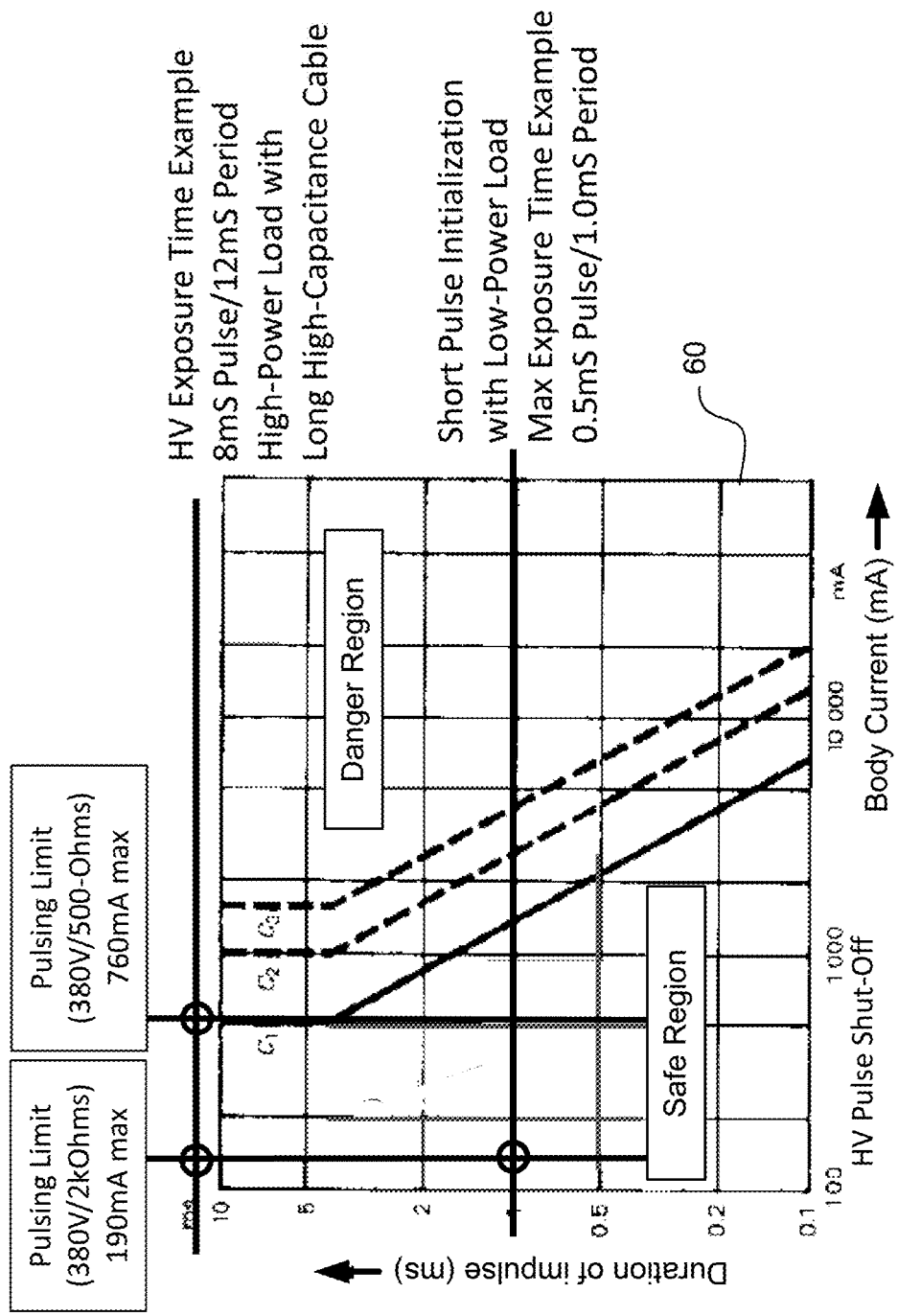
FIG. 6 is a diagram illustrating high voltage initialization pulse limits within a safe region, in accordance with one embodiment.
Figure 7:
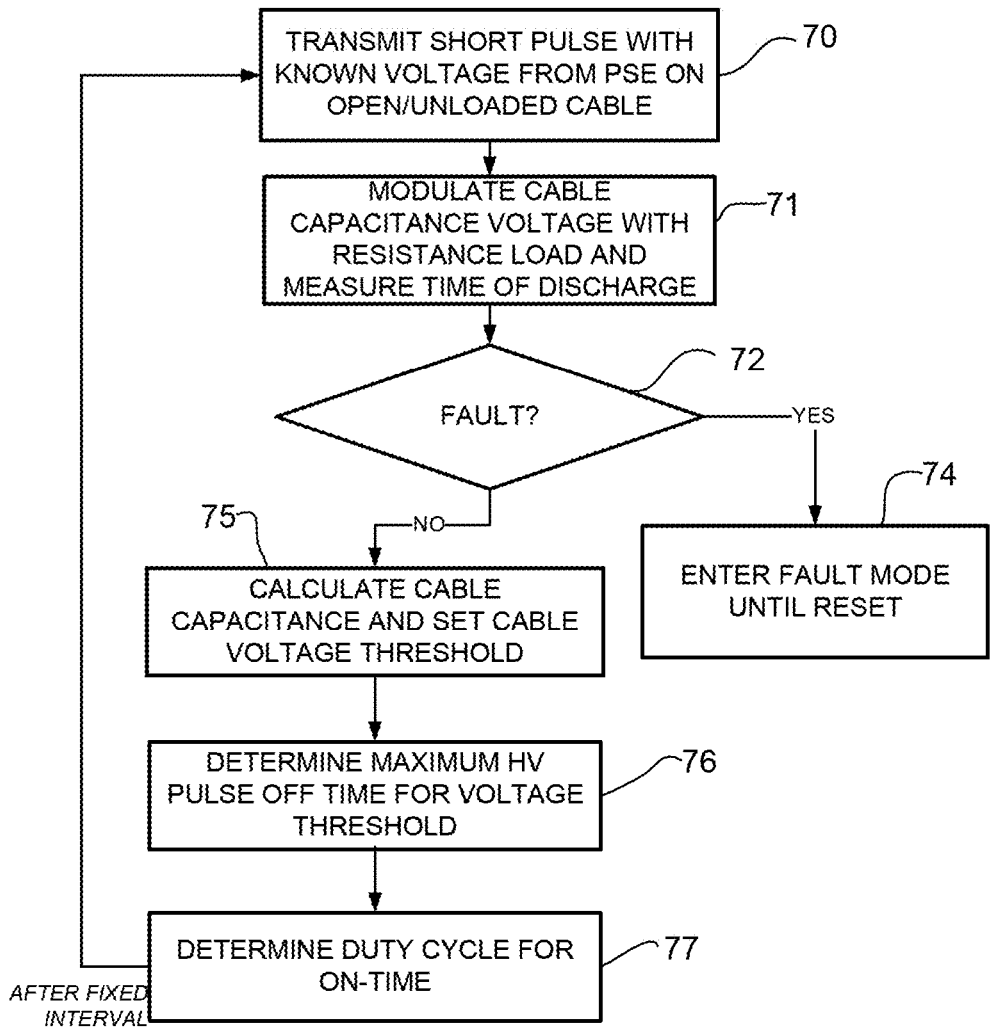
FIG. 7 is a flowchart illustrating a cable capacitance and safety test, in accordance with one embodiment.

FIG. 6 is a graph 60 illustrating duration of current flow (ms) versus body current (mA). The graph shows a safe region, in which there is normally no perception by humans or little pain with no dangerous effect. In the danger region there may be reversible effects such as muscular contraction and respiratory compromise or critical effects on humans. As shown in the graph 60, pulsing limits and maximum exposure time for high voltage initialization are maintained within the safe region. In one or more embodiments, during a high voltage initialization start-up period where there is no need for any PD load requirements, a shorter high voltage pulse is possible without affecting the load power requirement. With a shorter high voltage On-time and shorter Off-time detection time of high voltage exposure period and less shock energy shown in the examples, an added higher level of shock protection is possible.

As previously described with respect to FIG. 4, one or more safety tests may be performed before enabling high voltage pulse power operation at the PSE. Testing may include a safety body shock protection test with cable capacitance testing, and calibration adjustment based on the testing. In one example, PSE safety/capacitance testing and analysis may be used to determine a shortest high voltage exposure within a duty/period between pulses for auto-negotiation of the next high voltage pulse, with accurate capacitance test and accurate cable voltage droop threshold for safety body current from calibration analysis of cable voltage droop with switching in a known discharge resistor for a specified time with first 10% (or other suitable percentage) of RC-time in near-linear dv/dt region, as described below. One or two known resistors may be switched in for a known time for faster, accurate calculation of cable capacitance. The capacitance test described below may be performed for safety test level and time only on initialization or on a pulse-to-pulse basis, which adds the ability to identify cable capacitance changes on the fly and provides large cable voltage dv/dt droop levels for easier synchronization and timing analysis.

FIG. 7 is an overview of a process for a capacitance test of cable interposed between the PSE and PD. At step 70, a known high voltage pulse is transmitted from the PSE modulator switch on an open and unloaded cable. In one or more embodiments, the cable capacitance voltage is modulated with a known discharge resistor load (e.g., 100 kohm or other suitable resistance) and RC time (time constant of resistor/capacitance circuit) to discharge to measure the time of the voltage discharge with the first 10% of droop (step 71). This is approximately a linear relationship of $\Delta t = RC$ for the first 0.1RC time interval, as described below with respect to FIG. 9B. A maximum resistance value of 100 Kohm is chosen in this example as maximum body resistance to be used as a fault for body shock protection of 3.8 mA maximum body current protection at a 380 VDC high voltage level. A 10% droop voltage level is also chosen in this example for a clean sensing level without noise after a high voltage pulse and load current turn-Off. With a long cable of high capacitance, the sensing time is longest to provide a longer Off-time for sensing and a longer high voltage On-time for power within a given duty cycle. In this example, the maximum cable length may have 300 nF of capacitance, thus with 100 Kohm test resistor the time to 10% RC time is 3 ms, and 4 ms may be used as a maximum Off-time and for sensing margin with an 8 ms high voltage On-time with a 67% duty cycle. Then at worst case the high voltage exposure time in this example is 11-12 ms to detect a body fault to latch-Off high voltage power or another high voltage pulse. For lower body resistance conditions the current may be higher and the maximum exposure time may be the same. For this reason a shorter Off-time is chosen for 10% droop with less capacitance and cable length for shorter Off-time and total exposure period. Other methods may be used to accurately and reliably measure a shallower droop voltage than 10% (e.g., 1-2%) for much shorter Off-time and total exposure period. This value is compared to dv/dt without the 100 kohm load to determine the additional resistance across the cable and identify if there is a fault (step 72). In one example, greater than 100 kohm passes the test and less than 100 kohm signifies a fault.

If a fault is identified, fault mode is entered until reset (step 74). If the test passes, the cable capacitance is calculated and the 100 kohm load voltage threshold is set to the fault dv/dt to inhibit additional fault during auto-negotiation high voltage pulse Off-time (step 75). A maximum high voltage pulse Off-time is determined for the 100 kohm fault dv/dt voltage threshold (step 76). This value preferably includes a margin (e.g., fault threshold of dv/dt=10% plus another 5% margin). A desired duty cycle is determined for On-time for desired power, cable loss, and RMS (Root Mean Square) current (step 77).

The above described process may be performed only at initialization (low voltage or high voltage start-up) or may be repeated at fixed intervals or pulse-to-pulse to identify if additional cable lengths have been added. The cable capacitance and shock fault test may be performed for each phase in a multi-phase system described below. It is to be understood that the resistance values, margins, and discharge times described above are only examples and other values may be used without departing from the scope of the embodiments. Additional details of the capacitance test are described below with respect to FIGS. 9A-9D.

It is to be understood that the processes shown in FIGS. 4, 5, and 7 are only examples and one or more steps may be added, removed, combined, or reordered, without departing from the scope of the embodiments.

Figure 8:
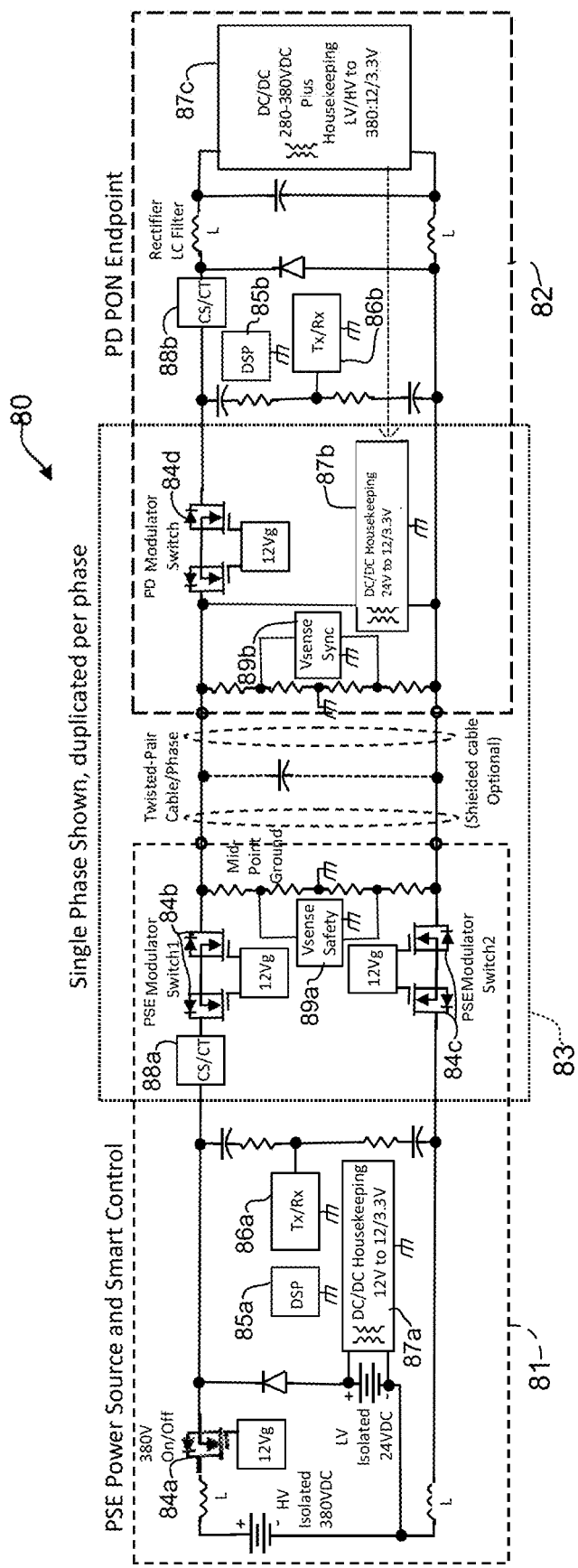
FIG. 8 is a block diagram illustrating an extended safe power system for delivering pulse power, in accordance with one embodiment.

Referring now to FIG. 8, a simplified block diagram of the extended safe power system is shown. The block diagram includes circuits for power sourcing equipment 81 providing a power source and smart control and a powered device 82 comprising a PON (Passive Optical Network) endpoint. The components shown within block 83 represent a single phase and may be duplicated for each phase of a multi-phase system as described below. Modulator switches 84b, 84c, 84d, sensing components 89a, 89b, and start up power circuit 87b may be duplicated for each cable pair/phase.

The PSE 81 includes an isolated high voltage source (e.g., 380 VDC) and a modulator switch 84a with gate. The DSP (Digital Signal Processor) 85a, 85b may comprise a microcontroller or FPGA (Field Programmable Gate Array) digital control and software/firmware. Tx/Rx 86a, 86b at the PSE and PD represent transceivers with a coupling network. An isolated power supply 87a is provided for PSE housekeeping. An isolated power supply 87b is provided for PD housekeeping with 24 VDC input example for low voltage initialization and testing. The PD 82 also includes a DC/DC isolated converter 87c for generating 12V/3.3V housekeeping voltage with 60-380 VDC input from the output of the PD (high voltage pulse power operation) example. In this example, current sense transformer/Hall-effect sensors (CS/CT) 88a, 88b are included at the PSE and PD. A safety sensing circuit (Vsense safety) 89a and PD sync voltage sensor (Vsense sync) 89b are located in the PSE and PD, respectively. As shown in FIG. 8, the PSE includes two PSE modulator switches 84b, 84c, and the PD includes one PD modulator switch 84d shown as bidirectional switches to totally isolate the cable pair during high voltage pulse Off-time for accurate voltage droop sensing proportional to RC time of a body resistance across the cable during the auto-negotiation safety test between high voltage pulses. The switches may comprise, for example, a solid state switch or any other suitable device to provide pulse power modulation, which is synchronized between the PSE and PD, as previously described.

Figure 11A:
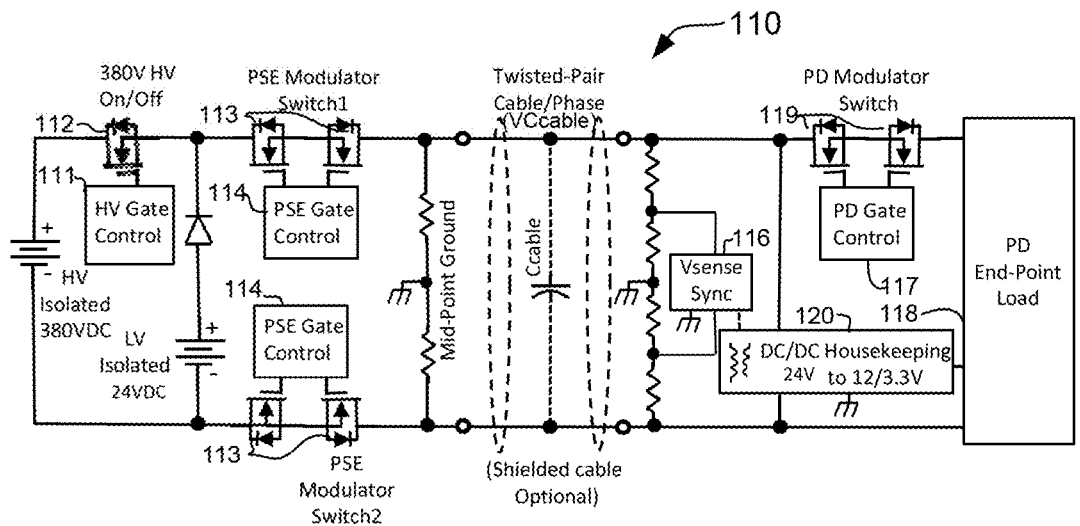
FIG. 11A is a block diagram illustrating a circuit for use in the low voltage initialization of FIG. 4, in accordance with one embodiment.
Figure 12A:
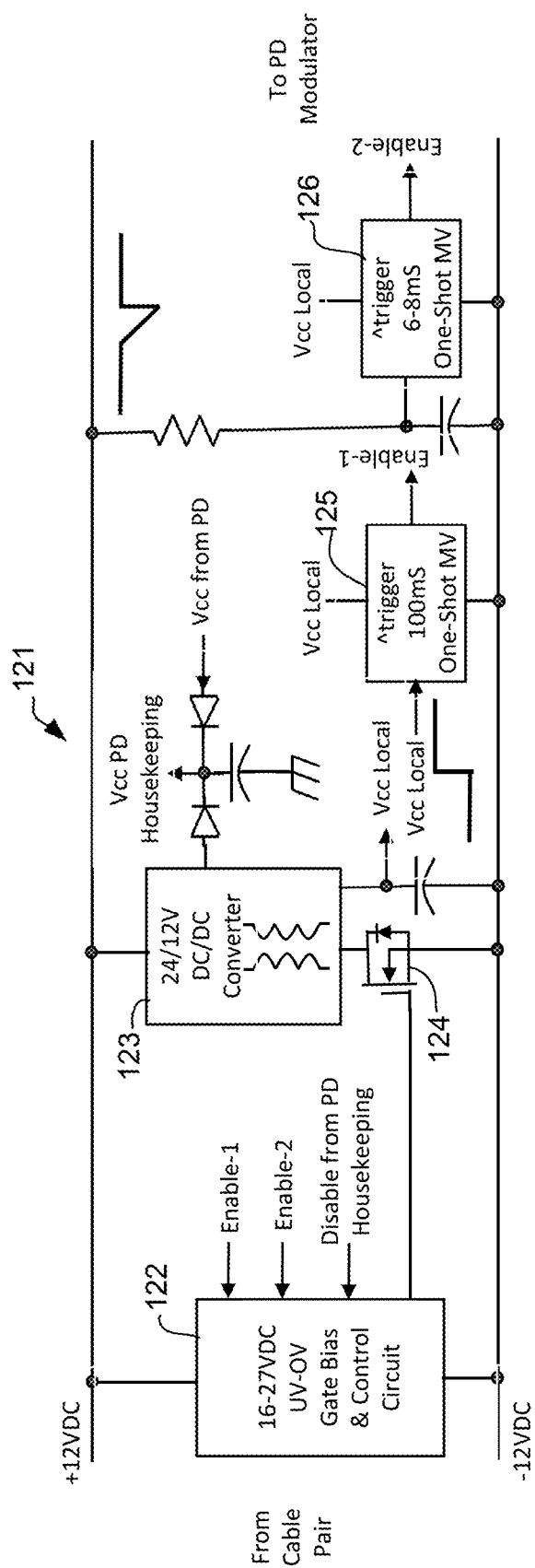
FIG. 12A is a block diagram illustrating details of a housekeeping power circuit of FIG. 11A.
Figure 12B:
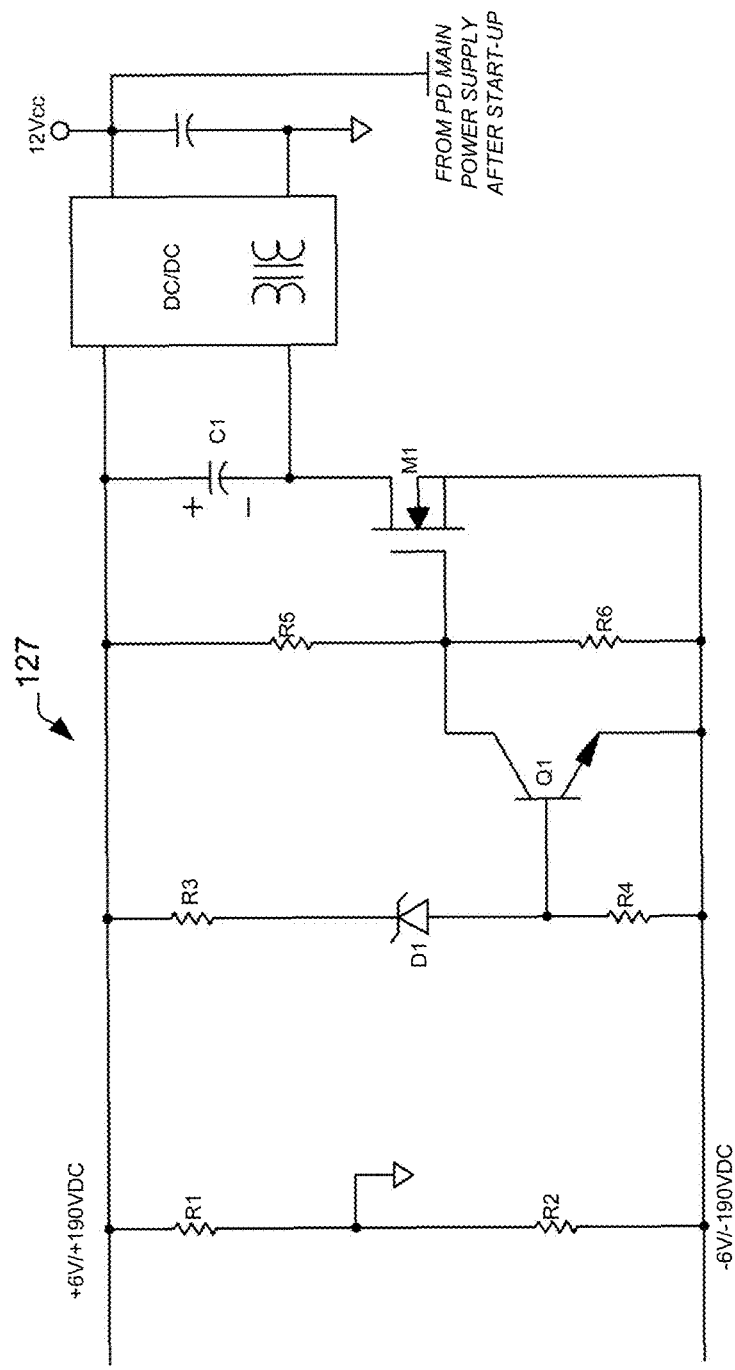
FIG. 12B illustrates details of the housekeeping power circuit of FIG. 11C.
Figure 12C:
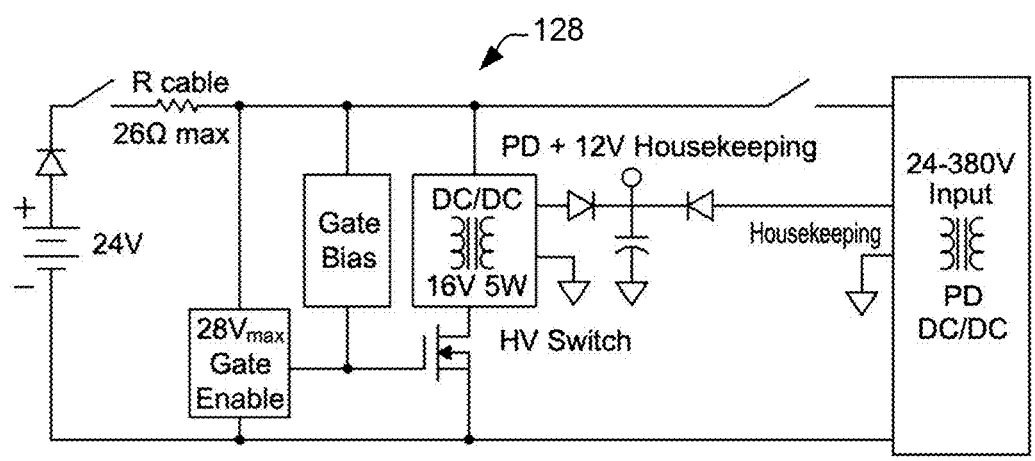
FIG. 12C is a block diagram of the housekeeping power circuit of FIG. 12B.
Figure 13A:
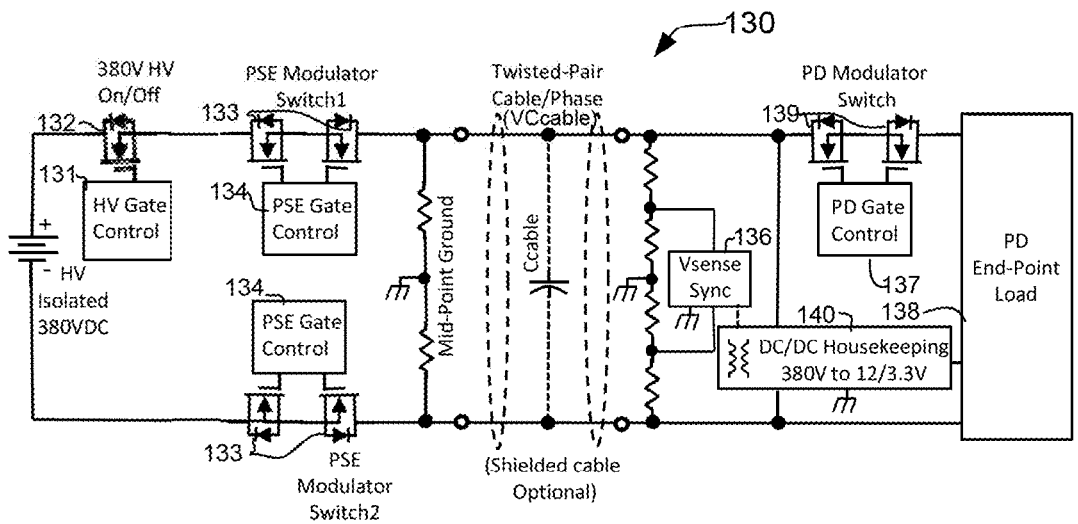
FIG. 13A is a block diagram illustrating a circuit for use in the high voltage initialization of FIG. 5, in accordance with one embodiment.

Additional details of operation of portions of the circuit shown in FIG. 8 are described below for cable capacitance testing (FIGS. 9A and 9C), synchronization (FIG. 10A), low voltage initialization (FIGS. 11A and 11C), low voltage housekeeping (FIGS. 12A, 12B, and 12C), and high voltage initialization (FIG. 13A).

Figure 9A:
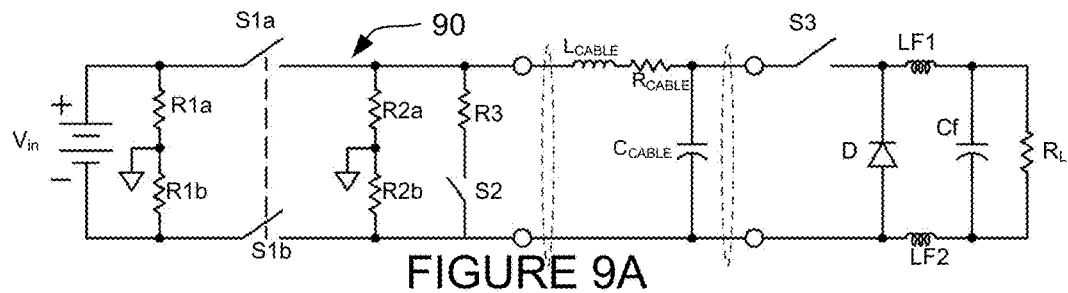
FIG. 9A is an example of a circuit for use in the cable capacitance and safety test of FIG. 7, in accordance with one embodiment.

FIG. 9A is a simplified representation of a circuit 90 for use in cable capacitance and shock fault testing (described above with respect to the flowchart of FIG. 7). In this example, the PSE includes resistors R1a, R1b, R2a, R2b, and R3. R3 is a known calibration resistor switched across the cable for known time for accurate calculation of the cable resistance and capacitance from the dv/dt voltage droop. The PD includes capacitor Cf, inductors LF1 and LF2, and diode D. Switches S1a, S1b (PSE modulator switch) and switch S2 (test switch) are located at the PSE. The PD incudes switch S3 (PD modulator switch). Capacitance $C_{cable}$ represents cable capacitance, inductance $L_{cable}$ represents cable inductance, and resistance $R_{cable}$ represents cable resistance. It is to be understood that the simplified circuit shown in FIG. 9A is only an example and components may be added, removed, or rearranged without departing from the scope of the embodiments. For example, resistors R1a and R1b may be located to the right (as viewed in FIG. 9A) of the switches S1a and S1b.

Figure 9B:
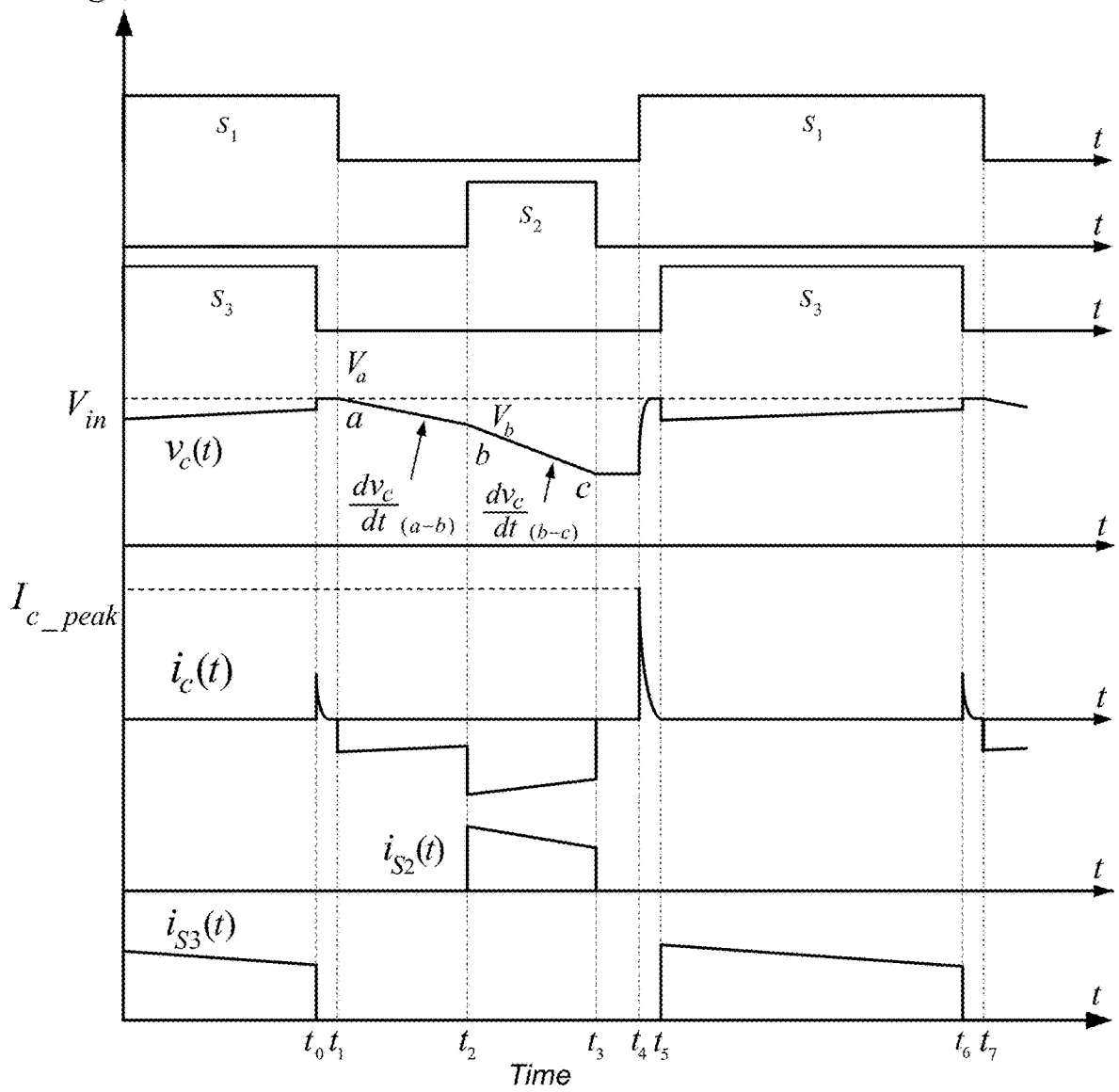
FIG. 9B illustrates current and voltage at a cable corresponding to changes in state of switches in the circuit of FIG. 9A.

FIG. 9B illustrates timing waveforms with one pulse at the PSE test switch S2 for cable current $i_c(t)$ and voltage $v_c(t)$, and current at the PSE test switch S2 $i_{s2}(t)$ and PD switch S3 $i_{s3}(t)$ over time with changes in state of the PSE switch S1 (S1a and S1b in FIG. 9A, shown as $S_1$ in FIG. 9B), test switch S2 ($S_2$ in FIG. 9B) and PD switch S3 ($S_3$ in FIG. 9B) in the circuit shown in FIG. 9A, in accordance with a first embodiment. The waveform diagram also shows $V_{in}$ and $I_{c\_peak}$. As previously described, a known resistor R3 is switched in to determine cable capacitance. After the PSE modulator switch S1 opens, the voltage at the cable begins to drop as represented by $dv_c/dt_{(a-b)}$, which represents cable droop from leakage for fault body resistance ($R_{unknown}$). The voltage continues to drop as switch $S_2$ is closed as shown by $dv_c/dt_{(b-c)}$, which represents cable droop from R3 plus cable leakage or body resistance ($R_{unknown}$). Switch S2 is then opened and the change in cable voltage represents cable droop from leakage or fault body resistance ($R_{unknown}$).

A smart digital system may be used to increase the accuracy and reliability and minimize the Off-time. As previously described with respect to FIG. 7, the PSE modulator may switch On to transmit a pulse on an open/unloaded cable and cable capacitance voltage may be modulated with a known test resistor of maximum body resistance for safety shock protection. The cable resistance and capacitance may then be tested within 10% RC time constant, which is approximately a linear relationship of $dv/V_0 \approx dt/T \approx dt/RC$ for the first 0.1RC time where the discharge voltage $dv_c$ from initial voltage $V_0$ and actual time constant T is from $e^{(-t/RC)}$. The dv/dt with unknown leakage resistance may then be compared with the dv/dt with known test resistance added.

Figure 9C:
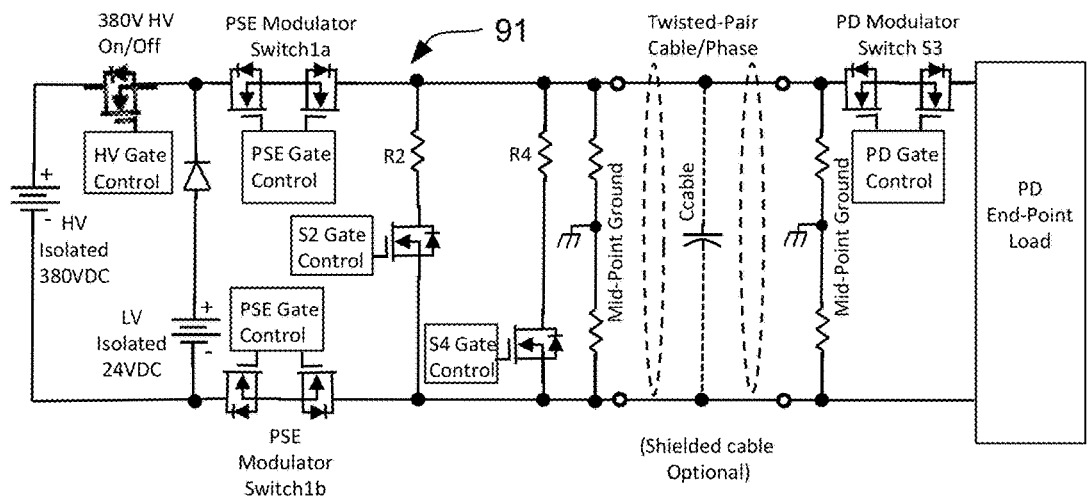
FIG. 9C is an example of a circuit for use in another cable capacitance and safety test, in accordance with one embodiment.
Figure 9D:
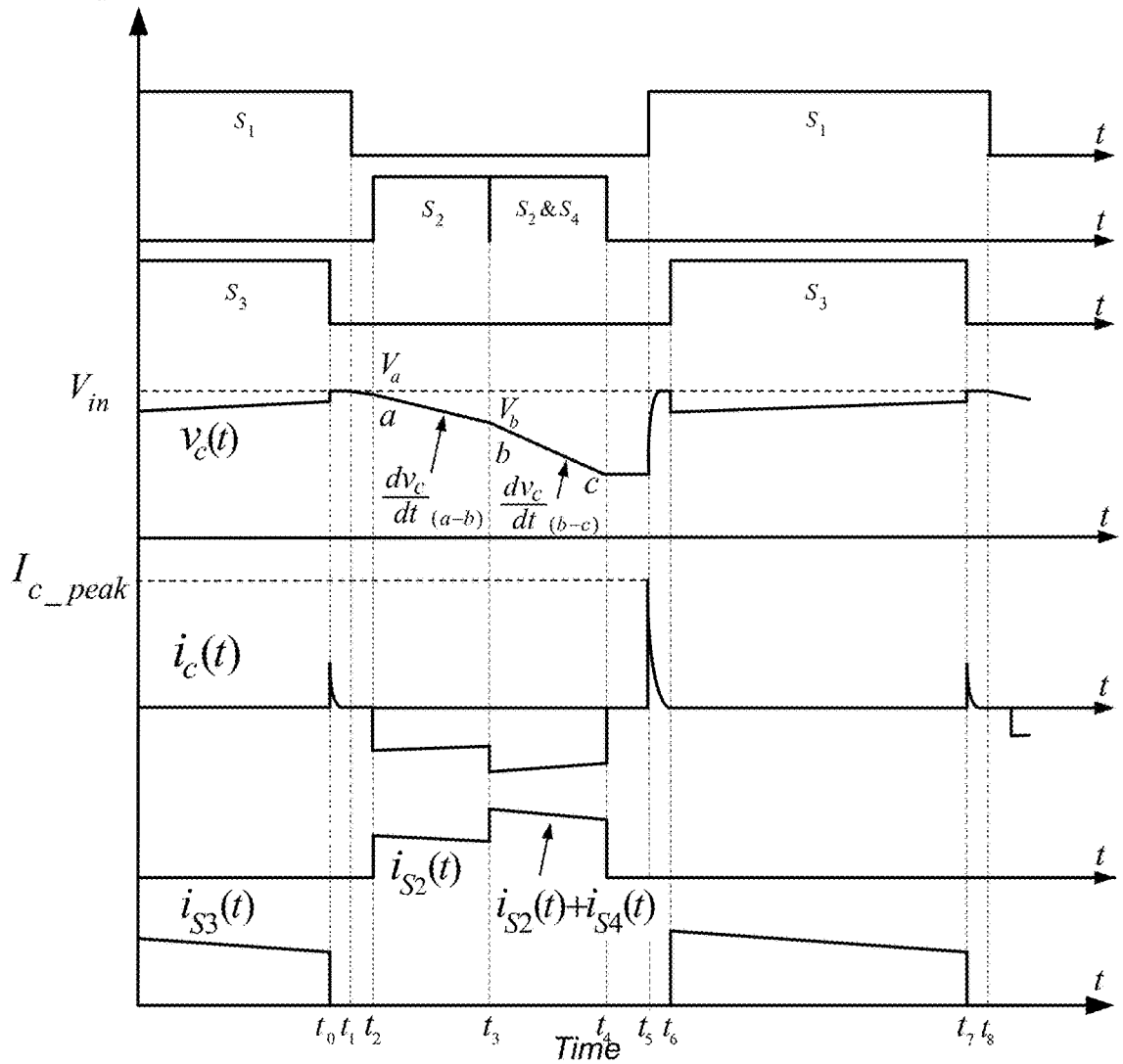
FIG. 9D illustrates current and voltage at a cable corresponding to changes in state of switches in the circuit of FIG. 9C.

FIGS. 9C and 9D illustrate another example for use in performing initial cable safety and capacitance testing. FIG. 9C is a block diagram of a circuit, generally indicated at 91. The PSE includes modulator switches S1a, S1b (collectively referred to as $S_1$ in FIG. 9D), and test switches S2 ($S_2$ in FIG. 9D) and S4 ($S_4$ in FIG. 9D) in parallel. The PD includes switch S3 ($S_3$ in FIG. 9D). Similar to described above with respect to FIG. 9C, FIG. 9D shows timing waveform diagrams for cable current $i_c(t)$ and voltage $v_c(t)$, and current at the PD switch S3 $i_{s3}(t)$ over time with changes in state of the PSE switch S1, test switches S2 and S4, and PD switch S3 in the circuit shown in FIG. 9B. Also shown is the current at the test switches $i_{s2}(t)$ and $i_{s2}(t)+i_{s4}(t)$. In this example, two known switch resistances (R2, R4) provide another calibrated method with larger dv/dt voltage steps for signal-to-noise measurement for faster and more accurate measurements, allowing for less Off-time duty cycle and high voltage period of shock exposure for a higher level of safety. With two known resistances steps, dv/dt differences may be used to calculate the unknown resistance and the cable capacitance from pulse-to-pulse. The S2 and S4 gate may operate together initially than later for a faster initial dv/dt slope for faster detection of the high voltage Off-time event.

It is to be understood that the circuits shown in FIGS. 9A and 9C, waveform diagrams shown in FIGS. 9B and 9D, and test calculations described above are only examples and other circuits (e.g., combination of switches, resistors, etc.) may be used to test the safety and capacitance of the cable.

As previously discussed with respect to steps 45 and 46 of FIG. 4, the PD performs synchronization with the PSE using cable voltage waveform initialization. This process may start with the PD modulator switch turning on for communications to control Off/On synchronization. The PD may then develop a PLL (or DLL) control of the PD modulator switch to control Off/On synchronization. The PD may initially turn on the PD modulator switch for a default period within the PSE modulator default On-time. The modulator switch timing may be modified in accordance with changes made based on PSE safety/capacitance testing and analysis. In one or more embodiments, synchronization may include a time delay PD modulator switch-On loading after PSE modulator high voltage switch-On, and PD modulator switch-Off unloading before PSE modulator high voltage switch-Off, as described below with respect to FIGS. 23 and 24, to minimize cable voltage ringing on cable voltage droop safety testing during high voltage Off-period.

Figure 10A:
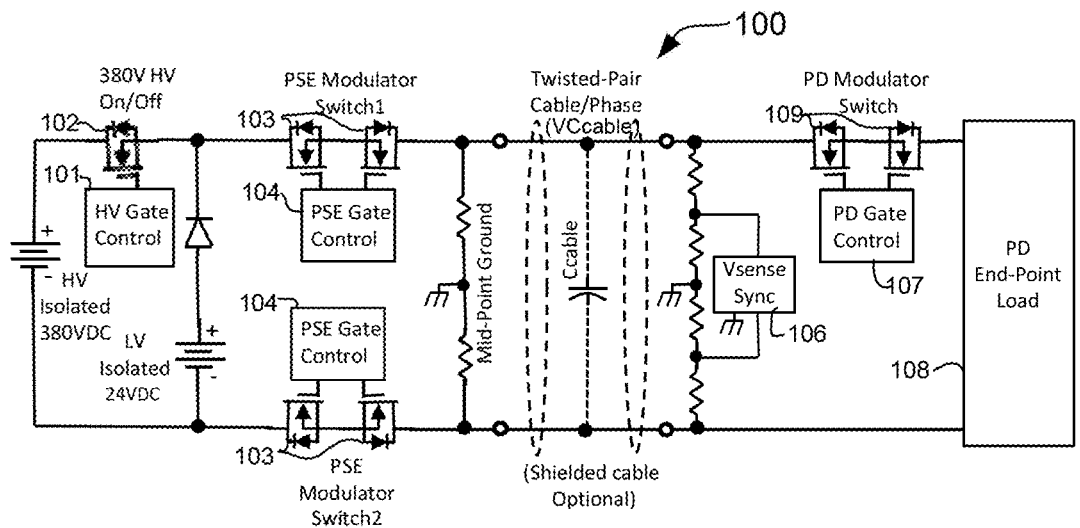
FIG. 10A is a block diagram illustrating a circuit for use in synchronization, in accordance with one embodiment.

FIG. 10A illustrates a simplified synchronization control circuit 100 for use after initial power up. High voltage control is provided at gate control 101 and high voltage switch 102. PSE modulator switches (switch 1 and switch 2) 103 are coupled to PSE gate control 104. As previously described with respect to FIG. 8, the PD includes PD modulator switch 109 coupled to PD gate control 107 and Vsense sync 106. The PD endpoint load is shown at 108. As previously described with respect to the flowchart of FIG. 4, control of the PD modulator may be performed with pulse-pulse off/on command communications after initial power up (steps 44→45), or PD modulator control may be performed with PLL synchronization without communication (steps 45→44), or PD modulator control may be performed with default timing know between the PDE and the PD without communication (steps 45→44). Three different examples of synchronization methods are described below for the circuit shown in FIG. 10A.

Figure 10B:
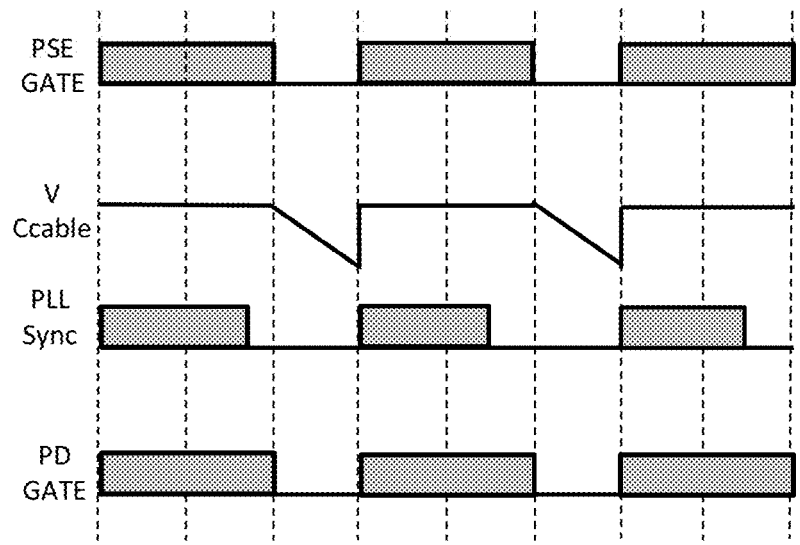
FIG. 10B illustrates voltage at a cable corresponding to changes in state of switches in the circuit of FIG. 10A.

FIG. 10B shows Vccable with switch transitions (PSE Gate (switch 103), PD Gate (switch 109)) and PLL Sync (at Vsense Sync 106). Voltage VCcable is measured at the cable, as shown in FIG. 10A. PLL (or DLL) sync shows the current at the Vsense sync circuit 106.

In a first example, PD modulator control is provided with pulse-pulse off/on command communications after initial power up. The PSE modulator control 104 turns on with low voltage (e.g., 24V) without pulsing. The PD modulator control 107 turns on until it is told to turn off with no load other than housekeeping power. A communications link is then established between the PSE and PD. The PSE modulator 103 starts pulsing at an established On-time and Off-time duty cycle and frequency. The PSE sends a command at the end of a data stream period of modulator On-time to turn off PD modulator for X ms and then turn back on. The Off-time command may be sent earlier in the data stream and changed pulse-to-pulse, then the last word sent may be a turn-off-now command at a specified time (knowing that there will be some turn off delay).

A second synchronization method provides PD modulator control and PLL synchronization without communication. The Vsense sync circuit 106 senses the cable capacitance (Ccable) voltage waveform droop (VCcable) when PSE gate switch 102 is off due to cable resistance (i.e., mid-point ground resistance and sensing circuits). The Vsense circuit 106 develops pulses from VCcable positive transition after droop with PSE gate switches on (FIG. 10B). The Vsense pulses are input to PLL to develop Voltage Controlled Oscillator (VCO) sync pulses. PLL VCO pulses develop pulse shaping for PD gate modulator control, which are synchronized as desired with the PSE gate switch control 104. Voltage waveform droop (VCcable) with the PSE gate switch off is shown in FIG. 10B. As previously described, VCcable has a positive transition after droop when the PSE gate 104 switches on.

A third synchronization method provides a pre-established default On-time between the PSE and the PD modulators. One or more embodiments utilize a one-shot monostable multi-vibrator (MV) default pulse width and default delay time to synchronize with the PSE default modulator On-time triggered from the cable capacitor voltage waveform fast-rising dv/dt at the start of the PSE Modulator pulse On-time. The circuit may include, for example a differentiator circuit, bias average trigger threshold circuit, and op-amp. The circuit may further include an adjustable delay-On 105a (e.g., 100 μs default) and an adjustable one-shot multi-vibrator 105b (e.g., 7.8 ns default). In this example, PD modulator control is provided with pulse-pulse default On-time until updated On-time command for next pulse during communication. The PSE modulator first pulses a default On-time duty cycle (e.g., 8 ms) and period (e.g., 12 ms) to cable phase/pair with voltage waveform droop (Vccable) to the PD Vsense sync circuit 106. The Vsense sync circuit 106 triggers on the Vccable positive transition with a delayed pulse width desired for the PD modulator switch control with a default On-time duty cycle. During the On-time duty cycle, data communications may update or modify the sync delay time, pulse width, and period, as needed to sync with the PD modulator On-time duty cycle for each next pulse period. The above steps may then be repeated. This provides pulse-pulse change for on-the-fly synchronization changes in On/Off time, duty cycle, and frequency from the PSE and keeps the PD in sync for each phase/pair. This sequence also ensures the PSE modulator voltage is On-first before the PD modulator switches-On and then Off-first before the PSE modulator voltage switches-Off for noise transient mitigation.

FIG. 11A is a block diagram illustrating a simplified PD initial low voltage start-up circuit 110. As described above with respect to the flowchart of FIG. 4, the low voltage (e.g., 24V) start-up sequence for PD housekeeping power may be performed before PD modulator control or communications. As previously described with respect to FIG. 10A, high voltage control is provided at gate control 111 and high voltage switch 112. PSE modulator switches (switch 1 and switch 2) 113 are coupled to PSE gate control 114. The PD includes PD modulator switches 113 coupled to PD gate control 117 and Vsense sync 116. The PD endpoint load is shown at 118. The circuit shown in FIG. 11A includes a DC/DC housekeeping circuit 120 (e.g., 24V to 12/3.3V transformer) (also referred to as local energy storage). The PSE modulator switch 119 may provide low voltage (e.g., 24V) On-time for a fixed time (e.g., 100 ms) for initial start-up power to the cable and PD DC/DC housekeeping circuit 120. The PD DC/DC housekeeping circuit 120 starts-up and operates for the fixed time of the PSE modulator switch 113. The PSE modulator 113 then starts pulsing low voltage at an established On-time and Off-time duty cycle and frequency (as shown in PSE gate current in FIG. 11B).

Figure 11B:
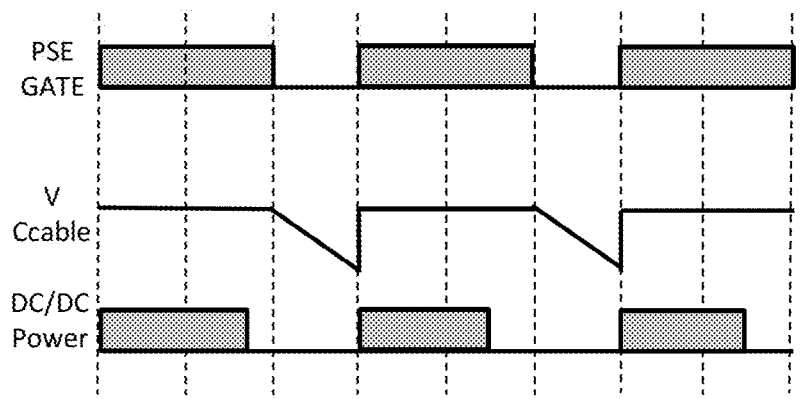
FIG. 11B illustrates cable voltage and housekeeping power corresponding to changes in state of a power sourcing equipment switch in the circuit of FIG. 11A.

The Vsense circuit 116 develops an enable pulse width from VCcable positive transition after the voltage droop from PSE gate switches on to operate the DC/DC housekeeping converter 120 for continued housekeeping power (FIGS. 11A and 11B). The 24V DC/DC converter provides housekeeping power to the PD circuits, starts PD modulator switch 119 and communication, and then enables 380 VDC high voltage modulator switching to the cable. An OVP (Over Voltage Protection) circuit disables the DC/DC converter above ~27 VDC when the high voltage turns on. The PD may include a 380V high voltage DC/DC converter (87c in FIG. 8) for housekeeping, which takes over housekeeping power from the 24V DC/DC converter 120.

FIG. 11B shows voltage waveform droop (VCcable) (measured at the cable start at PSE) with the PSE gate control 114 off (modulator switches 113 open). The PSE gate trace shows modulation of the PSE switch 113. DC/DC power is measured at the DC/DC housekeeping circuit 120. As previously described, VCcable has a positive transition after droop when the PSE gate 114 switches on. The Vsense circuit 116 develops an enable pulse width from VCcable positive transition after the voltage droop when the PSE gate switches on to operate the DC/DC housekeeping converter 120 for continued housekeeping power.

Figure 11C:
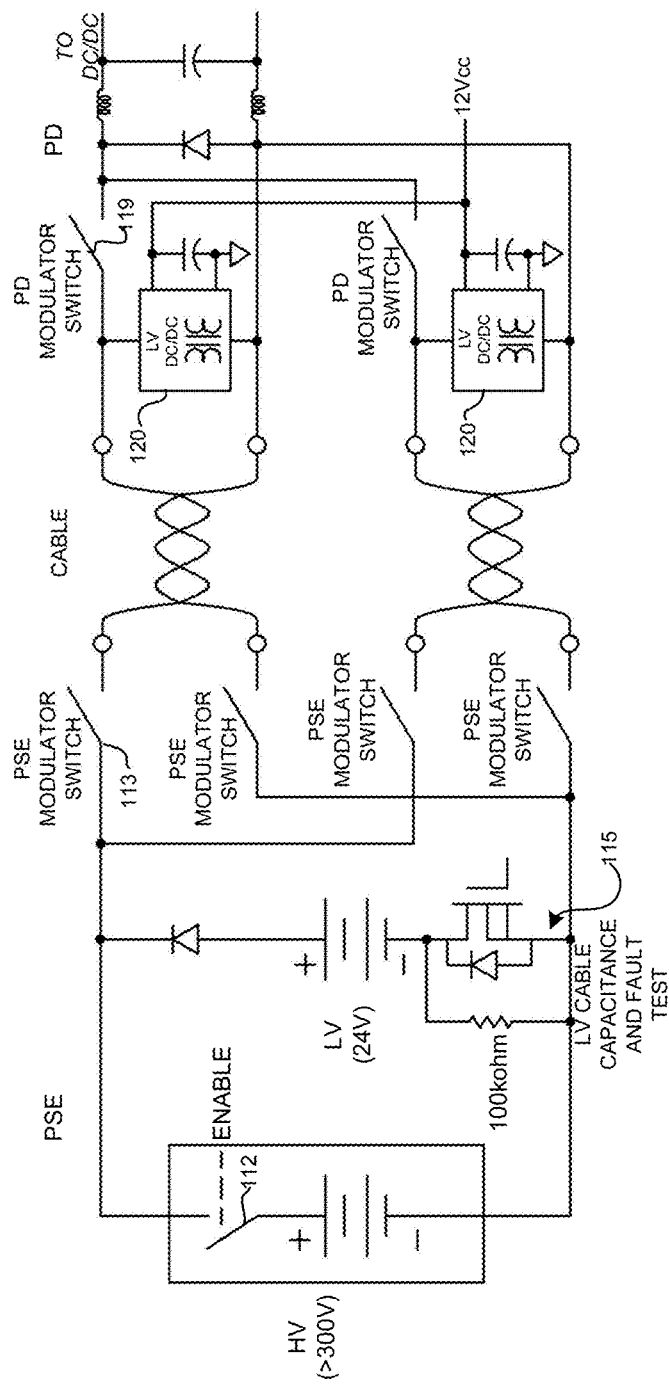
FIG. 11C is an example of a low voltage start-up circuit, in accordance with one embodiment.

FIG. 11C is a simplified circuit design for use in low voltage start-up. Two twisted pairs are shown with the PSE modulator switches 113 and PD modulator switch 119 shown for each pair. The enable switch 112 is closed for high voltage operation (e.g., 380 VDC, >300V, >200 VDC). In one example low voltage operation may be less than or equal to 56V (e.g., 24V). The PSE includes a low voltage cable capacitance and fault test circuit 115. In one or more embodiments, the low voltage power-up circuit at the PD is configured with 0V shut-off above approximately 27V (with low voltage operation of 24V) to allow for hot-swap without an isolation circuit. An alternate start-up power may be provided with a battery at the PD for initial power-up. The PD includes the low voltage DC/DC converter 120 for each wire pair, as previously described. Details of the low voltage housekeeping circuit are described below with respect to FIGS. 12A and 12B.

FIG. 12A is a block diagram illustrating an example of a low voltage housekeeping power circuit 121. The circuit 121 includes a gate bias and control circuit 122, with input enable 1 (from 125), enable 2 (from 126), and disable from PD housekeeping (24/12V DC/DC converter 123), and switch 124 (described above with respect to FIGS. 11A and 11C). As shown in FIGS. 11A and 11C, the housekeeping circuit receives power from the cable pair and provides power to the PD modulator switch 119. The converter 123 provides housekeeping power to the PD circuits, starts the PD modulator switch and communication, and then enables high voltage modulator switching.

FIG. 12B illustrates a simplified low voltage start-up housekeeping power circuit 127. The circuit provides low voltage DC/DC self-starting housekeeping power to the PD end of the cable pair with over voltage protection to shut off with high voltage MOSFET switch M1. In one example, resistors R1, R2, R3, R4, R5, and R6 may each comprise a 1 or 2 Mohm (Megaohm) resistor. Diode D1 and switch Q1 may provide over voltage protection above 27V, for example. In one example, capacitor C1 is rated at 100 µF.

It may be noted that for long cable resistance voltage drop for 5 W, the start-up low voltage may be increased from 24V to 56 VDC. In one or more embodiments, the low voltage may be less than or equal to 56V and a difference between the high voltage power (at power on pulse at PSE) and low voltage power may be greater than 200V (e.g., ~324V, ~368V). It is to be understood that these voltage levels are only examples and other levels may be used. The low voltage is preferably rated to prevent any safety issues during low voltage start-up (e.g., initialization and synchronization) and the high voltage is preferably rated to provide sufficient power to power the powered device, while providing safety checks during off pulse intervals. As described below, the high voltage power level may be based on the number of phases in a multi-phase power system in which the pulses are offset from one another between phases.

FIG. 12C illustrates a block diagram of a circuit 128 corresponding to the circuit 127 shown in FIG. 12B. In this example, the circuit includes a 28V gate enable, gate bias and DC/DC converter (e.g., 16V/5 W) for housekeeping power.

Figure 13B:
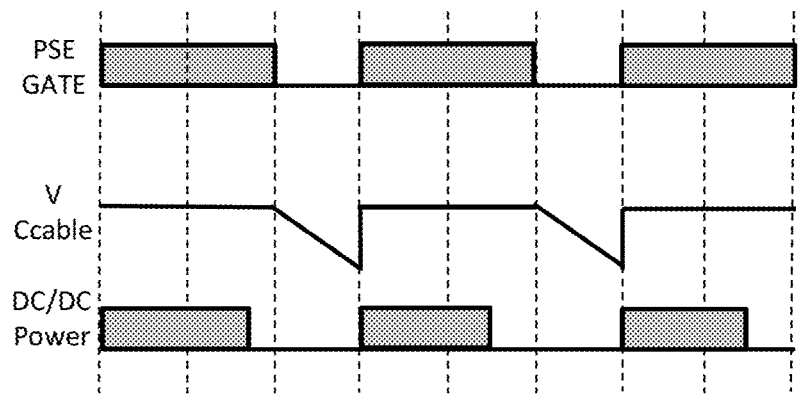
FIG. 13B illustrates cable voltage and housekeeping power corresponding to changes in state of a power sourcing equipment switch in the circuit of FIG. 13A.

FIGS. 13A-13B illustrate high voltage start-up in accordance with one embodiment. As described above with respect to FIG. 5, high voltage start-up may be used as a high voltage initialization start-up with short high voltage On-pulse for an added safety protection or with normal high voltage pulsing to hot-swap a PD without requiring a low voltage initialization process. The high voltage initialization provides safe operation through use of short on pulses (within safe region as described above with respect to FIG. 6).

Referring first to FIG. 13A, a block diagram illustrating a simplified initial high voltage start up circuit 130 is shown, in accordance with one embodiment. High voltage control is provided at gate control 131 and high voltage switch 132. PSE modulator switches (switch 1 and switch 2) 133 are coupled to PSE gate control 134. As previously described, the PD includes PD modulator switches 139 coupled to PD gate control 137, and Vsense sync circuit 136. The PD endpoint load is shown at 138. The circuit 130 shown in FIG. 13A includes a high voltage DC/DC housekeeping circuit 140 (e.g., 380V to 12/3.3V DC/DC converter) in place of the low voltage housekeeping circuit 120 of FIG. 11A. In one example, the high voltage is pulsed on for less than 8 ms during the PSE modulator switch high-voltage On-time to charge the output to a minimum output housekeeping voltage with hold-up time until the next high voltage phase, as described below.

The PSE modulator switch 133 starts pulsing high voltage at an established On-time (e.g., 8 ms) and Off-time (e.g., 4 ms) duty cycle and frequency. The DC/DC initial startup circuit 140 at the PD is energized on the first high voltage On-time cycle for a fixed operating time (e.g., 6-8 ms). The Vsense circuit 136 develops an enable pulse width (e.g., 6 ms) from VCcable positive transition after the voltage droop when PSE gate switches on to operate the DC/DC housekeeping converter 140 for continued housekeeping power (FIGS. 13A and 13B). The high voltage DC/DC converter 138 provides housekeeping power to the PD circuits, starts PD modulator and communication, then enables high voltage modulator switching to the cable.

FIG. 13B shows voltage waveform droop (VCcable) (measured at the cable start at PSE) with the PSE gate control 134 off (modulator switches 133 open). The PSE gate trace shows modulation of the PSE switch 133. DC/DC power is measured at the DC/DC housekeeping circuit 140. As previously described, VCcable has a positive transition after droop when the PSE gate 134 switches on. The Vsense circuit 136 develops an enable pulse width from VCcable positive transition after the voltage droop when the PSE gate switches on to operate the DC/DC housekeeping converter 140 for continued housekeeping power.

Figure 14:
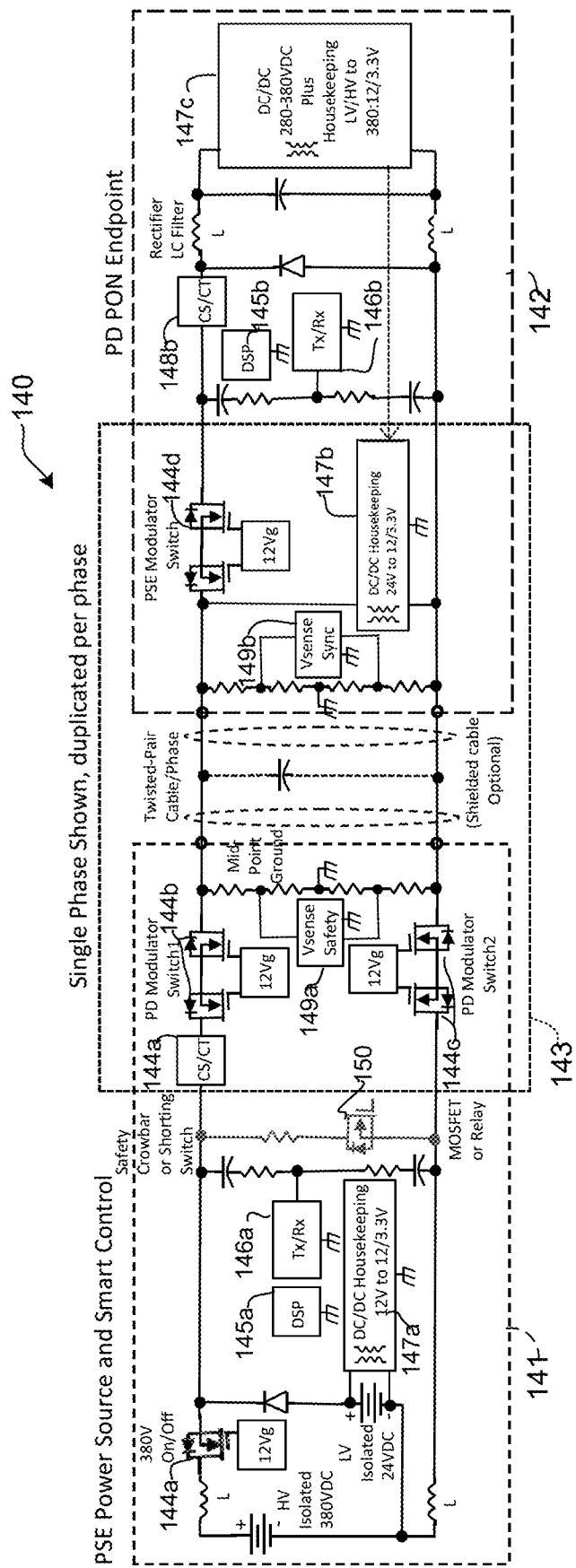
FIG. 14 is a bock diagram of a circuit illustrating a safety crowbar/shorting relay added to a high voltage source in the circuit of FIG. 8.

FIG. 14 is a block diagram of a system 140 showing simplified circuits for the PSE 141 and PD 142 with a crowbar/shorting relay 150 included at the PSE for safety. As previously described with respect to FIG. 8, the components shown within block 143 represent a single phase and may be duplicated for each phase of a multi-phase system. The PSE 141 includes an isolated high voltage source (e.g., 380 VDC) and a switch 144a and gate. Tx/Rx 146a, 146b at the PSE and PD represent transceivers with a coupling network. The DSP (Digital Signal Processor) 145a, 145b may be a microcontroller or FPGA (Field Programmable Gate Arrays) digital control and software/firmware. An isolated power supply 147a is provided for PSE housekeeping. An isolated power supply 147b is provided for PD housekeeping with 24 VDC input for low voltage initialization and testing. A PD DC/DC isolated converter 147c is provided for Vout and for 12/3.3V housekeeping with 280-380 VDC input. Current sense transformer/Hall-effect sensors (CS/CT) 148a, 148b are located at the PSE and PD. A safety sensing circuit (Vsense safety) 149a and PD sync voltage sensor (Vsense sync) 149b are located in the PSE and PD, respectively. The PSE includes PSE modulator switches 144b, 144c, and the PD includes PD modulator switch 144d, as previously described.

In the example shown in FIG. 14, a shorting switch (safety crowbar) 150 is installed in the PSE 141 for added high voltage safety. The shorting switch 150 may comprise, for example, a solid-state device (e.g., MOSFET), which is energized with a body shock fault to discharge cable voltage charge energy. A high voltage relay may also be used. The shorting switch 150 may be manually energized (e.g., at a button on PSE) as a high voltage lockout by maintenance personnel when installing or maintaining equipment. The shorting switch may be energized with a cable connector safety interlock when disconnected, for example.

It is to be understood that the circuits and block diagrams shown in FIGS. 8, 9A, 9C, 10A, 11A, 11C, 12A, 12B, 12C, 13A, and 14 are only examples and that other arrangements or combinations of components (e.g., resistors, capacitors, diodes, inductors, switches, gates, isolated power supplies, transformers (converters), or sensing circuits), pulse timing, or voltage or power levels may be used without departing from the scope of the embodiments. For example, the low voltage pulse power may comprise pulses of power transmitted (i.e., pulse on) at or above 24V, at or below 56V and the high voltage pulse power may comprises pulses of power transmitted at or above 200V, at or above 380V or any other suitable levels. In one or more embodiments, the difference between the low and high voltage power is at least 170V.

Figure 15:
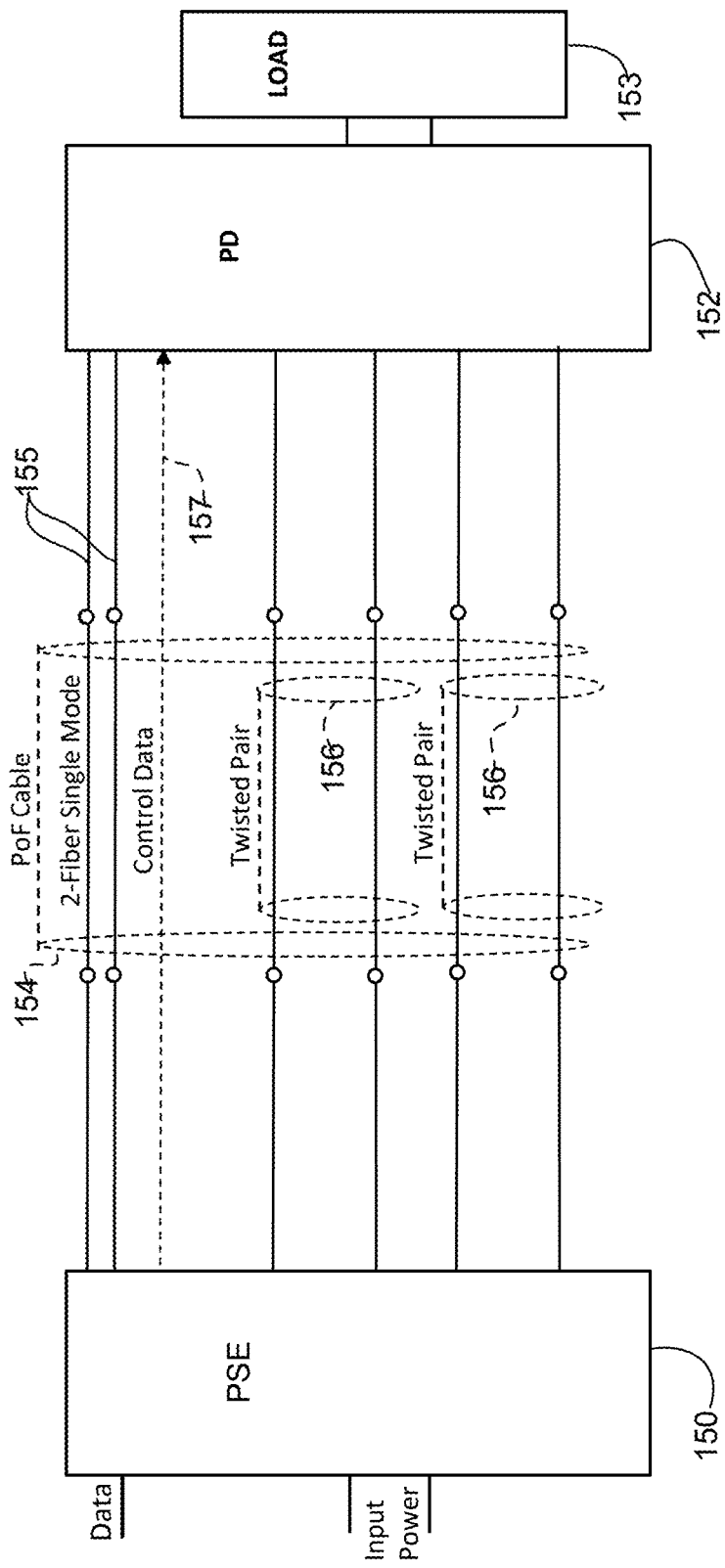
FIG. 15 shows a cable with optical fibers and two twisted pairs connecting power sourcing equipment to a powered device for delivery of extended safe power, in accordance with one embodiment.
Figure 16:
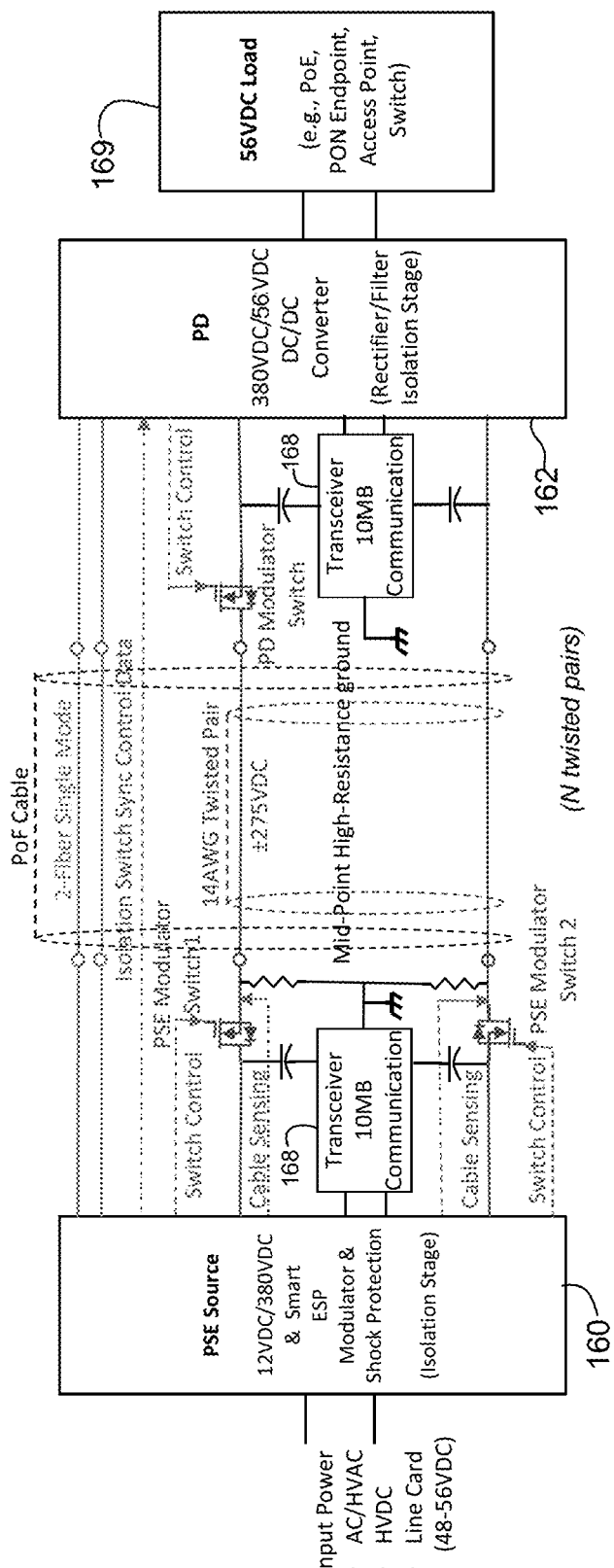
FIG. 16 illustrates details of one of the twisted pairs shown in FIG. 15, in accordance with one embodiment.
Figure 17:
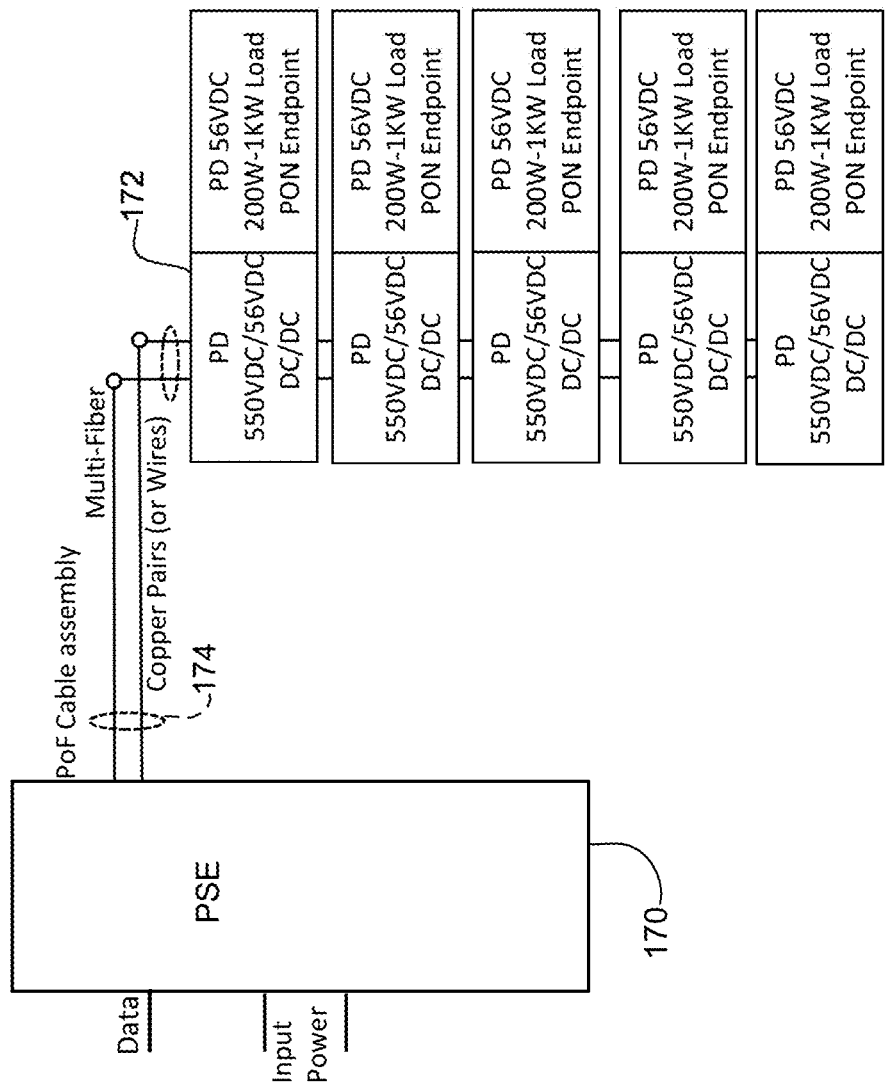
FIG. 17 illustrates an example of power and data distribution to a plurality of powered devices, in accordance with one embodiment.
Figure 18:
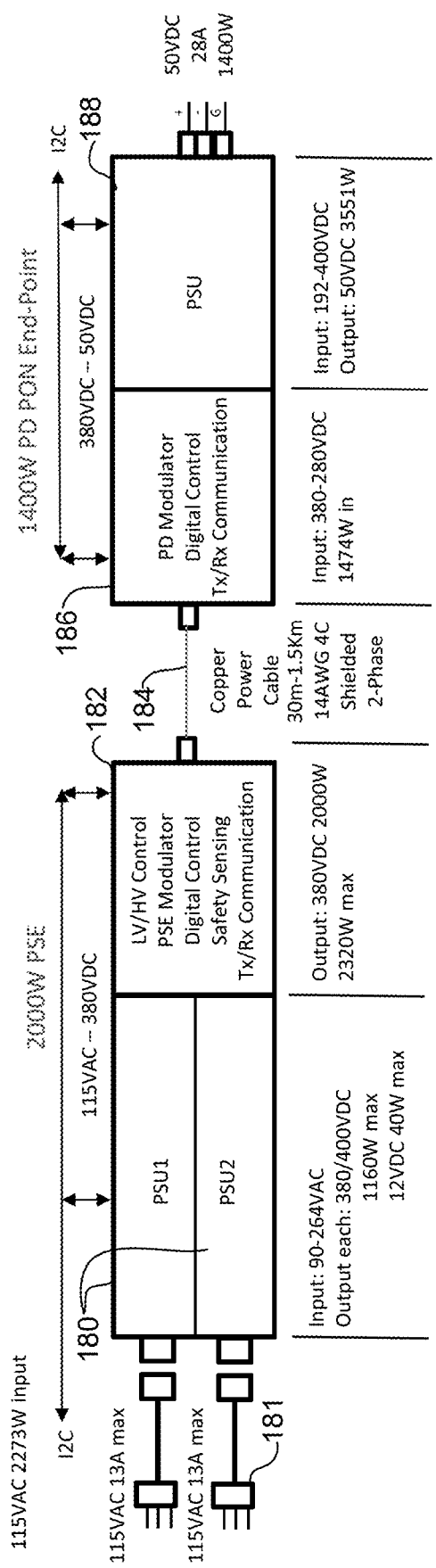
FIG. 18 is a simplified block diagram illustrating an example of voltage and power levels between the power sourcing equipment and powered device in an extended safe power system, in accordance with one embodiment.
Figure 19:
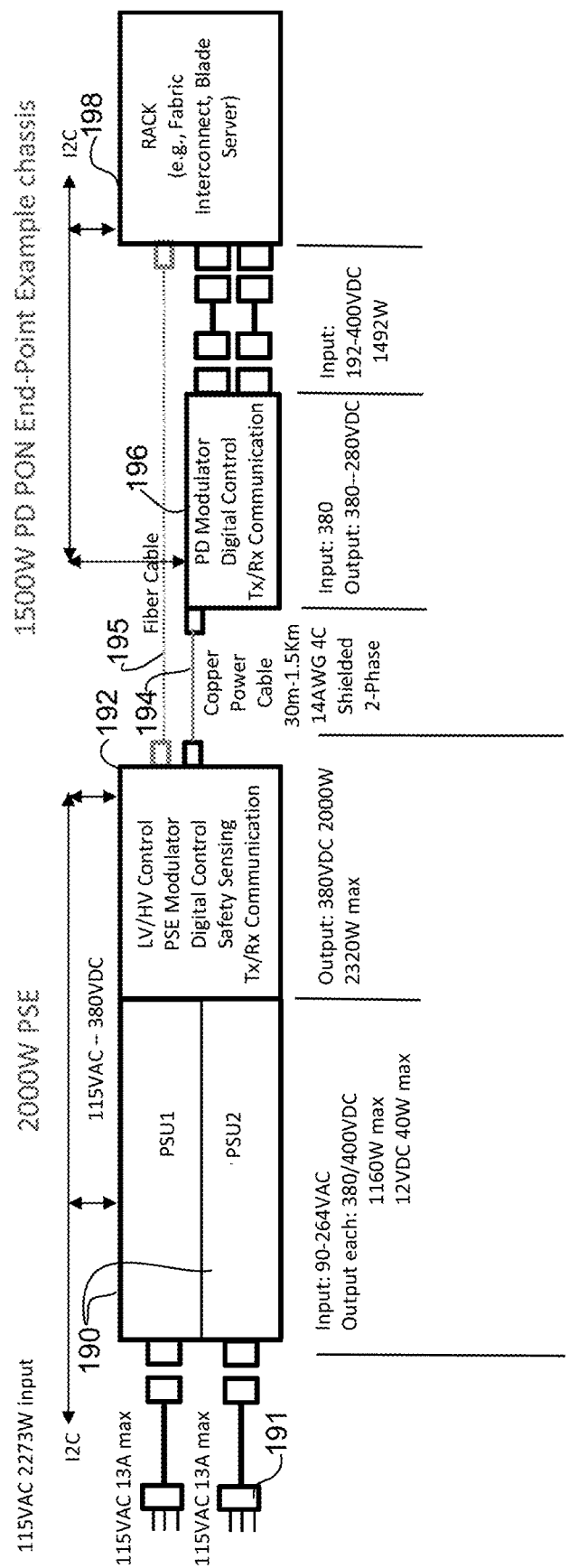
FIG. 19 is another simplified block diagram illustrating an example of voltage and power levels between the power sourcing equipment and the powered device in the extended safe power system, in accordance with one embodiment.

FIGS. 15-19 illustrate simplified examples of extended safe power (ESP) systems for delivering power on a copper pair with a data fiber pair. As previously noted and described below, the extended safe power may be delivered on a combined cable with one or more optical fibers for data delivery. FIG. 15 is a simplified block diagram showing a cable extending between a PSE and PD and carrying two twisted pairs and optical fibers. FIG. 16 is a block diagram illustrating additional functional components at the PSE and PD for a single twisted pair. FIG. 17 is a block diagram illustrating multi-point distribution of ESP to multiple low power PD endpoint loads. FIGS. 18 and 19 show simplified block diagrams illustrating examples of power and voltage levels at input and output of the PSE and PD.

Referring now to FIG. 15, a simplified example of a data and power delivery system comprising a PSE 150 in communication with a PD 152 providing power to a load 153, over a combined power and data cable (e.g., Power over Fiber (PoF) cable) 154 is shown. In this example, the cable 154 includes two optical fibers 155 (e.g., 2-fiber single mode) and two twisted pairs 156 (e.g., copper wires). Control data shown at 157 may be delivered over the optical fibers 155 or copper wires (twisted pairs) 156, or a separate transmission line. The control data may comprise, for example, isolation switch synchronization control data, modulator switch control data, bidirectional control data, or other PSE/PD synchronization data. Bidirectional communications data may also be transmitted over the optical fibers 155 or wires 156. In one example, 10 MB communications are provided over a copper pair during high voltage on pulse (e.g., on high voltage data link). Input power (e.g., AC, HVAC, HVDC, line card 48-56 VDC) may be provided at the PSE 150. The cable 154 may comprise any number of optical fibers and wires or wire pairs for delivering data and high voltage pulse power over different cable lengths.

In one or more embodiments, PoE or high voltage power (e.g., ESP, pulse power, multi-phase pulse power) may be delivered over the same cable and connectors. Depending on a capability of the PSE 150 and PD 152, the PD may operate in one or more different modes. If the PSE 150 and PD 152 are not compatible (i.e., one only configured for PoE and the other one only configured for ESP) the circuit will be not be powered. If both the PSE 150 and PD 152 are capable of ESP operation, the PSE will supply high voltage pulse power and the PD will operate using the high voltage pulse power. In another example, the PSE, PD, or both PD and PSE may select an operating mode based on the most efficient delivery mode (e.g., using auto-negotiation between PD and PSE).

FIG. 16 illustrates additional details of one of the twisted pairs shown in FIG. 15, in accordance with one embodiment.

A PoF (Power over Fiber) cable extends between a PSE 160 and PD 162. In this example, the PD 162 powers a 56 VDC load 169 (e.g., PoE, PON endpoint, access point, switch). In the simplified example shown in FIG. 16, the cable includes two optical fibers and one twisted pair. As previously described, the cable may comprise any number of wire pairs (e.g., N twisted pairs). In this example, the system provides high resistance mid-point grounding for shock protection. In one example, mid-point grounding drops the line to ground voltage (e.g., 275V line-to-ground, 550V line-to-line; 190V line-to-ground, 380V line-to-line). In one or more embodiments, both feed and return of each transmission pair is switched to implement effective control and line-to-ground fault detection is between 10-100 µs. As previously described, cable sensing may be provided at the PSE 160. The system may provide line-to-ground (GFI (Ground Fault Interrupters)) shock protection and line-to-line shock protection for any cable fault condition during auto-negotiation with high-voltage pulse Off-time, as described above. One or more embodiments provide single point of failure and redundancy for any high-voltage path to cable. In one or more embodiments, the system may use 12-56 VDC low voltage for initial start-up conditions and default condition to establish data link and safety interlock before enabling high voltage operation, as previously described. In one example, 10 MB communications are provided over the twisted pair during high voltage on pulse as shown at transceiver 168.

FIG. 17 illustrates an example of ESP multi-point distribution to multiple low power endpoint loads (e.g., 5G radio sets or other devices). A PSE source 170 delivers high power and data over a PoF cable assembly 174 comprising fibers and wires to a plurality of PDs 172. In one or more embodiments, multi-phase pulse power is delivered at a voltage of at least 200V on the cable 174. In one example, 1-2 kW of power is provided on copper pairs with data fiber pairs over 1-10 km with 550 VDC pulse power. As previously described, the pulse power may comprise any number of phases. As noted above, the system may use 24 VDC or 56 VDC low voltage for initial start-up conditions and default condition to establish data link and safety interlock before enabling high voltage operation. In the example shown in FIG. 17, 550 VDC pulse power may be distributed to multiple low power PD PON endpoint loads such as 5G radio sets, for example. In one example, the system provides 1-2 kW power on copper pair with data fiber pair over 1-10 km with 380/550 VDC extended safe power with >70% efficiency. Transmittal of power from the PSE 170 to the plurality of downstream PDs 172 in a daisy chain topology (also referred to herein as a hybrid multi-/drop daisy chain topology) is described below with respect to FIGS. 29-40.

FIGS. 18 and 19 are block diagrams illustrating simplified systems with examples of power input and output at the different sections of the ESP system. FIG. 18 illustrates a PSE with two PSUs 180 receiving 115 VAC power at plugs 181. The PSE includes low voltage/high voltage control, PSE modulator, digital control, safety sensing, and transmitters/receivers for communication as shown at block 182. The PSE is coupled to the PD with a power cable 184 (e.g., 14 AWG). In this example, output at the PSE comprises 380 VDC, 2000 W power. In this example the PD is a 1400 W PON (Passive Optical Network) end point comprising a PD modulator, digital control, and transceiver/receiver at block 186. Input at the PDU in this example is 380-280 VDC and 1474 W and output at the PSU 188 is 50 VDC, 28 A, and 1400 W.

FIG. 19 illustrates a PSE comprising two PSUs 190 and module 192 for low voltage/high voltage control, modulation, and communications as previously described. PD 196 (comprising PD modulator, digital control, transceiver/receiver) is coupled to an endpoint comprising a rack component 198 (e.g., fabric interconnect, blade server, etc.). Power is received at 115 VAC plug 191. In this example, the PD 196 provides 192-400 VDC (1492 W) power to rack component 198.

It is to be understood that the power inputs and outputs shown in the simplified block diagrams of FIGS. 18 and 19 are only examples and other voltage and power levels may be used, without departing from the scope of the embodiments. Also, the cable may comprise any number of wires or optical fibers and the system may be configured for single point of failure tolerance for continuous operation with N+N or N+1 redundancy. In one or more embodiments fail safe from high voltage to low voltage operation may be provided.

As previously described, the pulse power system may operate as a multiple phase (multi-phase) system. The initialization, synchronization, testing, and fault detection described herein may be performed on each phase of the multi-phase system. In one or more embodiments, the pulse power system may comprise a multi-phase pulse power system as described in U.S. patent application Ser. No. 16/380,954, referenced above. In one example, single conductor pair cable is replaced with 2-phase pulse power transmission system cable with two pairs of power lines, busbars, power planes, or cable wired pairs. For example, one or more embodiments may comprise a 2-phase pulse power transmission system cable with 3-wire, busbars, power planes, or a cable wire trio. Multi-phase (three or more phase) operation may further reduce RMS current per phase and effectively provide continuous DC voltage without bulky filter components. In one or more embodiments, high or effectively 100% duty cycle to the output and split ground (e.g., mid-point high-resistance ground) may provide higher efficiency with lower RMS current cable losses, allow fast and effective phase to ground fault detection, allow for higher voltage and power to the load from limited cable voltage rating, and implement common mode systems (separate ground connection) with lower peak currents for lower EMI/EMC noise radiated and susceptible fields.

In one or more embodiments, the multiple phase approach allows for a significant Off-time in a 10 ms window, for example, to verify the cable for shorts, opens, unreported power loss (e.g., low current short), or human or animal added resistance. This extended Off-time allows for a significant improvement in safety. The multi-phase pulse power also allows for a lower source voltage to be used to meet 100% of the powered device requirements. As previously noted, in a single phase system, the Off-time may need to be filtered out with bulky filters, and even then, power efficiency/effectivity is about 80% on high loads. Use of multiple phases at a higher duty cycle and higher efficiency provides a significant component advantage and may also provide increased power delivery and reliability. For example, the loss of a single phase in a three or more phase system does not impact the 100% continuous duty cycle power effectivity at the powered device. As described below, loss of a sourced phase front end circuit may not impact operation with redundant power sources.

Figure 20:
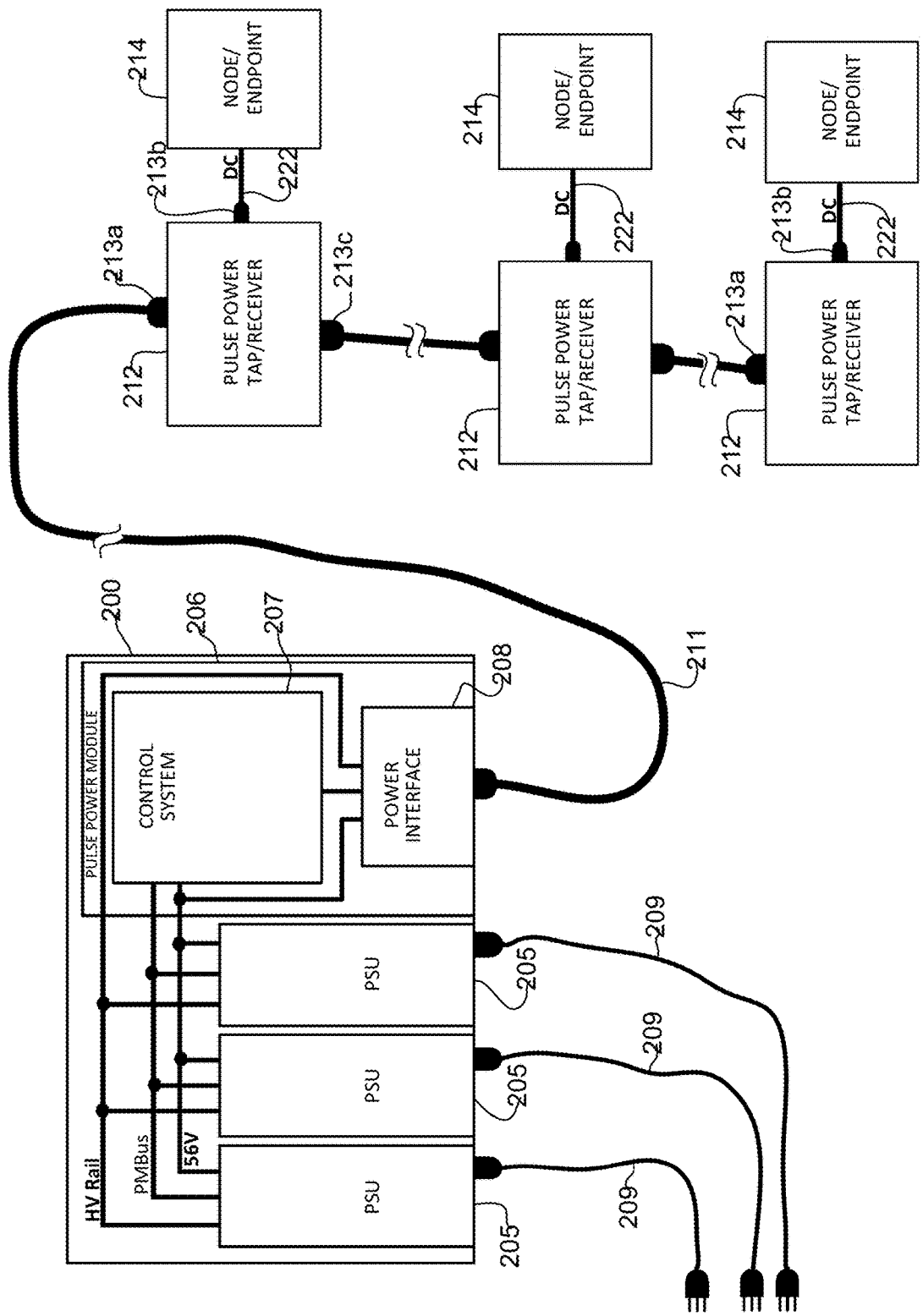
FIG. 20 is a block diagram illustrating an example of a multi-node three-phase pulse power system, in accordance with one embodiment.

Referring now to FIG. 20, a multi-node multi-phase pulse power block diagram is shown, in accordance with one embodiment. The simplified example shown in FIG. 20 includes a PSE node 200 delivering power to three or more PDs (e.g., pulse power tap/receiver 212 and node endpoint 214). In this example the pulse power tap/receiver 212 is separate from the endpoint equipment 214, however, these nodes may be combined. Also, there may be more than one node 214 connected to one or more of the pulse power tap/receivers 212.

The PSE network device 200 comprises an input power interface (e.g., three PSUs 205 receiving power cords 209 in the example shown in FIG. 1A) for receiving input power, a power control system 207 for receiving the input power and transmitting DC pulse power on multiple phases over a cable 211 to a plurality of the powered devices 212, 214 and verifying cable operation within Off-time of pulses in the DC pulse power, and a cable interface (e.g., power interface 208) for delivery of the multi-phase DC pulse power and data (e.g., control data, bidirectional communications, on copper wire or optical fiber) over the cable 211.

The pulse power tap/receiver 212 comprises an input cable interface 213a for receiving the multiple phase DC pulse power and data from the PSE 200, an isolation switch (described below), and an interface 213b for transmitting power to the endpoint node 214. The interface 213b may be, for example, an interface connected to HVDC cable 222, pulse power cable, or a direct interface to the endpoint node. The tap/receiver 212 may supply power to one or more nodes 214 along a pulse power cable system. The tap/receivers 212 may be sized to support individual node power and may implement disconnect for fault isolation or node control based on data link communications. The multiple phase (multi-phase) DC pulse power comprises at least two phases to provide continuous DC voltage at the endpoint node 214. In one or more embodiments, the multi-phase pulse power comprises at least three phases to provide continuous power in case of loss of one phase. One or more of the pulse power tap/receivers 212 also comprises an output cable interface 213c for transmitting the multiple phase DC pulse power and data on the cable to a downstream tap node 212 in a taper topology (tap node configuration).

In the example shown in FIG. 20, the PSE 200 comprises three PSUs 205 and a pulse power module 206 comprising the control system 207 and the power interface 208. As shown in FIG. 20, each PSU 205 may be in power communication with the pulse power module 206 over a high voltage rail, PM (Power Management) bus line, 56V line, or any combination thereof. In one example, each PSU 205 is configured for 1200 W power to provide redundancy and allow for the use of standard 15 A (amp) power cords/branch circuits. In one example, the PSE 200 is operable to deliver >1500 W total power to the nodes 214. In one example 190V line-to-ground (380V total) eliminates the need for intermediate power conversions.

The pulse power module control system 207 may provide, for example, timing and sequencing, line detection and characterization, voltage and current sensing, mid-point high resistance grounding, fault sensing, communications to PSUs, and data link/control to remote nodes. As described herein, the control system 207 may verify cable operation (e.g., verify cable operational integrity) during the Off-time of pulses in the DC pulse power. The pulse power module 206 may include a pulse power modulator, safety circuits, initialization circuits, PMBus, PMBus I2C ($I^2C$ (Inter-Integrated Circuit)), logic, FPGA (Field-Programmable Gate Array), DSP (Digital Signal Processor), or any combination of these or other components configured to perform the functions described herein.

As shown in the example of FIG. 20, the PSUs 205 receive AC power on cables 209 and deliver pulse power on cable 211. In one or more embodiments, the pulse power tap/receiver 212 may combine the phases and deliver high voltage (HV) DC power to the node/endpoint 214 on cable 222. In another embodiment, the pulse power tap/receiver 212 may deliver pulse power to the endpoint 214 on the cable 222. In one or more embodiments, the pulse power cable 211 includes two or more optical fibers for delivering data in the combined power and data cable, as described below. In one example, there may be a dedicated fiber (or fibers) per branch.

The wires within cable 211 may comprise two conductor, twisted pair (with or without shielding), coaxial or triaxial cable, depending on EMC considerations. A separate ground conductor may be provided to address potential common-mode noise issues. It is to be understood that the term wire as used herein may refer to a single wire or a pair of wires. As described below, the power system may comprise any number of wires, which may be bundled with fiber or other communications transmission media.

Power is supplied to the endpoint 214 through the pulse power tap/receiver 212 (also referred to as a branch tap, smart branch tap, receiver/converter). In one or more embodiments, the smart branch taps 212 allow branch fault isolation. The tap/receiver 212 may include, for example, an isolation switch (disconnect switch), data link, and logic/timing controller. The tap/receiver 212 may be used for initializing an auto-negotiation process, fault branch isolation algorithm, power initialization, and faulty PD replacements. The data link over the pulse power wires allows for implementation of the smart branch taps 212 for each node 214 and independent control (disconnect) of each branch for fault isolation or node management.

Each of the endpoints 214 may include an HVDC PSU for powering equipment at the endpoint. The endpoint 214 may comprise, for example, a 56 VDC load and may operate, for example, as a PON (Passive Optical Network) endpoint, 5G node, access point, router, switch, or other type of equipment. The endpoint 214 may also power one or more other nodes (e.g., PoE node, IoT (Internet of Things) device).

It is to be understood that the system shown in FIG. 20 is only an example, and the system may comprise any number of PSUs 205 (e.g., two or more) for providing multi-phase pulse power. The network topology and nodes shown in FIG. 20 is only an example and the network may comprise different topologies and network devices without departing from the scope of the embodiments.

The multiple PSUs allow for multi-phase operation and may also provide redundancy. For example, if one phase is lost in a system comprising three or more phases, continuous power may still be delivered to the PD nodes 214. Each phase is preferably sized to supply higher peak power to maintain full power to the PD nodes 214. Further redundancy may be provided by utilizing N+1 Front End Power (FEP) supplies. For example, in the case of a 1500 W total PD power system, three 1200 W FEPs can power the system with full redundancy of N+N or N+1, with each FEP needing only a common 120V, 15 A feed.

Figure 21:
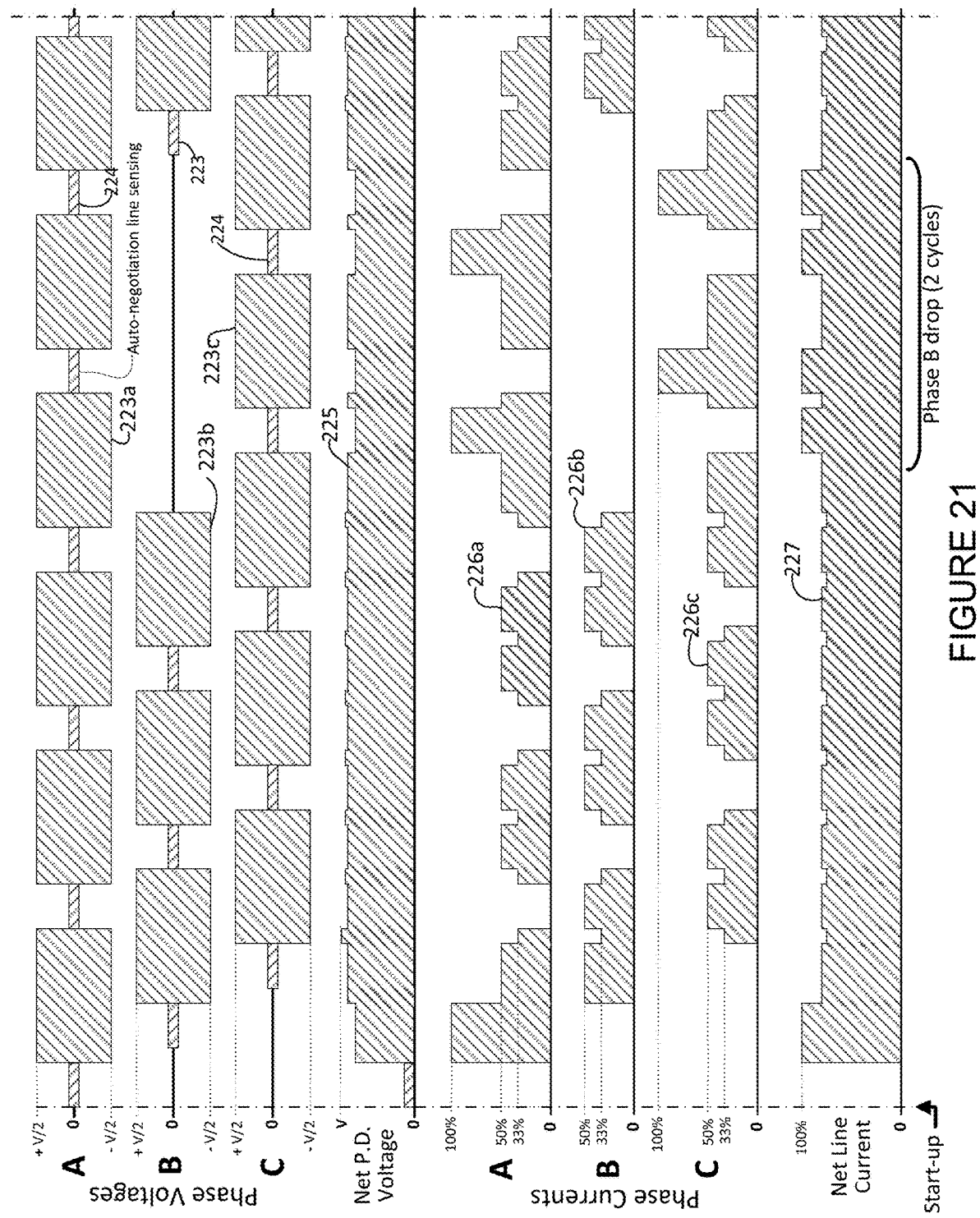
FIG. 21 illustrates an example of three-phase pulse power voltage and current for the system shown in FIG. 20 with constant power loading from endpoint nodes.

As shown in FIG. 21 and described below, the multi-phase pulse power comprises a plurality of sequences of voltage pulses, each sequence of voltage pulses forming a phase of the multi-phase pulse power. FIG. 21 illustrates an example of 3-phase pulse power voltage and current with a 75% duty cycle with phase drop, delivered in the system shown in FIG. 20, for example. Idealized waveforms are shown and net PD voltage and line current include line loss effect with constant power loading from the nodes/endpoints 214. In the example shown in FIG. 21, phase B drops out for two cycles. The three phase voltages (A, B, and C) (223*a*, 223*b*, 223*c*) are shown with auto-negotiation line sensing 224.

As shown in FIG. 21, during pulse On-time high voltage power is delivered from the PSE to the PDs and during pulse Off-time while the high voltage power is off, a low voltage may be applied on each phase for use in low voltage sensing (indicated at 224) to check wire integrity.

The net PD voltage is shown combined for the three phase voltages at 225. The corresponding phase currents (A, B, C) (226*a*, 226*b*, 226*c*) are shown below the voltages. The net line current corresponding to the three phase currents is shown at 227. As shown in FIG. 21, if one phase is lost (as shown at phase B drop), continuous power is still delivered to the PD nodes. Each phase may be sized to supply higher peak power to maintain full power to the PDs.

As shown in FIG. 21, two or more transmission wires (e.g., wires or wire pairs) enable phasing of the conduction on each wire (e.g., wire or pair) so that at least one wire is ON at any time. When OR'd at the PD, the result is continuous DC voltage as shown at 225, thereby eliminating the need for bulky filter components. During phase overlap in the multi-phase systems, the total cable current is shared across all ON wires. Individual transmission wire current is proportionally reduced, lowering total transmission cable losses.

In one or more embodiments, the Off-time may be fixed, based on worst case cable length and characteristics or actively controlled based on detected cable characterization (for higher efficiency/longer range). The On-time (power delivery) for each phase may be fixed based on total pulse power voltage and shock hazard limits based on appropriate body resistance data. This approach may be used to achieve maximum pulse overlap, thereby reducing cable RMS current and maximizing power transmission distance (or minimizing conductor wire size).

As previously noted, idealized waveforms are shown in FIG. 21. Inductance in the PSE 200, cable 211, and PD receiver 212 may create some averaging of cable currents, raising overlap currents and lowering current during pulse Off-time (FIG. 20). This effect may vary with cable length and type (inductance). Phase currents shown in FIG. 21.

As shown in FIG. 21, each of the phases are offset from one another (phase shifted duty cycle) and provides pulse power comprising on-pulses and an off-pulses. The off-pulse may be a small voltage (e.g., close to 0V, 3V), or any value that is significantly less than the on-pulse power (e.g., at least 170V difference between power levels for on-pulse and off-pulse). As previously described, the on-pulse time and off-pulse time (pulse width, pulse duty cycle) may be selected based on system design (e.g., number of phases, amount of power delivered) and safety requirements. The pulse duty cycle may also vary between an initialization phase, synchronization phase, testing phase, or normal operation. In one example, a startup duty cycle may comprise 8 ms on-pulse and 4 ms off-pulse for a 12 ms time period. In another example, the on-pulse may be only 0.5 ms or 1 ms during high voltage initialization. In one example, the off-pulse may be 1 ms, which includes a resistance analysis and auto-negotiation time of 100 μs, as described in U.S. patent application Ser. No. 15/971,729, referenced above. In another example, a 2 ms to 4 ms off-pulse (between power pulses) may be needed to properly assess environmental safety within a 10 ms time window.

In one or more embodiments, a central controller at the PSE may coordinate offset between phases and adapt pulse width for optimization (or following loss of a phase as needed). Any changes in pulse timing are communicated to the PD for synchronization.

It is to be understood that the currents, voltages, pulse widths, duty cycles, and phase overlaps shown in FIG. 21 and described above are only examples and may be different than shown or described herein. For example, there may be a higher pulse current during overlap and lower current during non-overlap. The differences may be dependent on pulse power transmission inductance and capacitance (e.g., length of run or type of cable), for example.

As previously noted, the multi-phase pulse power system may comprise two or more wires or wire pairs. It is to be understood that the multi-phase system described herein may be implemented on systems comprising a different number of wires or wire pairs and the three phase system shown in FIGS. 20 and 21 is only an example. The pulse power system may operate with any number of phases (e.g., two, three, four, etc.), without departing from the scope of the embodiments. Also, as previously described, the cable may include any number of optical fibers or additional copper wires for data transmission. In one or more embodiments, the cable may also carry cooling, as previously described.

Figure 22:
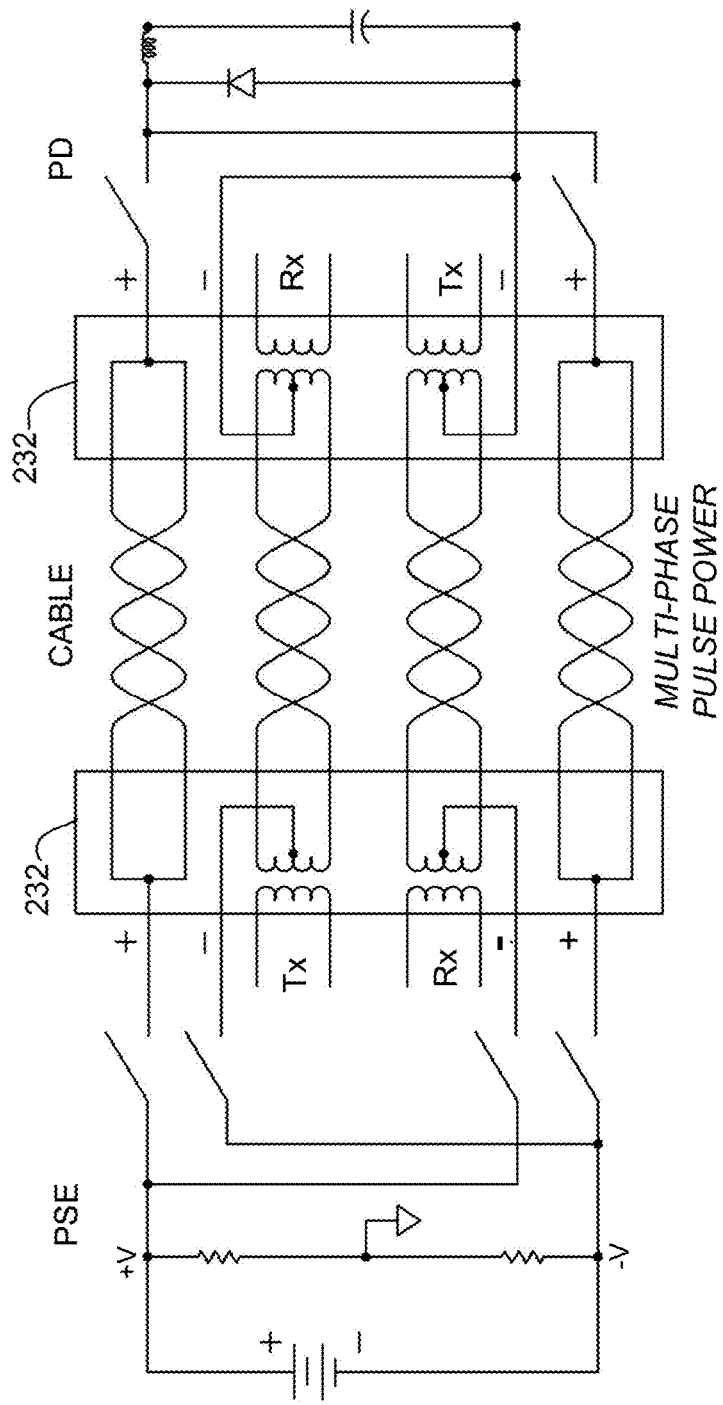
FIG. 22 illustrates a simplified circuit of a two-phase pulse power system on a cable with four-pair wire, in accordance with one embodiment.

FIG. 22 is a simplified circuit of a multi-phase power system for delivery of safe power at higher power levels that conventional PoE, in accordance with one embodiment. The PSE is coupled to the PD through a four-pair cable with connectors 232 (e.g., RJ-45 or modified RJ-45). In one example 56V 2-phase ESP may be used to provide approximately one and a half times more current and power than conventional PoE. In another example 112V 2-phase ESP may be used to provide approximately three times more current and power than 56 VDC PoE. In yet another example, 150V 2-phase ESP provides approximately four times more current and power than 56 VDC PoE.

Figure 23:
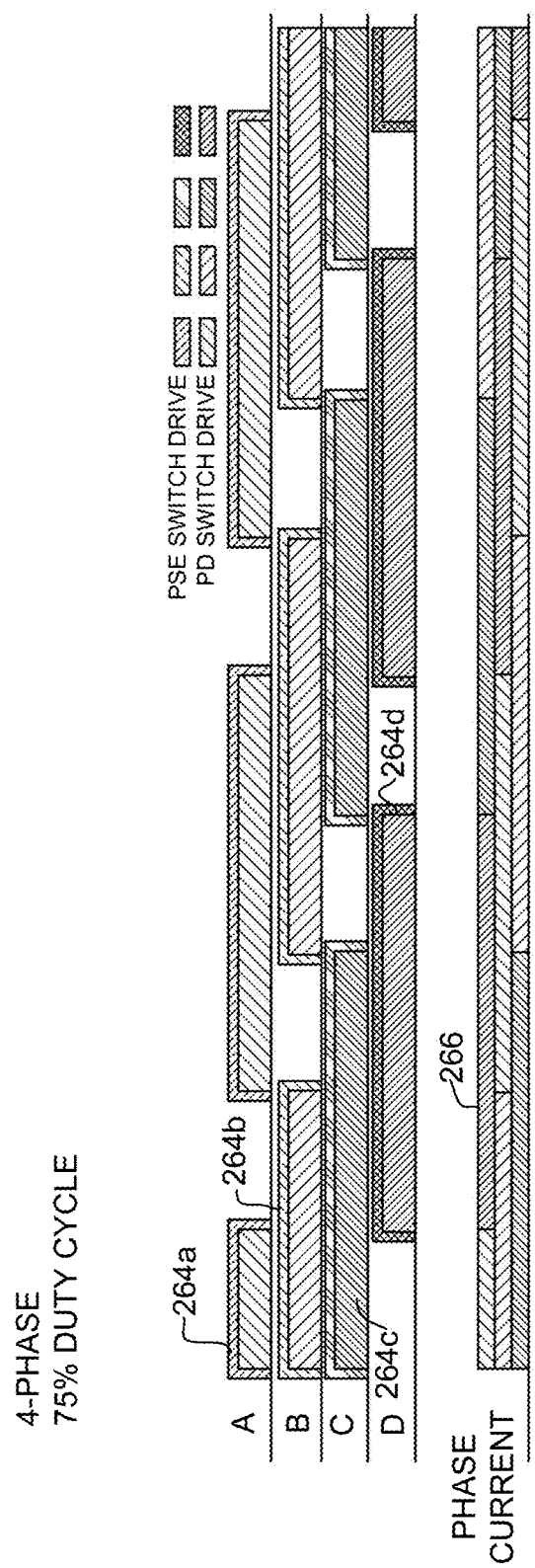
FIG. 23 illustrates synchronization of power sourcing equipment and powered device modulator switches in a four-phase pulse power system.
Figure 24:
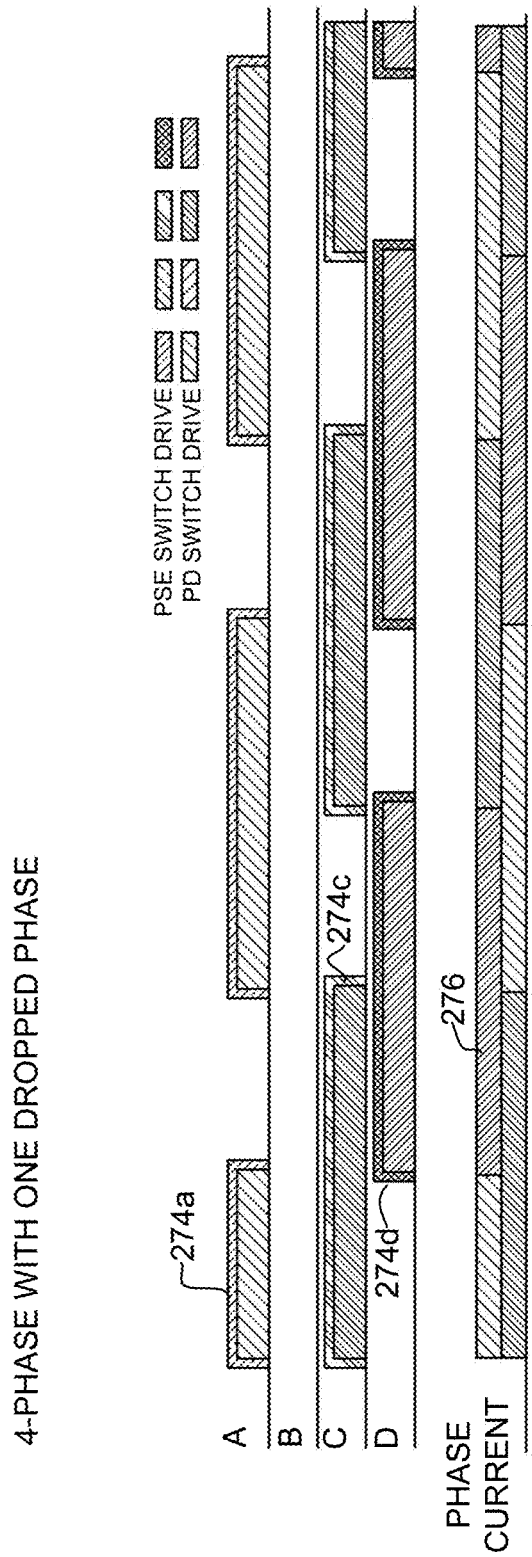
FIG. 24 shows the four-phase pulse power system of FIG. 23 with one phase dropped.

As previously described, PD and PSE modulators may be synchronized during low voltage or high voltage initialization or during high power operation for each phase in a multi-phase system. In one or more embodiments, PSE and PD modulator (control) switches (described above) may include timing control such that a PSE pulse is turned on before a PD modulator switch is turned on, and PD modulator switch is turned off before the PSE modulator switch is turned off for each pulse, as shown in FIGS. 23 and 24. This may be used to minimize transients on the distribution system, thereby reducing EMI and producing cleaner current waveforms for more accurate current detection.

FIGS. 23 and 24 illustrate simplified voltage waveforms and phase current in a four phase system, in accordance with one embodiment. FIG. 23 illustrates four phase 75% duty cycle operation. Voltage pulses are shown at 264*a* for phase A, 264*b* for phase B, 264*c* for phase C, and 264*d* for phase D. The cumulative phase current is shown at 266. As shown in FIG. 23, the PSE switch drive is turned on before the PD switch drive at the start of the pulse and at the end of the pulse on interval, the PD switch drive is turned off before the PSE switch drive for each phase.

FIG. 24 illustrates operation with one dropped phase (phase B). Voltage pulses are shown at 274*a* for phase A, 274*c* for phase C, and 274*d* for phase D. The cumulative phase current is shown at 276. As can be seen in FIG. 24, continuous power is still provided, even with loss of phase B by adjusting the relative time of the three functional phases.

As previously discussed with respect to FIGS. 1, 17, and 20, the PSE and PD may communicate in networks comprising various topologies (number and arrangement of PSEs and PDs). The extended safe power (ESP) system described herein may comprise, for example, one or more PSE nodes and one or more PD nodes in a point-to-point topology, daisy chain topology, multi-drop topology, hybrid multi-drop/daisy chain topology, or any combination thereof.

Figure 25:
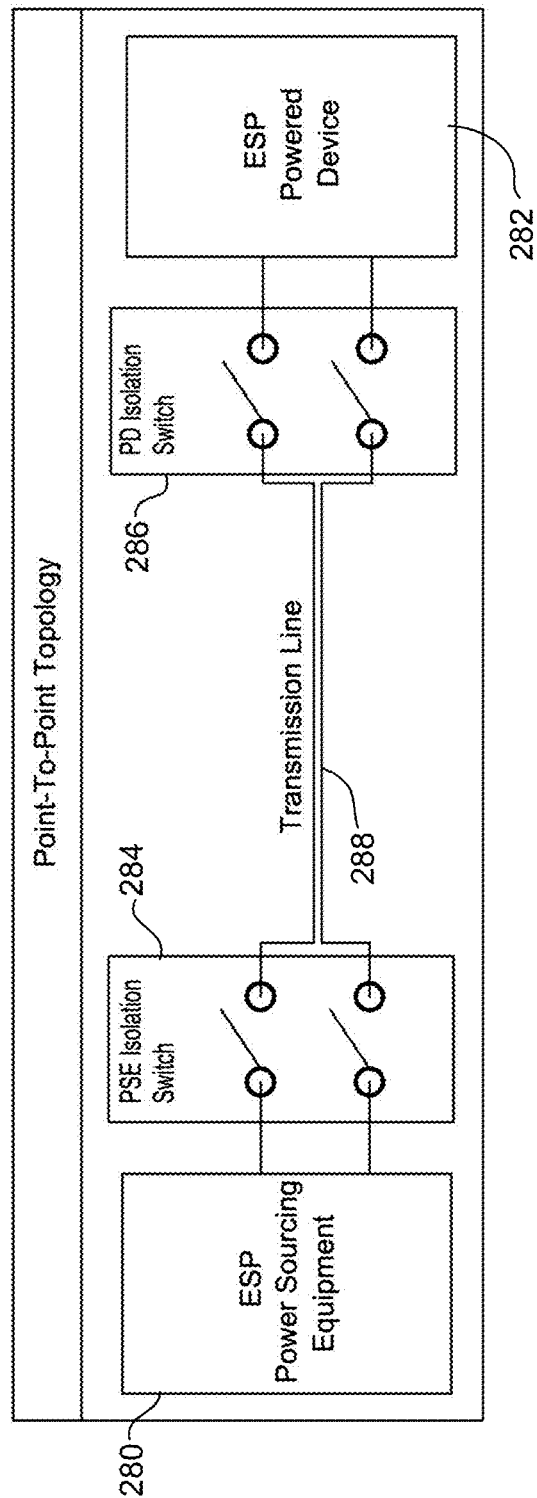
FIG. 25 is a block diagram illustrating a point-to-point topology, in accordance with one embodiment.

FIG. 25 is a simplified block diagram illustrating an ESP PSE node 280 in communication with an ESP PD node 282 in a point-to-point topology. The PSE node 280 includes a PSE isolation switch 284 and the PD node includes a PD isolation switch 286 in communication over a transmission line 288. The isolation switches 284, 286 isolate the device during initialization, synchronization, and testing as described below. The point-to-point topology is shown in the simplified circuits described above with respect to FIGS. 8-16 and 18-19.

Figure 26:
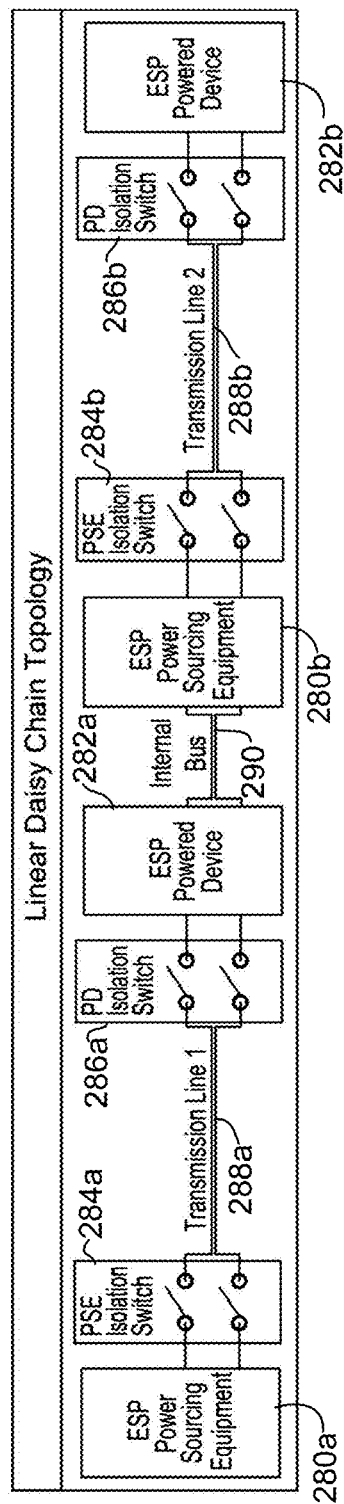
FIG. 26 is a block diagram illustrating a daisy chain topology, in accordance with one embodiment.

FIG. 26 is a simplified block diagram illustrating a PSE 280*a* in communication with a PD 282*a* via a first transmission line 288*a*. The PD 282*a* is also in communication with a downstream PSE node 280*b* through an internal bus 290. The PSE node 280*b* delivers power to another PD 282*b* through a second transmission line 288*b*. The PD 282*a* and PSE 280*b* may be located at the same network device and coupled through the internal bus 290. The first PSE 280*a* performs initialization, synchronization, and safety tests with the first PD 282*a*. The second PSE 280*b* performs initialization, synchronization, and safety tests with the second PD 282*b*.

Figure 27:
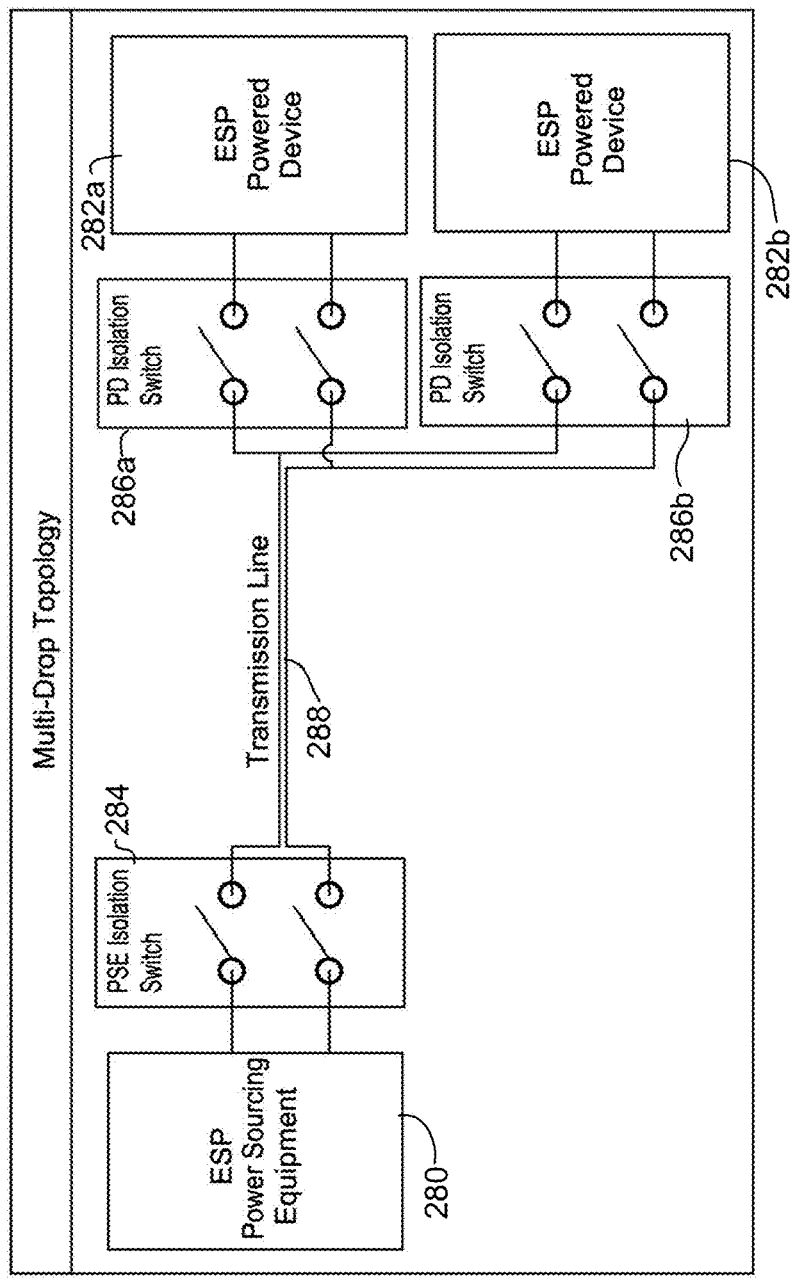
FIG. 27 is a block diagram illustrating a multi-drop topology, in accordance with one embodiment.

FIG. 27 illustrates an example of a multi-drop topology. PSE 280 is in communication with two PDs 282*a*, 282*b* via transmission line 288. PSE 280 includes isolation switch 284 and each PD includes its own isolation switch 286*a*, 286*b*.

Figure 28:
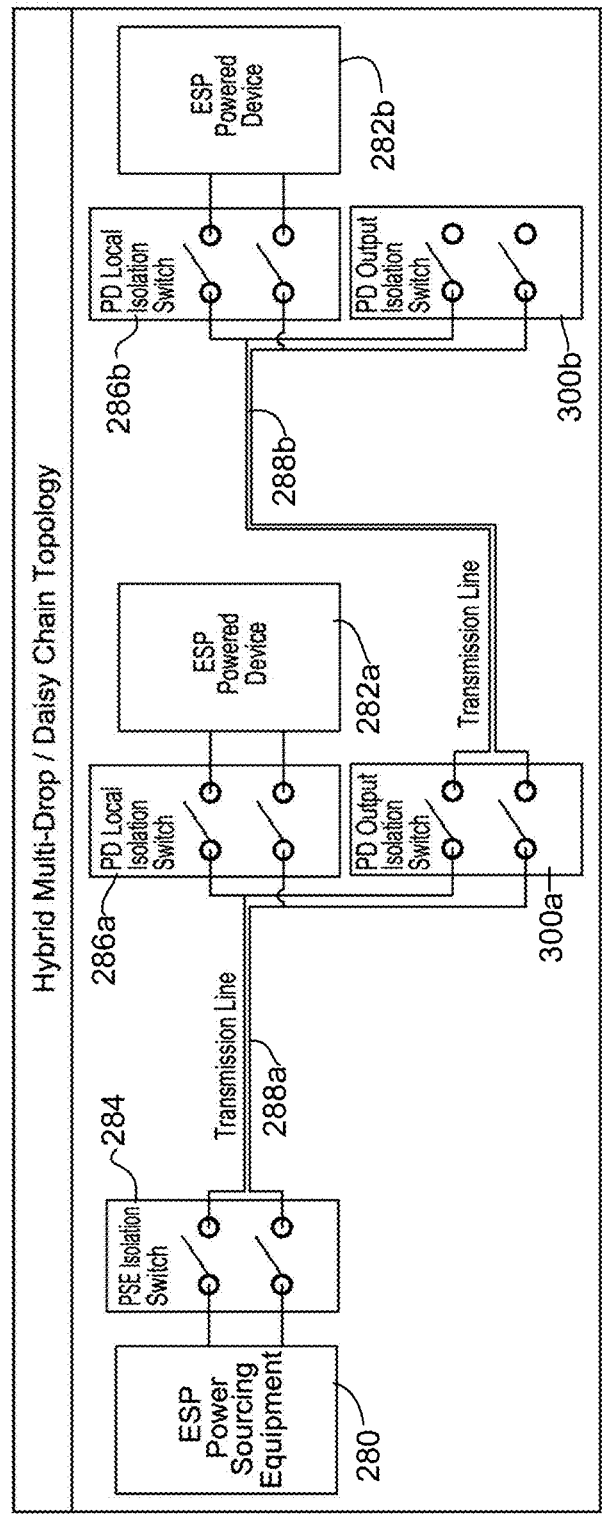
FIG. 28 is a block diagram illustrating a hybrid multi-drop/daisy chain topology, in accordance with one embodiment.

FIG. 28 illustrates a hybrid multi-drop/daisy chain topology, in accordance with one embodiment. The PSE 280 and PSE isolation switch 284 are coupled to a first PD 282*a* through transmission line 288*a*. PD 282*a* includes a local isolation switch 286*a* and an output isolation switch 300*a*, which may communicate with downstream PD 282*b* via transmission line 288*b*. As described in detail below, the PSE 280 performs safety checks and synchronizes with the first PD 282*a* through the local isolation switch 286*a*. When the second PD 282*b* is connected to the network, the PD performs initialization and synchronization with the first PD 282*a* and after safety checks are passed, receives high voltage pulse power through the output isolation switch 300*a* at the first powered device 282*a* via transmission line 288*b*. This arrangement provides one transmission line for the PSE to monitor as in the multi-drop case, with downstream enrollment controlled by the PD as in the daisy chain case, but using a subset of the PSE's functionality.

Details of an initialization process for the PSE and PDs in the hybrid multi-drop/daisy chain topology (FIG. 28) are described below with respect to FIGS. 29-40, in accordance with one embodiment. As described below, the PSE and PD nodes operate in a hybrid multi-drop daisy chain topology due to functionality within the PD that allows it to internally perform functions typically performed by the PSE (e.g., low voltage initialization). However, from a network device topology perspective (i.e., looking only at the external network device and links), the PSE and PDs form a daisy chain topology (transmission line passes through first PD and directly to second PD).

It is to be understood that while FIGS. 25-40 illustrate only a single phase and the initialization process described below is for the single phase for simplification, the process described herein may be repeated for each phase in a multi-phase system. For example, the transmission line 288 may comprise multiple wire pairs for multi-phase operation and the process described herein may be performed for each phase in the multi-phase system.

Figure 36:
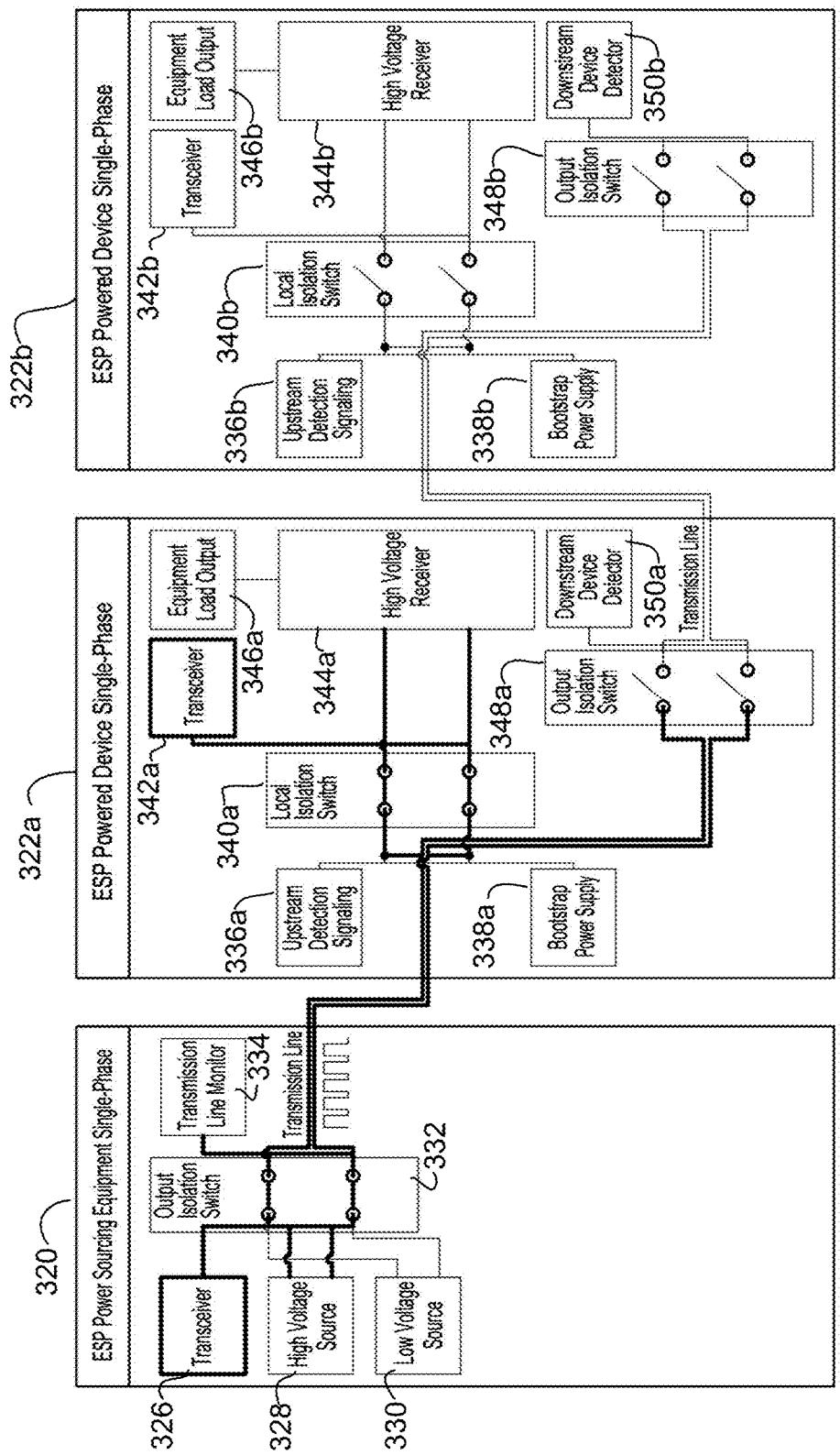
FIG. 36 shows the power sourcing equipment establishing communications with the first powered device.
Figure 37:
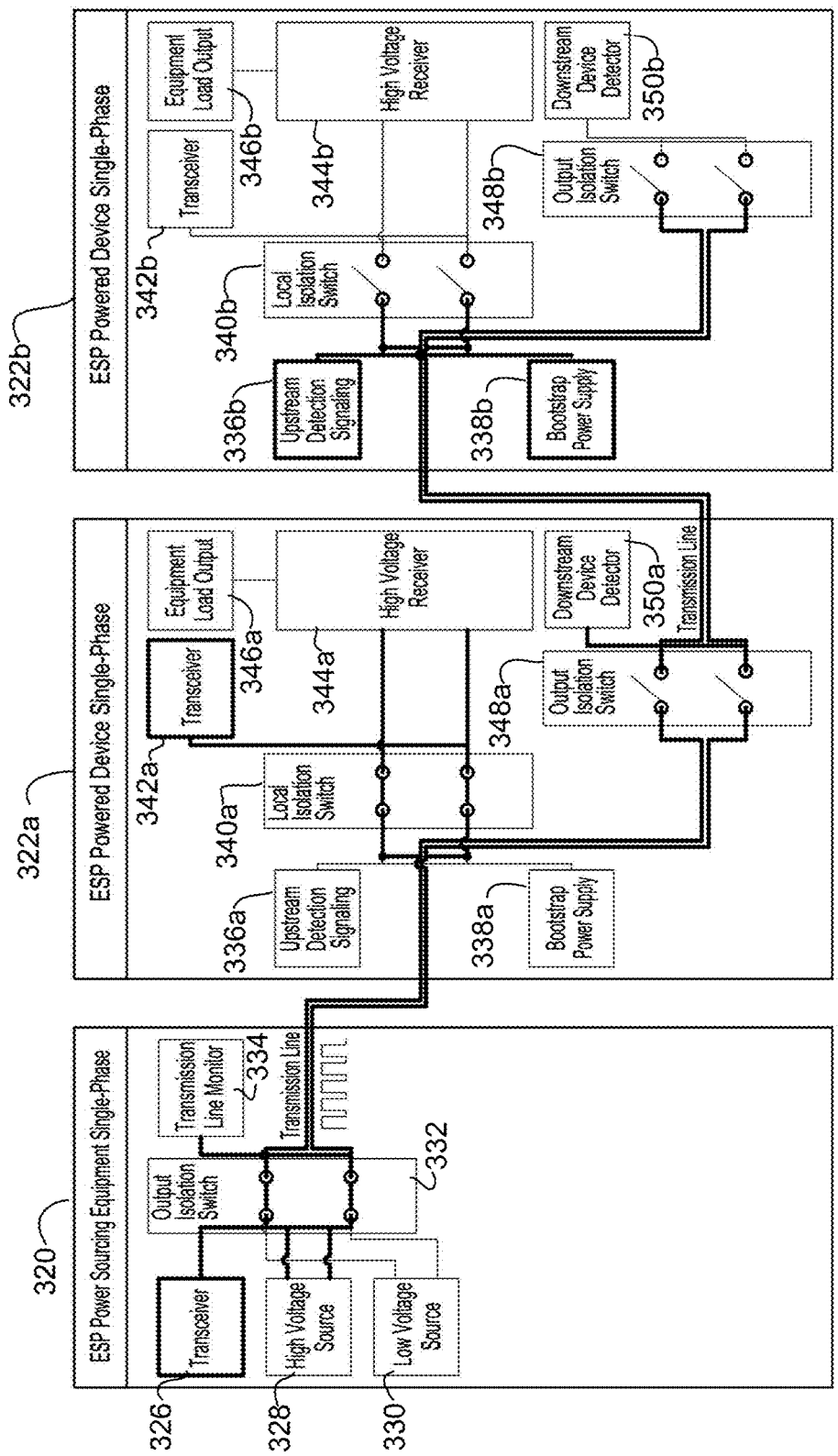
FIG. 37 shows detection of a second powered device at the first powered device and initialization of the second powered device.

In one or more embodiments, a first powered device 322*a* in communication with power sourcing equipment 320 identifies a second powered device 322*b* in communication with the first powered device, while the first powered device is receiving high voltage pulse power from the power sourcing equipment (FIG. 37). The first powered device 322*a* previously performed a (first) low voltage initialization with the power sourcing equipment before receiving the high voltage pulse power (FIGS. 30-36). The first powered device 322*a* notifies the power sourcing equipment 320 of the second powered device 322*b* and performs low voltage power initialization with the second powered device before passing the high voltage pulse power to the second powered device 322*b* (FIGS. 37-40).

Figure 29:
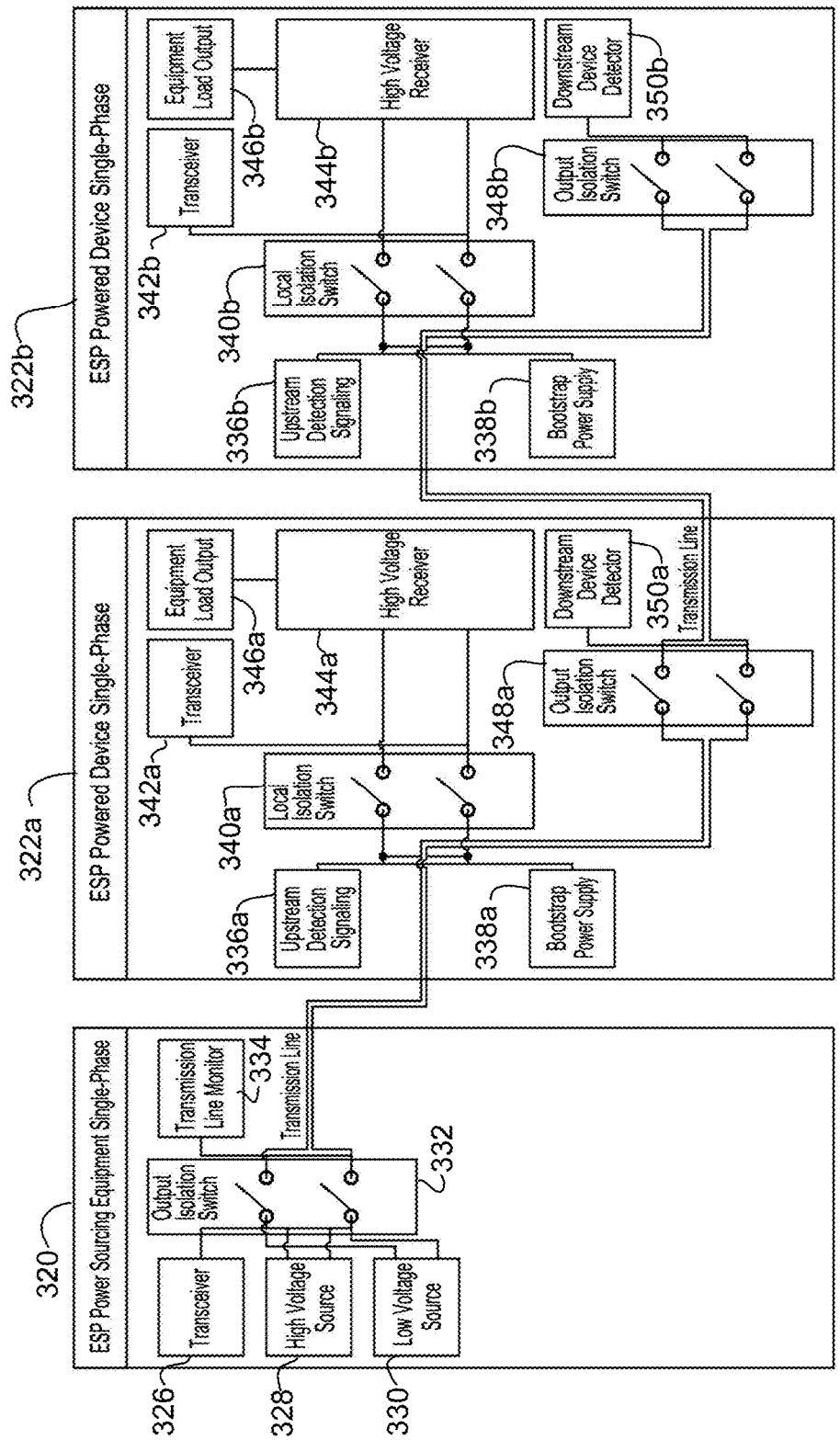
FIG. 29 is a block diagram illustrating power sourcing equipment and two powered devices in a hybrid multi-drop/daisy chain topology in a powered off state, in accordance with one embodiment.

Referring now to FIG. 29, a block diagram of a hybrid multi-drop/daisy chain topology is shown. In this example, the PSE 320 is connected to the first PD 322*a*, which is connected to the second PD 322*b*. The PSE 320 includes a transceiver 326, high voltage source 328, low voltage source 330, and transmission line monitor 334 in communication with an output isolation switch 332. Each PD 322*a*, 322*b* includes upstream detection signaling 336*a*, 336*b*, bootstrap power supply 338*a*, 338*b* (e.g., housekeeping power circuit described above), and a transceiver 342*a*, 342*b* in communication with a local isolation switch 340*a*, 340*b*. Each PD 322*a*, 322*b* further includes a high voltage receiver 344*a*, 344*b* in communication with equipment load output 346*a*, 346*b*. The first PD 322*a* includes an output isolation switch 348*a* for communication with the second PD 322*b*. In this example, the second PD 322*b* also includes an output isolation switch 348*b* for providing power and data to another downstream PD (using downstream device detector 350*b*), however, the PD 322*b* may also be configured without the output isolation switch and downstream detector for operation as an endpoint with no pass through capability. In the example shown in FIG. 29, the PSE 320 and PD nodes 322*a*, 322*b* are all in a powered off state with the isolation switch at the PSE in an open position.

Figure 30:
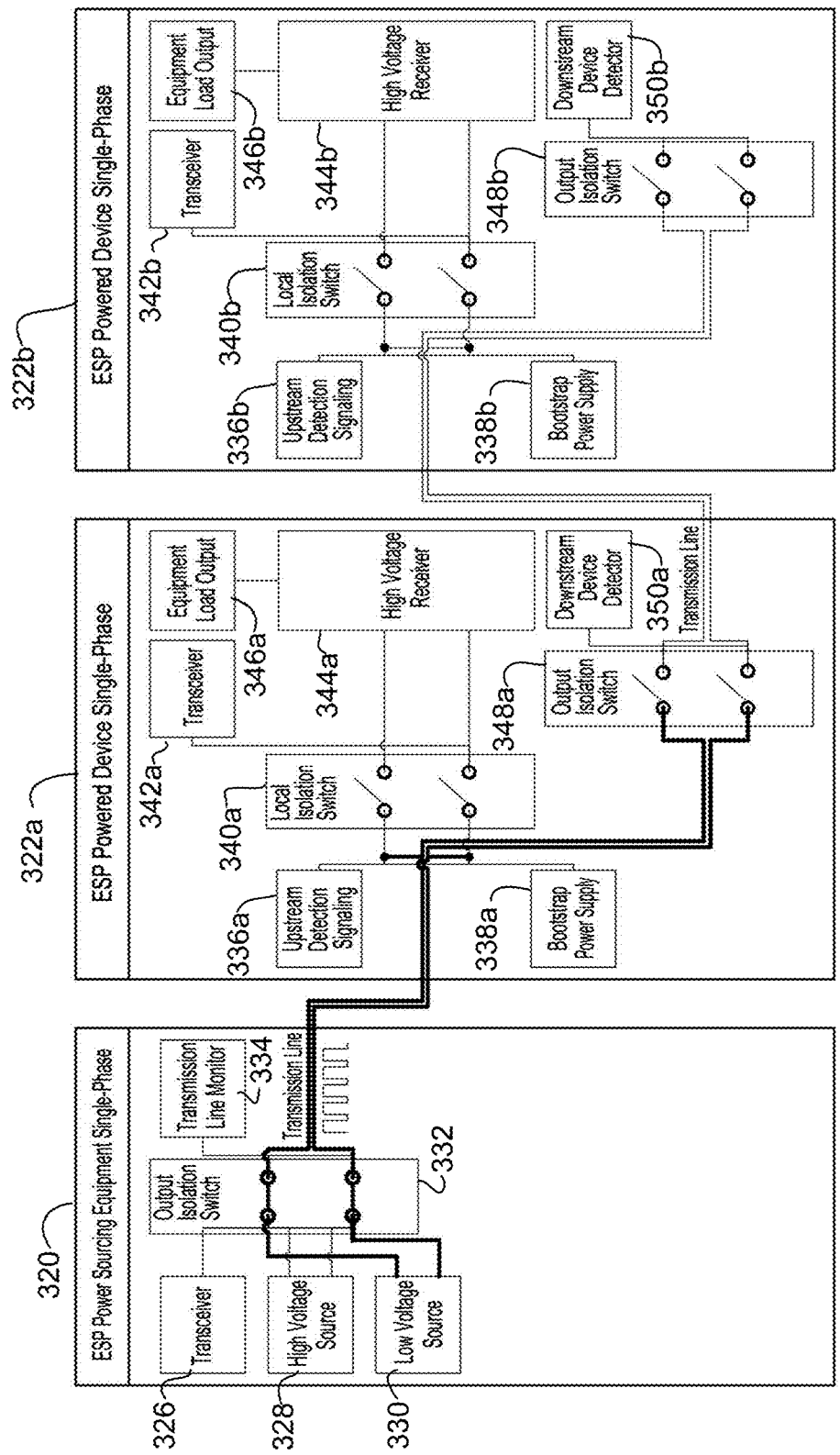
FIG. 30 shows the power sourcing equipment and powered devices of FIG. 29 during power sourcing equipment detection of a first powered device.

FIG. 30 illustrates PSE detection and transmission line discovery for the first PD 322*a*. In this example, the PSE powers up (output isolation switch 332 closed) and begins sending low voltage pulse power (a low voltage detection pulse train) and gathers transmission line parameters (e.g., capacitance). The PSE 320 may perform a capacitance test on the cable between the PSE and PD as previously described.

Figure 31:
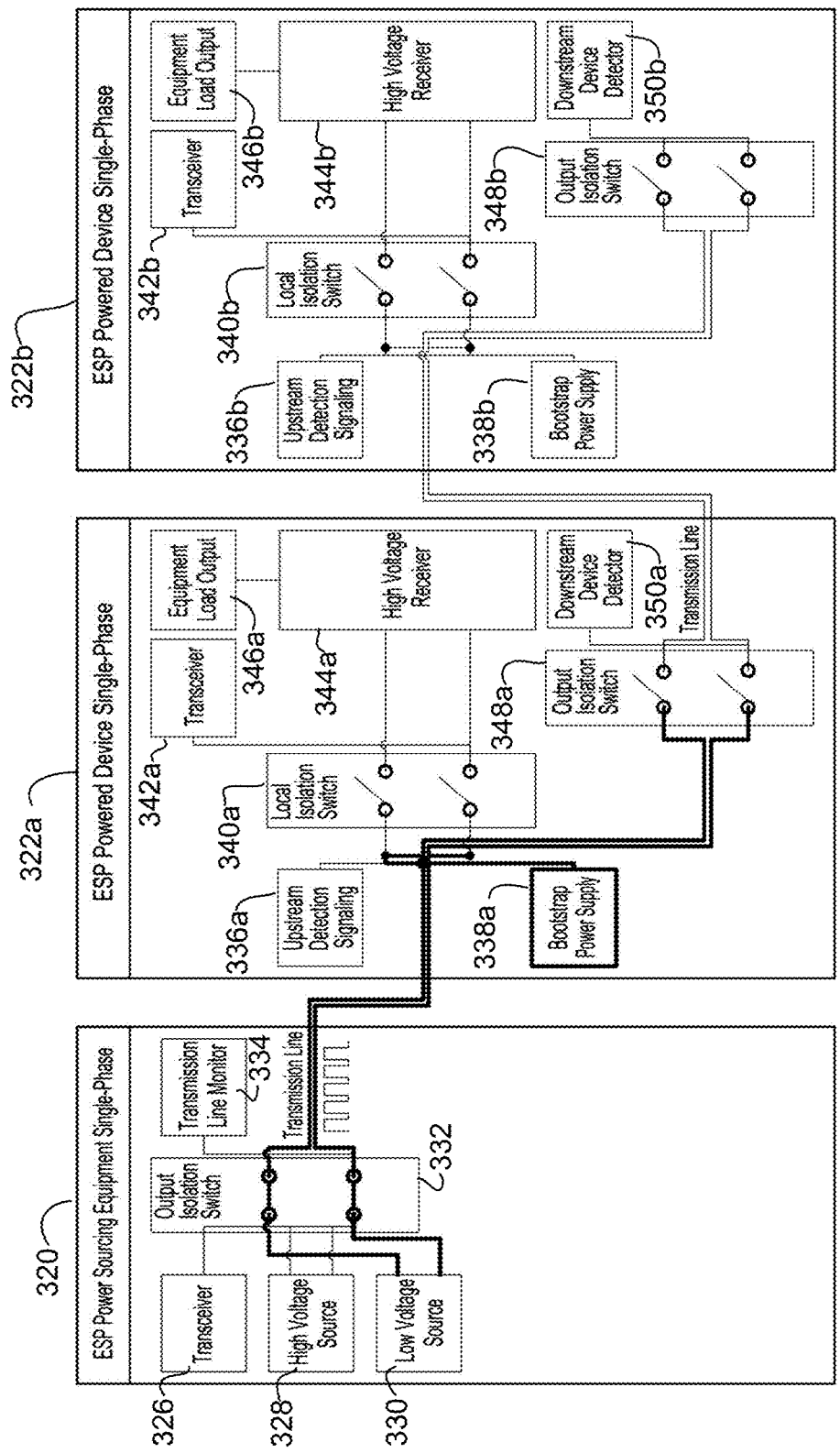
FIG. 31 shows the power sourcing equipment and powered devices of FIG. 29 during power up of the first powered device.

FIG. 31 illustrates the first PD 322*a* bringing up power. The PD 322*a* powers up by charging local energy storage (bootstrap power supply 338*a*), which powers up the PD controller.

Figure 32:
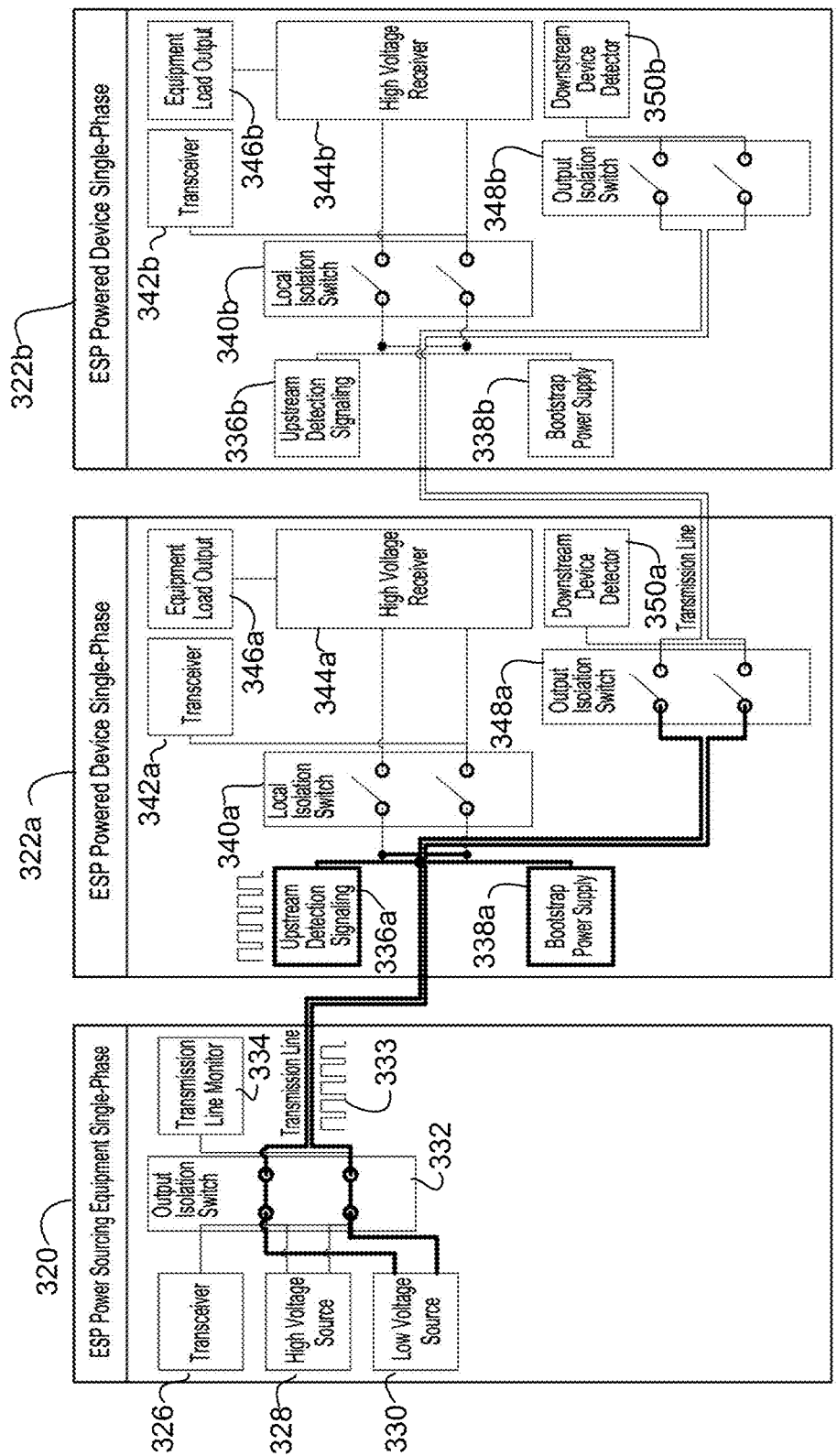
FIG. 32 shows a training phase for the first powered device.

FIG. 32 illustrates a PD training phase. The PD 322*a* recovers timing parameters (frequency, phase) from the PSE's low voltage pulse train (waveform 333 of the low voltage pulse power) and uses this for the PD isolation switch gate drive waveform to synchronize the PSE and PD modulator switches (described above with respect to FIG. 4).

Figure 33:
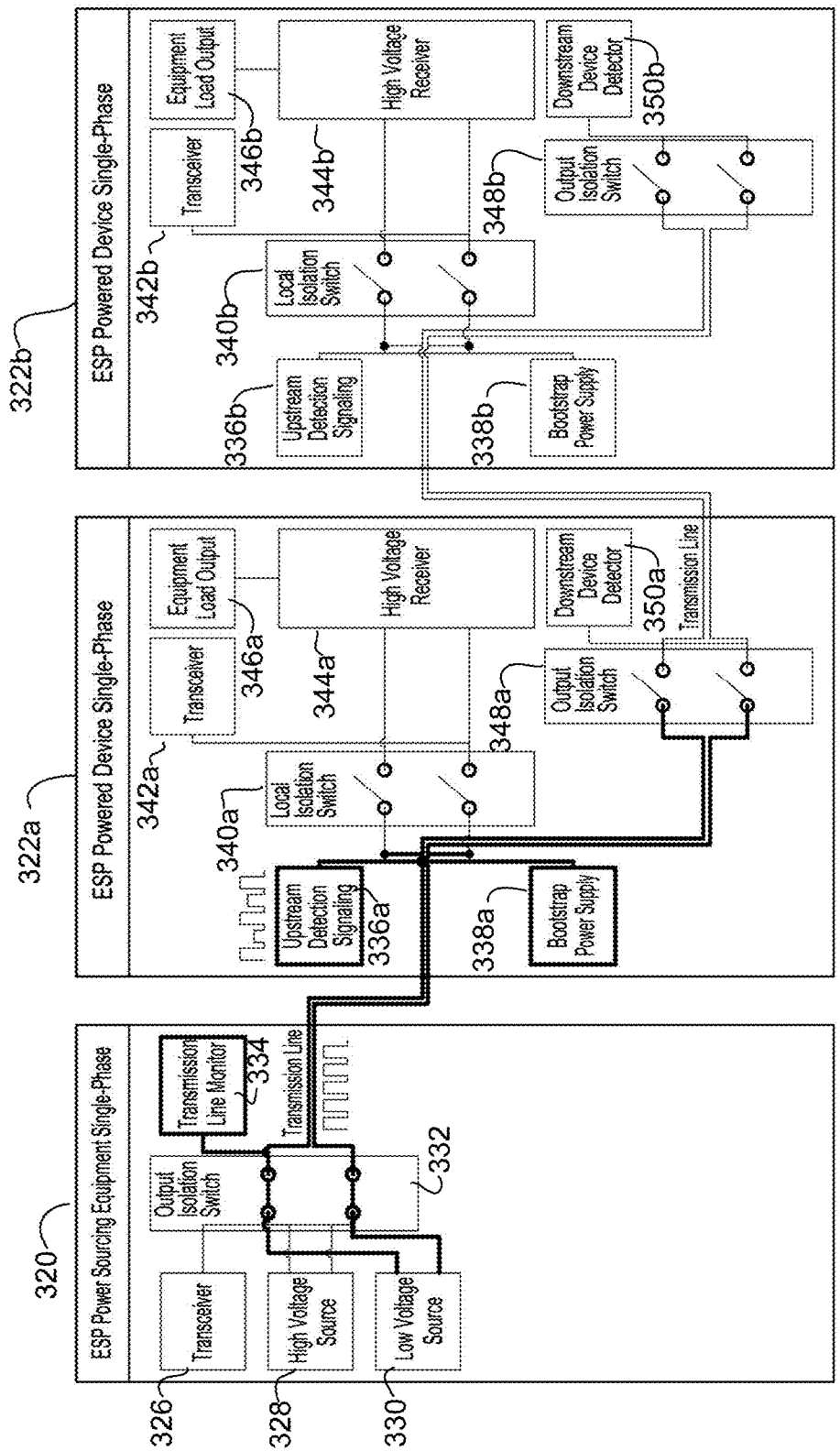
FIG. 33 shows an identification phase for the first powered device.

FIG. 33 illustrates an identification phase for the PD 322*a*. As shown at upstream detection signaling module 336*a*, the PD 322*a* may send identification data through modulation of load current while receiving the low voltage pulse train. The identification data is received at the transmission line monitor 334 at the PSE 320.

Figure 34:
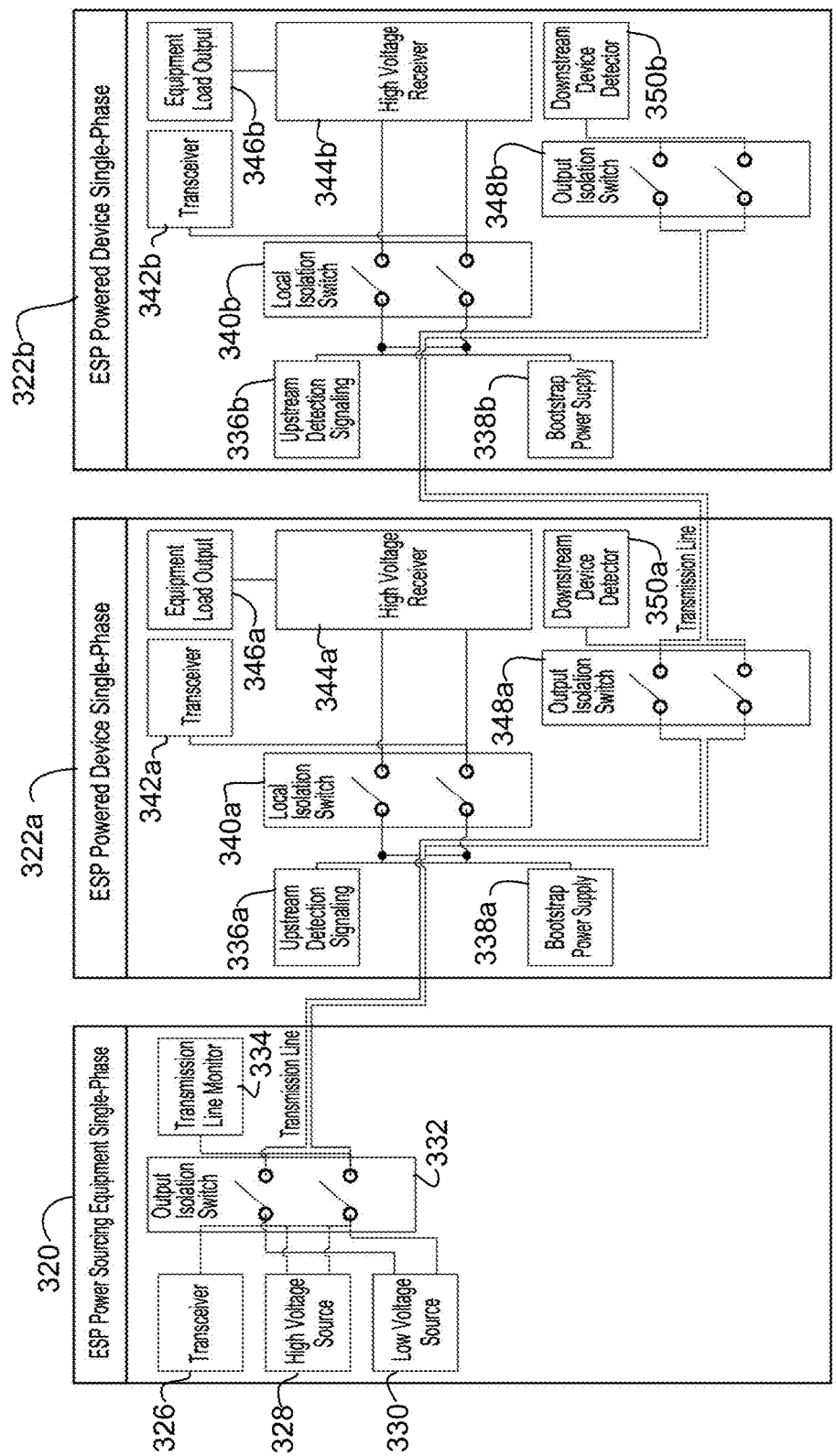
FIG. 34 shows a final safety check before enabling high voltage pulse power at the power sourcing equipment.

FIG. 34 illustrates a final PSE safety check in which the PSE 320 isolates the transmission line after disconnecting the low voltage source 330.

Figure 35:
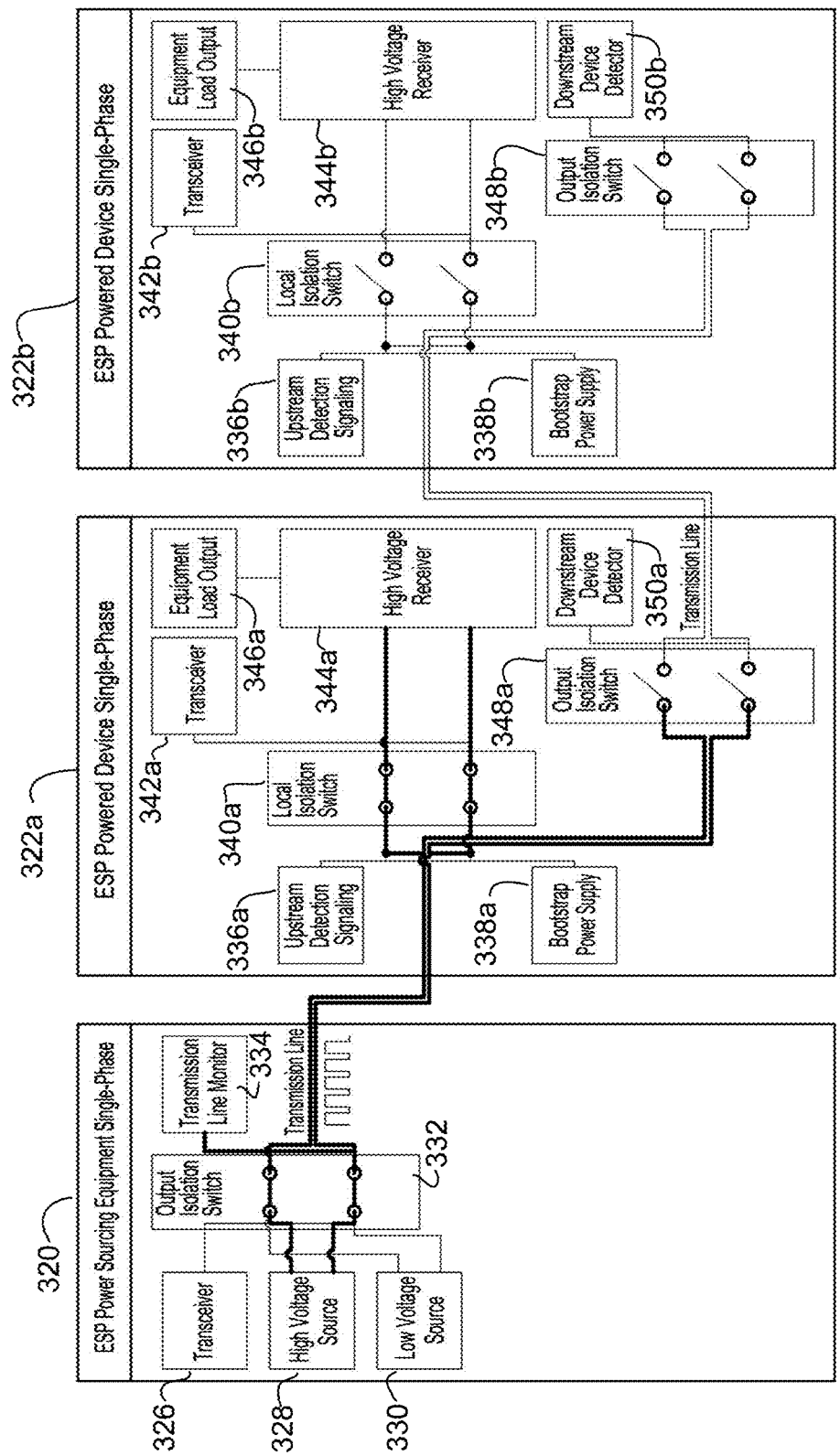
FIG. 35 shows the power sourcing equipment transmitting high voltage pulse power to the first powered device.

High voltage operation is enabled at the PSE 320 as shown in FIG. 35. The PSE 320 shifts from PD gate drive low voltage pulse train at low voltage source 330 to high voltage pulse train at high voltage source 328 with no frequency or phase shift. The high voltage source 328 at the PSE 320 is now connected to the transmission line through output isolation switch 332 and the high voltage pulse power is transmitted to the high voltage receiver 344a through local isolation switch 340a at the first PD 322a.

FIG. 36 illustrates PSE-PD communications link up. The transceiver 326 at the PSE 320 establishes communications with the PD 322a at transceiver 342a. The PSE 320 and PD 322a use the communications link to continue negotiation, set power limits, send telemetry, etc.

FIG. 37 illustrates downstream detection of the second PD 322b at the first PD 322a. As previously described, the first PD 322a has already performed a first low power voltage initialization with the PSE 320 through use of its local isolation switch 340a and is now receiving high voltage pulse power at this local isolation switch. The first PD 322a detects and then notifies the PSE 320 of the incoming PD (second PD) 322b. The PD 322a may also notify the PSE 320 of any necessary timing adjustments due to line capacitance change. If there are any timing changes, the PSE 320 and PD 322a may re-synchronize, as needed. Downstream device classification and synchronization is then performed for the PD 322b. The first PD 322a performs a low voltage synchronization and classification operation with the second PD 322b using a reduced PSE capability inside of the first PDs controller. The low voltage power received at the second PD 322b is used to charge bootstrap power supply 338b and power up the PD controller (upstream detection signaling 336b).

Figure 38:
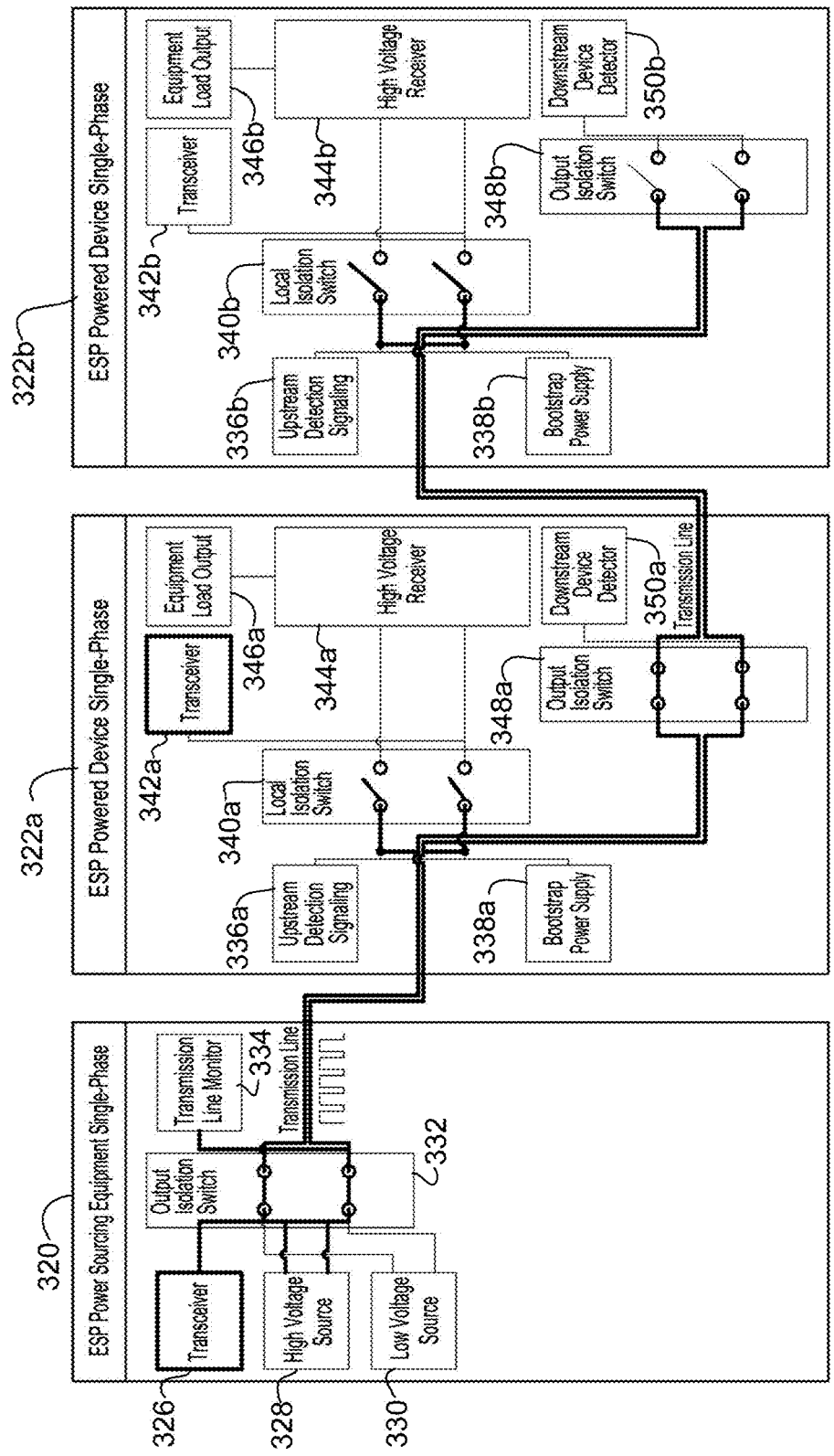
FIG. 38 shows a safety check by the power sourcing equipment for the second powered device and transmission line.

FIG. 38 illustrates a downstream device safety check. The output isolation switch 348 at the first PD 322a is closed and a safety check is performed at the PSE 320 for the entire transmission line to the isolation switches 340b, 348b at the second PD 322b.

Figure 39:
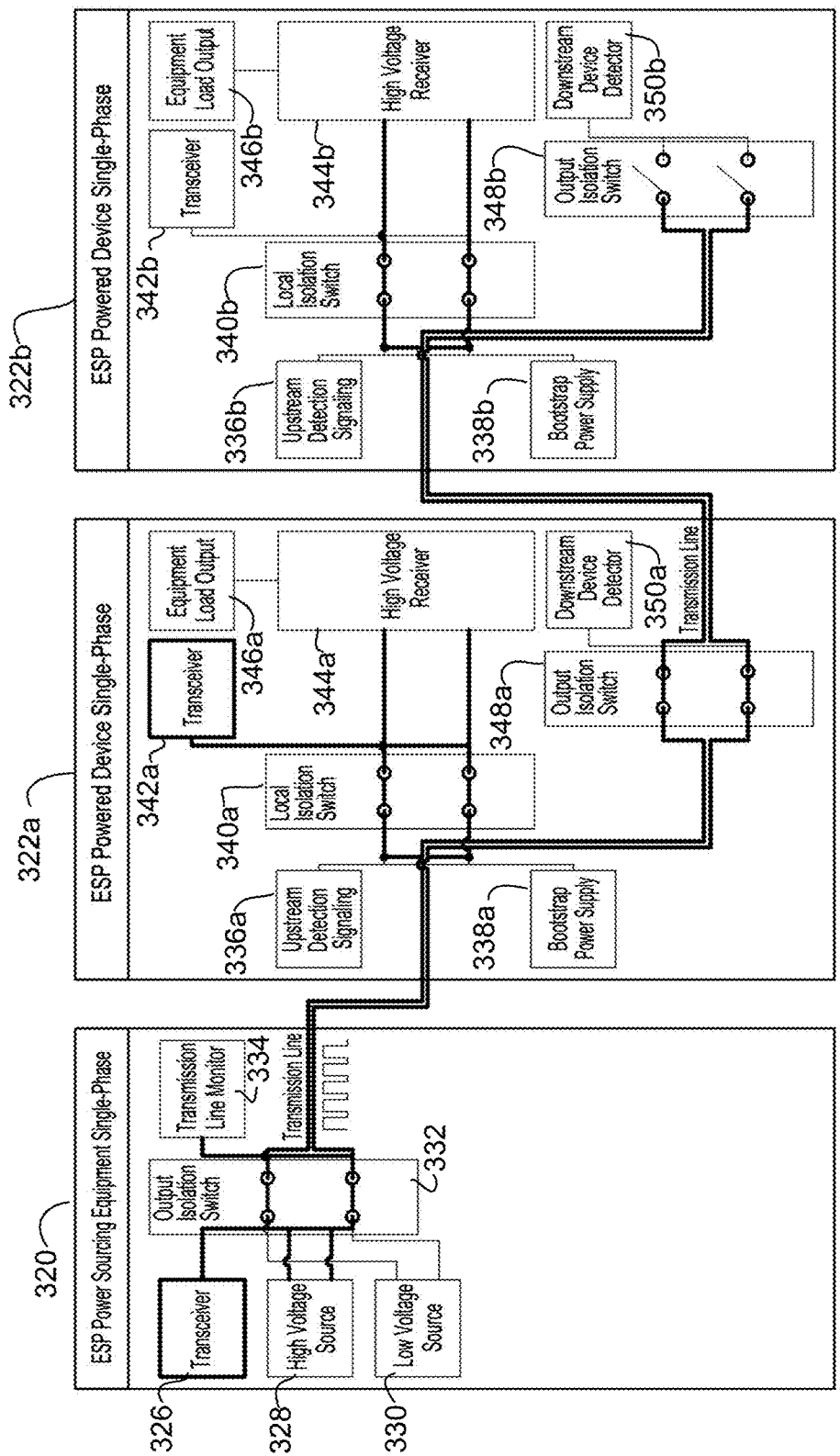
FIG. 39 shows the power sourcing equipment transmitting high voltage pulse power to both powered devices.

As shown at FIG. 39, if the safety check passes, high voltage pulse power is transmitted to the high voltage receiver 344b at the second PD 322b through the first PD 322a and delivery of high voltage pulse power continues with the added node.

Figure 40:
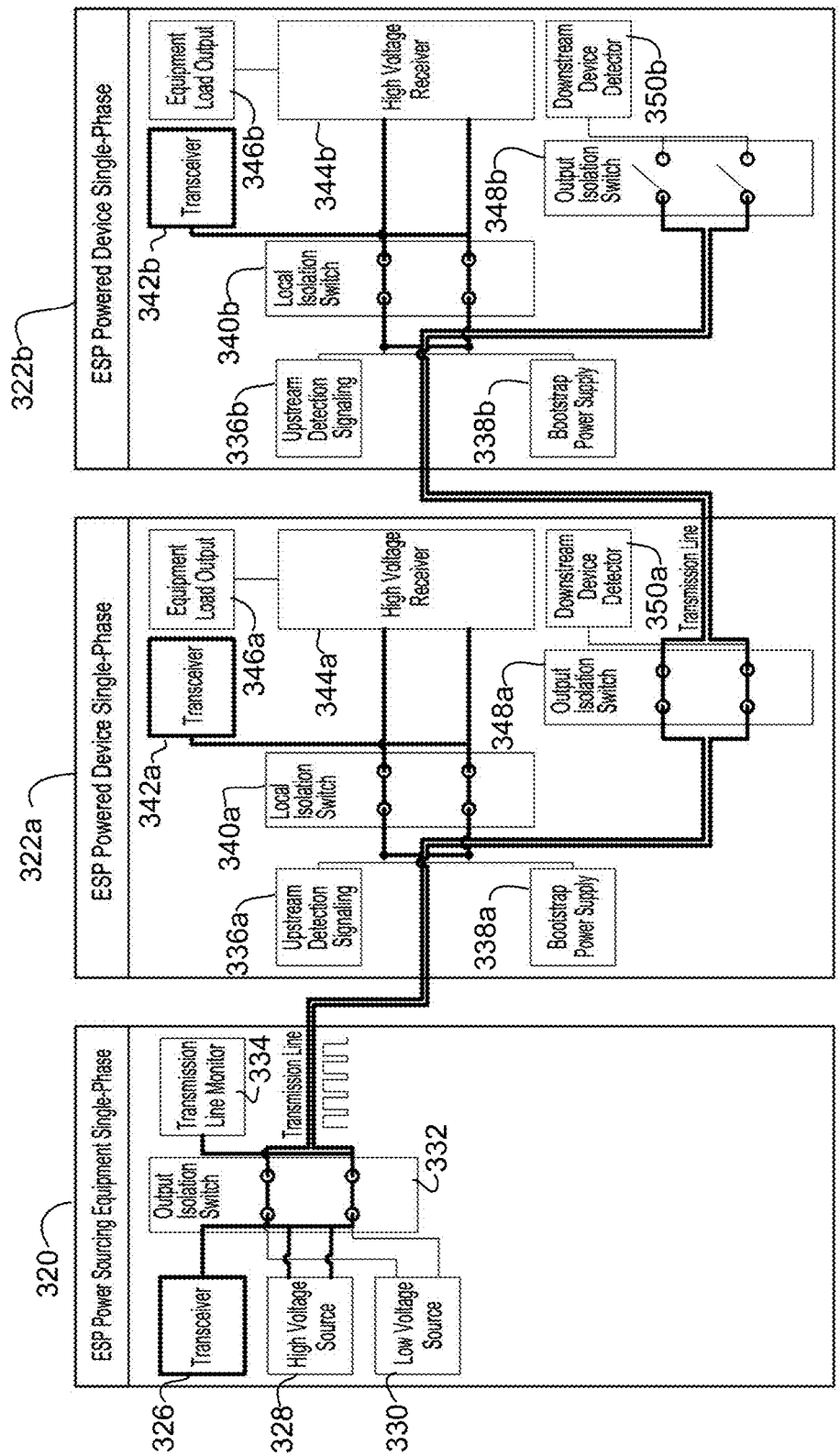
FIG. 40 shows the power sourcing equipment delivering high voltage pulse power and communicating with both powered devices.

A communications link is brought up at the second PD 322b, as shown in FIG. 40. The transceivers 326, 342a, 342b link up between all three nodes (PSE 320, PD 322a, PD 322b) and the system reaches steady state.

As previously noted, the above described process may be performed for multi-phase pulse power with synchronization and checks performed for each phase. Also, the network may comprise any number of nodes in any topology with one or more end nodes configured for pulse power operation, one or more nodes configured for pulse power or PoE, and one or more endpoints configured only for PoE. Also, one or more of the PDs may include capability to operate as a PSE for a downstream node as shown in FIG. 26.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. A method comprising:
transmitting from power sourcing equipment, low voltage pulse power to a powered device;
performing a safety test;
enabling high voltage pulse power operation at the power sourcing equipment upon passing the safety test; and
transmitting high voltage pulse power from the power sourcing equipment to the powered device;
wherein the powered device synchronizes with a waveform of the low voltage pulse power.

2. The method of claim 1 wherein a modulator switch at the powered device synchronizes with a modulator switch at the power sourcing equipment.

3. The method of claim 1 further comprising communicating with the powered device after a modulator switch at the powered device is turned on.

4. The method of claim 1 wherein the low voltage pulse power comprises pulses of power transmitted at or below 60 volts.

5. The method of claim 1 wherein a difference between the low voltage pulse power and the high voltage pulse power is at least 170 volts.

6. The method of claim 1 further comprising establishing a communications link with a transceiver at the powered device and negotiating a power level with the powered device.

7. The method of claim 1 further comprising repeating said transmitting the low voltage pulse power and said performing the safety test for each phase of a multi-phase pulse power system in which pulses are offset from one another between phases.

8. The method of claim 1 wherein the safety test comprises a cable capacitance and shock fault test.

9. The method of claim 1 wherein the safety test comprises a capacitance test and further comprising identifying a minimum off time between high voltage pulses of the high voltage pulse power based on the capacitance test.

10. The method of claim 1 further comprising transmitting the high voltage pulse power to a second powered device in communication with the powered device.

11. The method of claim 1 wherein performing the safety test comprises:
modulating cable capacitance voltage and measuring discharge time;
setting a load voltage threshold based on a calculated cable capacitance; and
determining a high voltage pulse power duty cycle.

12. The method of claim 1 wherein the power sourcing equipment comprises a manually operated shorting switch to prevent transmittal of the high voltage pulse power during maintenance.

* * * * *